(12) United States Patent
Casparian et al.

(10) Patent No.: US 9,342,149 B2
(45) Date of Patent: May 17, 2016

(54) SYSTEMS AND METHODS FOR IMPLEMENTING HAPTICS FOR PRESSURE SENSITIVE KEYBOARDS

(71) Applicants: Mark A. Casparian, Miami, FL (US); Frank C. Azor, Miami, FL (US)

(72) Inventors: Mark A. Casparian, Miami, FL (US); Frank C. Azor, Miami, FL (US)

(73) Assignee: Dell Products LP, Round Rock, TX (US)

( * ) Notice: Subject to any disclaimer, the term of this patent is extended or adjusted under 35 U.S.C. 154(b) by 0 days.

(21) Appl. No.: 14/044,331

(22) Filed: Oct. 2, 2013

(65) Prior Publication Data
US 2014/0062684 A1    Mar. 6, 2014

Related U.S. Application Data

(63) Continuation of application No. 12/930,125, filed on Dec. 29, 2010, and a continuation-in-part of application No. 12/802,468, filed on Jun. 8, 2010, and a continuation-in-part of application No. 12/316,703, filed on Dec. 16, 2008.

(51) Int. Cl.
*G06F 3/01* (2006.01)
*G06F 3/02* (2006.01)
(Continued)

(52) U.S. Cl.
CPC .............. *G06F 3/016* (2013.01); *G06F 3/0202* (2013.01); *H01H 13/702* (2013.01); *H01H 13/85* (2013.01); *H03K 17/975* (2013.01); *H01H 2201/036* (2013.01); *H01H 2215/05* (2013.01); *H01H 2215/052* (2013.01); *H01H 2225/03* (2013.01);
(Continued)

(58) Field of Classification Search
CPC ...... G06F 3/0202; G06F 3/016; G06F 3/0221; G06F 1/1662; G06F 3/0213; H01H 2215/052; H01H 13/85; H01H 2201/02
USPC .......................................................... 345/168
See application file for complete search history.

(56) References Cited

U.S. PATENT DOCUMENTS 3,786,429 A * 1/1974 Goldman ................... B41J 3/46
                                                           345/168
3,918,051 A * 11/1975 Bernin et al. .................... 341/25
(Continued)

OTHER PUBLICATIONS

Texas Instruments, "MSP430 Capacitive Single-Touch Sensor Design Guide", Application report, SLAA379, Jan. 2008, 19 pgs.
(Continued)

*Primary Examiner* — Temesgh Ghebretinsae
*Assistant Examiner* — Michael J Jansen, II
(74) *Attorney, Agent, or Firm* — Egan, Peterman, Enders & Huston LLP

(57) ABSTRACT

Systems and methods are employed for implementing haptics for pressure sensitive keyboards, such as the type of keyboards having keys that produce alternating digital open/short signals that emulate actuation of conventional "momentary on" digital keys. The disclosed systems and methods may be implemented to provide haptics for both touch typing and variable pressure sensitive operation of a pressure sensitive keyboard. Users of a variable pressure keyboard may be provided with a variable pressure haptics effect, e.g., to enable the user to intuitively understand from the haptics vibration produced by the key how much pressure they are applying to a given key at any given time. Vibration characteristics (e.g., vibration rate, vibration waveform pattern, etc.) of a given pressed key may be varied in real time in coordination with, or in response to, corresponding changes in user pressure applied to the same given key.

27 Claims, 18 Drawing Sheets

(51) Int. Cl.
*H01H 13/702* (2006.01)
*H01H 13/85* (2006.01)
*H03K 17/975* (2006.01)

(52) U.S. Cl.
CPC .............. *H01H 2239/006* (2013.01); *H03K 2217/96062* (2013.01)

(56) References Cited

U.S. PATENT DOCUMENTS

| | | | |
|---|---|---|---|
| 3,936,674 A | 2/1976 | Hughes | |
| 4,099,438 A * | 7/1978 | Hiyoshi et al. | 84/629 |
| 4,291,201 A | 9/1981 | Johnson et al. | |
| 4,302,011 A | 11/1981 | Pepper, Jr. | |
| 4,303,811 A | 12/1981 | Parkinson | |
| 4,334,134 A | 6/1982 | Janda | |
| 4,449,024 A | 5/1984 | Stracener | |
| 4,517,553 A * | 5/1985 | Engstrom | 341/25 |
| 4,527,250 A | 7/1985 | Galdun et al. | |
| 4,628,785 A * | 12/1986 | Buchla | G10H 1/344 200/5 A |
| 4,733,590 A | 3/1988 | Watanabe | |
| 4,849,852 A | 7/1989 | Mullins | |
| 4,850,591 A | 7/1989 | Takezawa et al. | |
| 4,896,069 A | 1/1990 | Rosenberg et al. | |
| 4,899,631 A | 2/1990 | Baker | |
| 4,977,298 A | 12/1990 | Fujiyama | |
| 5,220,318 A | 6/1993 | Staley | |
| 5,252,798 A | 10/1993 | Kamada | |
| 5,285,037 A | 2/1994 | Baranski et al. | |
| 5,408,060 A | 4/1995 | Muurinen | |
| 5,434,566 A | 7/1995 | Iwasa et al. | |
| 5,450,078 A | 9/1995 | Silva et al. | |
| 5,508,719 A | 4/1996 | Gervais | |
| 5,646,587 A | 7/1997 | Miyazawa et al. | |
| 5,691,716 A * | 11/1997 | Crowley | G06F 3/0202 341/22 |
| 5,736,976 A | 4/1998 | Cheung | |
| 5,909,211 A | 6/1999 | Combs et al. | |
| 6,007,209 A | 12/1999 | Pelka | |
| 6,102,802 A | 8/2000 | Armstrong | |
| 6,135,886 A | 10/2000 | Armstrong | |
| 6,275,138 B1 | 8/2001 | Maeda | |
| 6,313,762 B1 * | 11/2001 | Crowley | G06F 3/0202 341/20 |
| 6,400,285 B1 | 6/2002 | Gifford | |
| 6,417,845 B1 * | 7/2002 | Chen | G06F 3/03545 178/18.01 |
| 6,559,399 B2 | 5/2003 | Hsu et al. | |
| 6,563,434 B1 * | 5/2003 | Olodort | G06F 1/1613 341/22 |
| 6,608,271 B2 | 8/2003 | Duarte | |
| 6,617,982 B1 | 9/2003 | Ogata et al. | |
| 6,684,166 B2 | 1/2004 | Bellwood et al. | |
| 6,747,226 B2 | 6/2004 | Watanabe | |
| 6,747,867 B2 | 6/2004 | Hsu | |
| 6,758,615 B2 | 7/2004 | Monney et al. | |
| 6,860,612 B2 | 3/2005 | Chiang et al. | |
| 6,882,291 B2 | 4/2005 | Ogata et al. | |
| 6,883,985 B2 | 4/2005 | Roberson | |
| 6,885,364 B1 | 4/2005 | Ogata et al. | |
| 6,918,677 B2 | 7/2005 | Shipman | |
| 6,980,136 B2 * | 12/2005 | Tsai et al. | 341/27 |
| 7,059,790 B2 | 6/2006 | Risheq | |
| 7,064,682 B2 * | 6/2006 | Fedigan | H03M 11/24 327/115 |
| 7,084,787 B2 * | 8/2006 | Olodort | G06F 1/1613 200/600 |
| 7,106,305 B2 | 9/2006 | Rosenberg | |
| 7,123,241 B2 | 10/2006 | Bathiche | |
| 7,129,854 B2 | 10/2006 | Arneson et al. | |
| 7,196,640 B2 * | 3/2007 | Fedigan | H03M 11/24 327/115 |
| 7,244,898 B2 | 7/2007 | Kim | |
| 7,256,768 B2 | 8/2007 | Bathiche | |
| 7,335,844 B2 | 2/2008 | Lee et al. | |
| 7,394,033 B2 | 7/2008 | Kim | |
| 7,541,946 B2 * | 6/2009 | Fedigan | H03M 11/24 327/115 |
| 7,655,901 B2 | 2/2010 | Idzik et al. | |
| 7,667,371 B2 | 2/2010 | Sadler et al. | |
| 7,688,310 B2 | 3/2010 | Rosenberg | |
| 7,741,979 B2 | 6/2010 | Schlosser et al. | |
| 7,772,987 B2 | 8/2010 | Shows | |
| 7,786,395 B2 | 8/2010 | Ozias et al. | |
| 8,159,461 B2 | 4/2012 | Martin et al. | |
| 8,217,892 B2 | 7/2012 | Meadors | |
| 8,224,391 B2 | 7/2012 | Kim et al. | |
| 8,307,222 B2 | 11/2012 | Wang et al. | |
| 8,411,029 B2 | 4/2013 | Casparian et al. | |
| 8,502,094 B2 | 8/2013 | Chen | |
| 8,760,273 B2 * | 6/2014 | Casparian | G06F 3/016 200/521 |
| 2002/0021285 A1 * | 2/2002 | Leman | G06F 3/0213 345/168 |
| 2002/0070921 A1 * | 6/2002 | Feldman | G06F 3/0202 345/168 |
| 2002/0084721 A1 | 7/2002 | Walczak | |
| 2002/0109613 A1 * | 8/2002 | Crowley | G06F 3/0202 341/22 |
| 2003/0072595 A1 | 4/2003 | Al-Safar | |
| 2003/0122779 A1 * | 7/2003 | Martin | G06F 1/1662 345/156 |
| 2003/0210233 A1 | 11/2003 | Frulla | |
| 2004/0027385 A1 | 2/2004 | Rekimoto et al. | |
| 2004/0104893 A1 * | 6/2004 | Huang | 345/168 |
| 2004/0174200 A1 | 9/2004 | McNutt | |
| 2004/0183783 A1 | 9/2004 | Rojas et al. | |
| 2004/0246149 A1 * | 12/2004 | Fedigan | H03M 11/24 341/22 |
| 2005/0057514 A1 | 3/2005 | Bathiche | |
| 2005/0057515 A1 | 3/2005 | Bathiche | |
| 2005/0058492 A1 * | 3/2005 | Hirsch | G06F 3/0216 400/485 |
| 2005/0073446 A1 | 4/2005 | Lazaridis et al. | |
| 2005/0083215 A1 * | 4/2005 | Crowley | G06F 3/0202 341/22 |
| 2005/0104751 A1 * | 5/2005 | Tsa | H03M 11/10 341/34 |
| 2005/0168447 A1 * | 8/2005 | Caine | G06F 3/0234 345/169 |
| 2005/0174260 A1 | 8/2005 | Arneson et al. | |
| 2006/0022951 A1 | 2/2006 | Hull | |
| 2006/0066570 A1 * | 3/2006 | Trifilo | G06F 3/0338 345/157 |
| 2006/0148564 A1 | 7/2006 | Herkelman | |
| 2006/0158275 A1 * | 7/2006 | Fedigan | H03M 11/24 331/113 R |
| 2006/0227015 A1 * | 10/2006 | Fedigan | H03N 11/24 341/22 |
| 2006/0255971 A1 * | 11/2006 | Kim | G06F 3/0202 341/34 |
| 2006/0277466 A1 | 12/2006 | Anderson | |
| 2007/0065215 A1 | 3/2007 | Brown | |
| 2007/0227256 A1 | 10/2007 | Wright | |
| 2007/0229455 A1 * | 10/2007 | Martin | G06F 1/1162 345/156 |
| 2007/0235307 A1 | 10/2007 | Liao et al. | |
| 2007/0285393 A1 | 12/2007 | Ishakov | |
| 2008/0001787 A1 | 1/2008 | Smith et al. | |
| 2008/0018200 A1 * | 1/2008 | Vogeley | F04B 43/046 310/317 |
| 2008/0024454 A1 * | 1/2008 | Everest | G06F 3/03547 345/173 |
| 2008/0092087 A1 | 4/2008 | Brown et al. | |
| 2008/0144333 A1 | 6/2008 | Gourlay | |
| 2008/0159799 A1 | 7/2008 | Bender et al. | |
| 2008/0179172 A1 | 7/2008 | Sellers | |
| 2008/0251364 A1 | 10/2008 | Takala et al. | |
| 2008/0309631 A1 | 12/2008 | Westerman et al. | |
| 2009/0002201 A1 * | 1/2009 | Crowley | G06F 3/0202 341/22 |
| 2009/0007758 A1 | 1/2009 | Schlosser et al. | |
| 2009/0079612 A1 | 3/2009 | Parfitt | |

(56) References Cited

U.S. PATENT DOCUMENTS

| | | | |
|---|---|---|---|
| 2009/0127084 A1 | 5/2009 | Ozias et al. | |
| 2009/0140985 A1 | 6/2009 | Liu | |
| 2009/0178913 A1 | 7/2009 | Peterson et al. | |
| 2009/0189790 A1 | 7/2009 | Peterson et al. | |
| 2009/0189873 A1 | 7/2009 | Peterson et al. | |
| 2009/0207055 A1* | 8/2009 | Aull et al. | 341/34 |
| 2009/0210568 A1* | 8/2009 | Peterson | G06F 3/016 710/15 |
| 2009/0267892 A1* | 10/2009 | Faubert | G06F 3/044 345/156 |
| 2009/0267920 A1* | 10/2009 | Faubert | G06F 3/016 345/177 |
| 2009/0278792 A1* | 11/2009 | Toebes | G06F 21/83 345/156 |
| 2010/0027854 A1* | 2/2010 | Chatterjee et al. | 382/124 |
| 2010/0040400 A1* | 2/2010 | Hirsch | B41J 5/10 400/489 |
| 2010/0089735 A1 | 4/2010 | Takeda et al. | |
| 2010/0090813 A1 | 4/2010 | Je et al. | |
| 2010/0090814 A1 | 4/2010 | Cybart et al. | |
| 2010/0090957 A1 | 4/2010 | Idzik et al. | |
| 2010/0117809 A1 | 5/2010 | Dai et al. | |
| 2010/0148999 A1 | 6/2010 | Casparian et al. | |
| 2010/0171715 A1* | 7/2010 | Peterson et al. | 345/173 |
| 2010/0182241 A1 | 7/2010 | Rosenberg | |
| 2010/0205803 A1 | 8/2010 | Lipton et al. | |
| 2010/0252407 A1 | 10/2010 | Merminod et al. | |
| 2010/0253552 A1 | 10/2010 | Mendez et al. | |
| 2010/0288607 A1 | 11/2010 | Ozias et al. | |
| 2010/0321301 A1 | 12/2010 | Casparian et al. | |
| 2011/0078470 A1 | 3/2011 | Wang et al. | |
| 2011/0095877 A1 | 4/2011 | Casparian et al. | |
| 2011/0102325 A1 | 5/2011 | Sato et al. | |
| 2011/0102326 A1 | 5/2011 | Casparian et al. | |
| 2011/0102340 A1 | 5/2011 | Martin et al. | |
| 2011/0285555 A1* | 11/2011 | Bocirnea | G06F 3/0202 341/34 |
| 2012/0298491 A1 | 11/2012 | Ozias et al. | |
| 2013/0067126 A1 | 3/2013 | Casparian et al. | |
| 2013/0100028 A1 | 4/2013 | Mahowald et al. | |
| 2013/0178292 A1 | 7/2013 | Casparian et al. | |
| 2014/0105664 A1 | 4/2014 | Hoyos | |
| 2014/0226302 A1 | 8/2014 | Shih et al. | |
| 2014/0253454 A1 | 9/2014 | Caldwell | |
| 2015/0061901 A1* | 3/2015 | Casparian | H01H 13/82 341/22 |
| 2015/0061902 A1* | 3/2015 | Casparian | H03K 17/965 341/22 |

OTHER PUBLICATIONS

Cypress Semiconductor Corporation, Cypress Perform, "CY8C21634, CY8C21534, CY8C21434, CY8C21334, CY8C2123; PSoC® Mixed-Signal Array," Apr. 18, 2008, Document No. 38-12025 Rev. M, 43 pgs.

Logitech, "Logitech Gaming Keyboard G510", Printed from Internet Aug. 25, 2011, 3 pgs.

Saitek, "Saitek Pro Gamer Command Unit", Feb. 27, 2011, 7 pgs.

Saitek, "Saitek Pro Gamer Command Unit", Dec. 6, 2005, 41 pgs.

Casparian et al., Keyboard with User Configurable Granularity Scales for Pressure Sensitive Keys, Dell.111, U.S. Appl. No. 12/316,703, Office Action, Feb. 27, 2012; 13 pgs.

Casparian et al., Keyboard with User Configurable Granularity Scales for Pressure Sensitive Keys, DELL.111, U.S. Appl. No. 12/316,703, Response, May 29, 2012; 15 pgs.

Casparian et al., Keyboard with User Configurable Granularity Scales for Pressure Sensitive Keys, DELL.111, U.S. Appl. No. 12/316,703, Final Office Action, Aug. 2, 2012; 22 pgs.

Casparian et al., "Systems and Methods for Implementing Haptics for Pressure Sensitive Keyboards", DELL.132, U.S. Appl. No. 12/930,125, Office Action, Aug. 9, 2012; 16 pgs.

Casparian et al., "Systems and Methods for Implementing Pressure Sensitive Keyboards", DELL:124, U.S. Appl. No. 12/802,468, Office Action, Oct. 23, 2012; 14 pgs.

Casparian et al., "Keyboard with User Configurable Granularity Scales for Pressure Sensitive Keys", DELL:111, U.S. Appl. No. 12/316,703, RCE and Amendment, Nov. 2, 2012, 19 pgs.

Casparian et al., "Systems and Methods for Implementing Haptics for Pressure Sensitive Keyboards", DELL.132, U.S. Appl. No. 12/930,125, Response to Office Action, Nov. 9, 2012; 23 pgs.

Casparian et al., "Systems and Methods for Implementing Haptics for Pressure Sensitive Keyboards", DELL.132, U.S. Appl. No. 12/930,125, Final Office Action, Jan. 2, 2013; 22 pgs.

Casparian et al., "Systems and Methods for Implementing Pressure Sensitive Keyboards", DELL:124, U.S. Appl. No. 12/802,468, Amendment, Jan. 23, 2013, 17 pgs.

Casparian et al., "Systems and Methods for Implementing Haptics for Pressure Sensitive Keyboards", DELL.132, U.S. Appl. No. 12/930,125, Amendment, Mar. 1, 2013, 26 pgs.

Casparian et al., "Systems and Methods for Implementing Haptics for Pressure Sensitive Keyboards", DELL.132, U.S. Appl. No. 12/930,125, Advisory Action, Apr. 3, 2013, 9 pgs.

Casparian et al., "Systems and Methods for Implementing Pressure Sensitive Keyboards", DELL:124, U.S. Appl. No. 12/802,468, Final Office Action, Apr. 9, 2013, 21 pgs.

Casparian et al., "Systems and Methods for Implementing Pressure Sensitive Keyboards", DELL:124, U.S. Appl. No. 12/802,468, Response to Final Office Action, Jun. 10, 2013, 13 pgs.

Casparian et al., "Systems and Methods for Implementing Pressure Sensitive Keyboards", DELL:124, U.S. Appl. No. 12/802,468, Advisory Action, Jul. 11, 2013, 7 pgs.

Casparian et al., "Systems and Methods for Implementing Pressure Sensitive Keyboards", DELL:124, U.S. Appl. No. 12/802,468, filed Jun. 8, 2010, RCE and Amendment, Aug. 12, 2013, 25 pgs.

Cherry Corporation, MX Series Key Switch, Obtained from Internet Aug. 12, 2013, 9 pgs.

Cherry Corporation, Keymodule MX, Obtained from Internet Jul. 25, 2013, 2 pgs.

The Keyboard Company, An Introduction to Cherry MX Mechanical Switches, Obtained from Internet Jul. 25, 2013, 7 pgs.

Zhang et al., Systems and Methods for Intelligent System Profile Unique Data Management:, DELL:152, U.S. Appl. No. 13/618,666, filed Sep. 14, 2012, 32 pgs.

Casparian et al., "Systems and Methods for Lighting Spring Loaded Mechanical Key Switches", DELL:169, U.S. Appl. No. 14/013,603, filed Aug. 29, 2013, 50 pgs.

Casparian et al., "Systems and Methods for Implementing Spring Loaded Mechanical Key Switches with Variable Displacement Sensing", DELL.167, U.S. Appl. No. 14/013,724, filed Aug. 29, 2013, 57 pgs.

Casparian et al., "Apparatus and Methods for Mounting Haptics Actuation Circuitry in Keyboards", DELL.133; U.S. Appl. No. 12/930,118, filed Dec. 29, 2010, Office Action, Oct. 4, 2013, 21 pgs.

Casparian et al., "Systems and Methods for Implementing a Multi Function Mode for Pressure Sensitive Sensors and Keyboards", DELL:143, U.S. Appl. No. 13/232,707, filed Sep. 14, 2011, Office Action, Jul. 28, 2013, 15 pgs.

Casparian et al., "Keyboard with User Configurable Granularity Scales for Pressure Sensitive Keys", U.S. Appl. No. 12/316,703, filed Dec. 16, 2008, Office Action dated Apr. 23, 2014, 29 pgs.

Casparian et al., "Keyboard with User Configurable Granularity Scales for Pressure Sensitive Keys", U.S. Appl. No. 12/316,703, filed Dec. 16, 2008, Response to Office Action dated Jul. 23, 2014, 19 pgs.

Casparian et al., "Systems and Methods for Implementing a Multi Function Mode for Pressure Sensitive Sensors and Keyboards", DELL:143, U.S. Appl. No. 13/232,707, filed Sep. 14, 2011, Amendment, Nov. 26, 2013, 19 pgs.

Casparian et al., "Apparatus and Methods for Mounting Haptics Actuation Circuitry in Keyboards", DELL.133, U.S. Appl. No. 12/930,118, filed Dec. 29, 2010, Amendment, Dec. 27, 2013, 19 pgs.

Casparian et al., "Systems and Methods for Implementing Haptics for Pressure Sensitive Keyboards", DELL.132, U.S. Appl. No. 12/930,125, filed Dec. 29, 2010, Amendment, Dec. 27, 2013, 23 pgs.

Casparian et al., "Keyboard with User Configurable Granularity Scales for Pressure Sensitive Keys", U.S. Appl. No. 12/316,703, filed Dec. 16, 2008, Office Action dated Nov. 10, 2014, 29 pgs.

(56) References Cited

OTHER PUBLICATIONS

Casparian et al., "Keyboard with User Configurable Granularity Scales for Pressure Sensitive Keys", U.S. Appl. No. 12/316,703, filed Dec. 16, 2008, Response to Office Action dated Feb. 10, 2015, 22 pgs.

Casparian et al., "Keyboard with User Configurable Granularity Scales for Pressure Sensitive Keys", U.S. Appl. No. 12/316,703, filed Dec. 16, 2008, Final office action dated May 27, 2015, 34 pgs.

Casparian et al., "Keyboard with User Configurable Granularity Scales for Pressure Sensitive Keys", U.S. Appl. No. 12/316,703, filed Dec. 16, 2008, Response to Final office action Filed Jul. 27, 2015, 11 pgs.

Casparian et al., "Systems and Methods for Implementing Spring Loaded Mechanical Key Switches with Varible Displacement Sensing", U.S. Appl. No. 14/013,724, filed Aug. 29, 2013, Office action dated Aug. 25, 2015, 9 pgs.

Casparian et al., "Systems and Methods for Lighting Spring Loaded Mechanical Key Switches", U.S. Appl. No. 14/013,603, filed Aug. 29, 2013, DELL:169, Office Action mailed Sep. 14, 2015, 23 pgs.

Casparian et al., "Systems and Methods for Implementing Spring Loaded Mechanical Key Switches with Variable Displacement Sensing", U.S. Appl. No. 14/013,724, filed Aug. 29, 2013, DELL:167, Response to Office Action filed Nov. 25, 2015, 21 pgs.

Casparian et al., "Systems and Methods for Lighting Spring Loaded Mechanical Key Switches", U.S. Appl. No. 14/013,603, filed Aug. 29, 2013, DELL:169, Response to Office Action mailed Dec. 14, 2015, 22 pgs.

\* cited by examiner

SYSTEMS AND METHODS FOR IMPLEMENTING HAPTICS FOR PRESSURE SENSITIVE KEYBOARDS

RELATED APPLICATIONS

This application is a continuation of pending U.S. patent application Ser. No. 12/930,125, filed on Dec. 29, 2010 and entitled "Systems And Methods For Implementing Haptics For Pressure Sensitive Keyboards", which itself is a continuation-in-part of U.S. patent application Ser. No. 12/802,468, titled "Systems And Methods For Implementing Pressure Sensitive Keyboards," by Mark A. Casparian, et al., filed on Jun. 8, 2010, which itself is a continuation-in-part of U.S. patent application Ser. No. 12/316,703, titled "Keyboard With User Configurable Granularity Scales For Pressure Sensitive Keys," by Mark A. Casparian, et al., filed on Dec. 16, 2008, the entire disclosure of each of the foregoing applications being incorporated herein by reference.

TECHNICAL FIELD

The techniques described herein relate to systems and methods for keyboards and, more particularly, for implementing haptics for variable pressure sensitive keyboards.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many information handling systems use keyboards to obtain user input. Some prior keyboard solutions have provided pressure sensitive keys. The most common technique to provide pressure sensitive keys is to use variable resistance sensing techniques to provide an indication of the pressure applied by a user to a key. Variable capacitance sensing has also been utilized in some prior art products such as console gamepad controllers.

Haptics of conventional keyboards rely on the collapse of a rubber dome to provide the physical "click" sensation felt during the make connection. This is what keyboard users are accustomed to feeling using conventional standard keyboards while touch typing. Conventional variable pressure sensitive keyboards have also employed a standard rubber dome style key mechanism that incorporates the conventional touch type of haptics. Once a user provides enough finger force to provide the "make connection" (or collapse of the rubber dome) the finger is bottomed out against the back surface of the keyboard housing. At this point, as the user provides additional finger pressure, the circuitry reacts accordingly by auto-typing at a speed corresponding to the amount of force applied.

A full size USB peripheral keyboard has been developed that employs the use of a standard rubber dome style key mechanism. This keyboard incorporates the touch typing haptics provided by conventional rubber dome keyboard solutions. Once a user provides enough finger force to provide the "make connection" or collapse of the rubber dome, the bottom-side of the rubber dome is pressed against the back surface of the keyboard housing. At this point, as the user provides additional finger pressure, the circuitry reacts accordingly by auto-typing at a variable speed corresponding to the amount of force applied.

Force feedback game controllers on the market today incorporate feedback via piezo motors that have an off-center weight attached to the spindle. When the piezo motor is spinning, this offset weight produces a vibration that shakes the entire game controller device. Touch screens, such as found on some conventional cellphones and smartphones, employ the use of piezo transducers to vibrate the entire screen of the device to provide the user feedback as to when they are touching. Haptics controllers are available that provide the ability to store multiple vibration waveforms and allow a user to select and output any one waveform at a time.

SUMMARY

Systems and methods are disclosed herein for implementing haptics for variable pressure sensitive keyboards, such as the type of keyboards having variable pressure sensitive keys that produce alternating digital open/short signals that emulate actuation of conventional "momentary on" digital keys. The disclosed systems and methods may be implemented to provide haptics for both touch typing and variable pressure sensitive operation of a variable pressure sensitive keyboard. In one embodiment, the disclosed systems and methods may be implemented to provide users of a variable pressure keyboard with a variable pressure haptics effect, e.g., to enable the user to intuitively understand from the haptics vibration produced by the key how much pressure they are applying to a given key at any given time. For example, vibration characteristics (e.g., vibration rate, vibration waveform pattern, etc.) of a given pressed key may be varied in real time in coordination with, or in response to, corresponding changes in user pressure applied to the same given key. In one embodiment, each haptics-enabled key of the keyboard may be provided with a respective haptics actuator (e.g., piezo transducer) that is configured to independently impart a haptics motion (e.g., vibration) only to the corresponding single key without imparting a user-detectable haptics motion to any other keys (including adjacent keys) of the keyboard or to the remainder of the keyboard itself. In one embodiment, a variable intensity haptics motion may be imparted to a pressed key of a variable pressure sensitive keyboard such that the pressed key moves (e.g., vibrates with a subtle "ticking" of the keycap felt by the finger) with a relative intensity that corresponds to the amount of pressure applied by the user's finger to the particular pressed key.

In another embodiment, the disclosed systems and methods may be implemented to provide a keyboard that includes both momentary-on (e.g., digital) keys and variable pressure-sensing (e.g., analog) keys in a manner such that both the momentary-on keys and the variable pressure-sensing keys feel the same when pressed by a user (i.e., both types of keys have the same force/displacement curve). In such an embodiment, a mixed keyboard of momentary-on and variable pressure-sensing keys may be implemented that provides a traditional touch-typing feel to users across the keys of the keyboard. In yet another embodiment, signal processing for haptics and pressure-sensitive key toggling may be performed in parallel paths to reduce the latency from finger press to resulting key vibration and toggling (i.e., resulting letters typed on computer display). Further, the haptics waveform address may be written to require a reduced number of clock cycles than otherwise required, e.g., such as when using I2C-based communications. The disclosed systems and methods may be implemented both for full size external/peripheral keyboards, and for notebook keyboard arrays which are focused on thin profiles (minimal Z height).

In one embodiment, the disclosed systems and methods may be implemented to provide haptics for one or more individual variable pressure sensitive keys of keyboards that are implemented using variable capacitance, variable conductance, variable resistance or other suitable pressure sensitive measurement methodology to generate an alternating open/short digital signal representative of the amount of pressure applied to a given key at any given time. In the implementation of such keyboards, the open/short digital signal may be supplied as a signal representative of applied key pressure to a legacy keyboard controller or other processing device of an information handling system that is configured to measure keyboard input based on "momentary-on" signals. In one exemplary embodiment, the disclosed systems and methods may be advantageously implemented to provide a drop-in "replacement" keyboard for a standard-type momentary-on keyboard of an information handling system, e.g., portable information handling system such as a notebook computer that employs a conventional keyboard controller configured to receive momentary-on digital key signals and no analog keyboard signals. Other examples of portable information handling system include, but are not limited to, MP3 players, portable data assistants, cellular phones, tablet computers, etc.

The disclosed systems and methods may be implemented in one exemplary embodiment to achieve fast response time and/or for interfacing with a legacy keyboard controller. In this regard, pressure-sensing digital output circuitry, haptics actuation circuitry (e.g., piezo transducer circuitry) and related haptics control circuitry (e.g., including controller, microcontroller, or other processing device/s) may be implemented in a manner that supports any number of pressure sensitive keys, is compatible with a legacy keyboard controller and device drivers, and using little additional power.

In one exemplary embodiment, falling edge-triggered digital interrupt inputs may be provided to a processing device of pressure-sensing digital output circuitry rather than feeding analog signals to an ADC. This advantageously allows improved response time to a user's input (e.g., finger pressure). Further, circuitry may be provided in another exemplary embodiment to interface any number of variable pressure sensitive keys to a legacy keyboard (e.g., 8 bit microcontroller, and 24 bit interface to a legacy keyboard matrix). Low power capability may be provided by using pressure-sensing digital output circuitry that processes code in an interrupt service routine (ISR) whenever an interrupt due to application of pressure on a pressure-sensitive key is sensed on any of the digital inputs of the circuitry, and then goes to sleep (i.e., low power state) while it continues to actively monitor its interrupt digital inputs for any other event. Haptics controller circuitry may also be provided that remains in low power sleep mode between variable key press events. Thus, the pressure-sensing digital output circuitry and haptics controller circuitry only monitor trigger events, run code when trigger events are detected, and then go back to sleep again until another trigger event is detected. This translates into ultra low power consumption for this embodiment, which is advantageous for "drop-in replacement" keyboard arrays that are capable of operating on an existing information handling system power supply.

Advantageously, the disclosed systems and methods may be implemented in another embodiment to provide a "drop-in replacement" of a current production keyboard array for an information handling system such as a notebook computer (e.g., for build-to-order specification, after market replacement in an existing previously built information handling system, updated production run, etc.) without requiring any mechanical, electrical, device driver or operating system (OS) changes to the existing information handling system. In such an embodiment, the pressure sensitive keys, pressure-sensing digital output circuitry, haptics actuation circuitry and haptics control circuitry may be integrated into a replacement keyboard assembly that is mechanically and electrically compatible with the information handling system host equipment (e.g., including legacy keyboard controller), and using native OS keyboard drivers to operate the keyboard. The disclosed systems and methods may also advantageously be implemented in one embodiment to provide variable pressure-sensitive and haptics key capability for use with older games that only accept user key toggling because no special code patches are required to allow applications running on a host information handling system to understand keyboard input from the variable pressure sensitive keys of the disclosed keyboard systems, i.e., the keyboard input to the game is understood by the game as input from a legacy USB keyboard.

The disclosed variable pressure sensitive keyboard measurement methods and systems may be optionally implemented in one exemplary embodiment with user configurable haptics-enabled variable pressure sensitive keys and techniques for controlling these keys for keyboards. In such an embodiment, user configuration information, including information for user configurable granularity scales and/or haptics vibration waveforms, can be communicated from a host system to the keyboard and stored for later use by a keyboard controller or other processing device associated with the keyboard to control the operation of the pressure sensitive keys. Alternatively, such user configuration information may be employed by a software application operating on the host system that communicates with a keyboard controller to control the operation of the pressure sensitive keys. Either way, greater control of the pressure sensitive keys and/or haptics vibration of these keys can be provided. This configurability is of particular use for applications such as where the keyboard is being used for gaming by a user running a gaming application on an information handling system. In particular, the user can configure the granularity scale and/or haptics waveforms for each pressure sensitive key so that each key can provide a desired gaming response. In addition, different configuration files can be stored so that a user can select and use different configurations for different games and/or different users can select and use different configurations based upon their personal preferences.

In one respect, disclosed herein is a keyboard system, including: one or more pressure sensitive keys configured to provide analog output signals corresponding to each given one of the pressure sensitive keys that is representative of the level of pressure applied to the given key; pressure sensing interface circuitry coupled to receive the analog output signal from each given one of the pressure sensitive keys, the pressure-sensing digital output circuitry being configured to provide key pressure indication signals representative of at least two respective different levels of pressure applied to the corresponding given one of the pressure sensitive keys, the at least two different levels of pressure including at least first and second different levels of pressure; and haptics actuation circuitry coupled and configured to impart a variable haptics motion characteristic independently to each given one of the pressure sensitive keys based at least in part on the key pressure indication signals provided by the pressure sensing interface circuitry corresponding to the pressure level applied to the corresponding given one of the pressure sensitive keys such that a first haptics motion is imparted to a given one of the pressure sensitive keys at the first pressure level applied to the given one of the pressure sensitive keys that is different than a second haptics motion that is imparted to the given one of the pressure sensitive keys at the second pressure level applied to the given one of the pressure sensitive keys.

In another respect, disclosed herein is a method of imparting haptics motion, including: providing one or more pressure sensitive keys; producing an analog output signal for each given one of the pressure sensitive keys when depressed by a user, the analog output signals being representative of the level of pressure applied to the given pressure sensitive key by the user; providing one or more key pressure indication signals based upon the analog output signal, the one or more key pressure indication signals being representative of at least two respective different levels of pressure applied to the given pressure sensitive key by the user, the at least two different levels of pressure including at least first and second different levels of pressure; and imparting a variable haptics motion characteristic independently to each given one of the pressure sensitive keys based at least in part on a provided key pressure indication signal that is representative of pressure applied to the given pressure sensitive key by the user such that a first haptics motion is imparted to the given one of the pressure sensitive keys at the first pressure level applied to the given one of the pressure sensitive keys that is different than a second haptics motion that is imparted to the given one of the pressure sensitive keys at the second pressure level applied to the given one of the pressure sensitive keys.

DESCRIPTION OF THE DRAWINGS

It is noted that the appended drawings illustrate only example embodiments of the techniques described herein and are, therefore, not to be considered limiting of its scope, for the invention may admit to other equally effective embodiments.

FIG. 2F illustrates a haptics-enabled keycap assembly according to one exemplary embodiment of the disclosed systems and methods.

FIG. 2G illustrates a haptics-enabled keycap assembly according to one exemplary embodiment of the disclosed systems and methods.

DETAILED DESCRIPTION OF THE INVENTION

Figure 1:
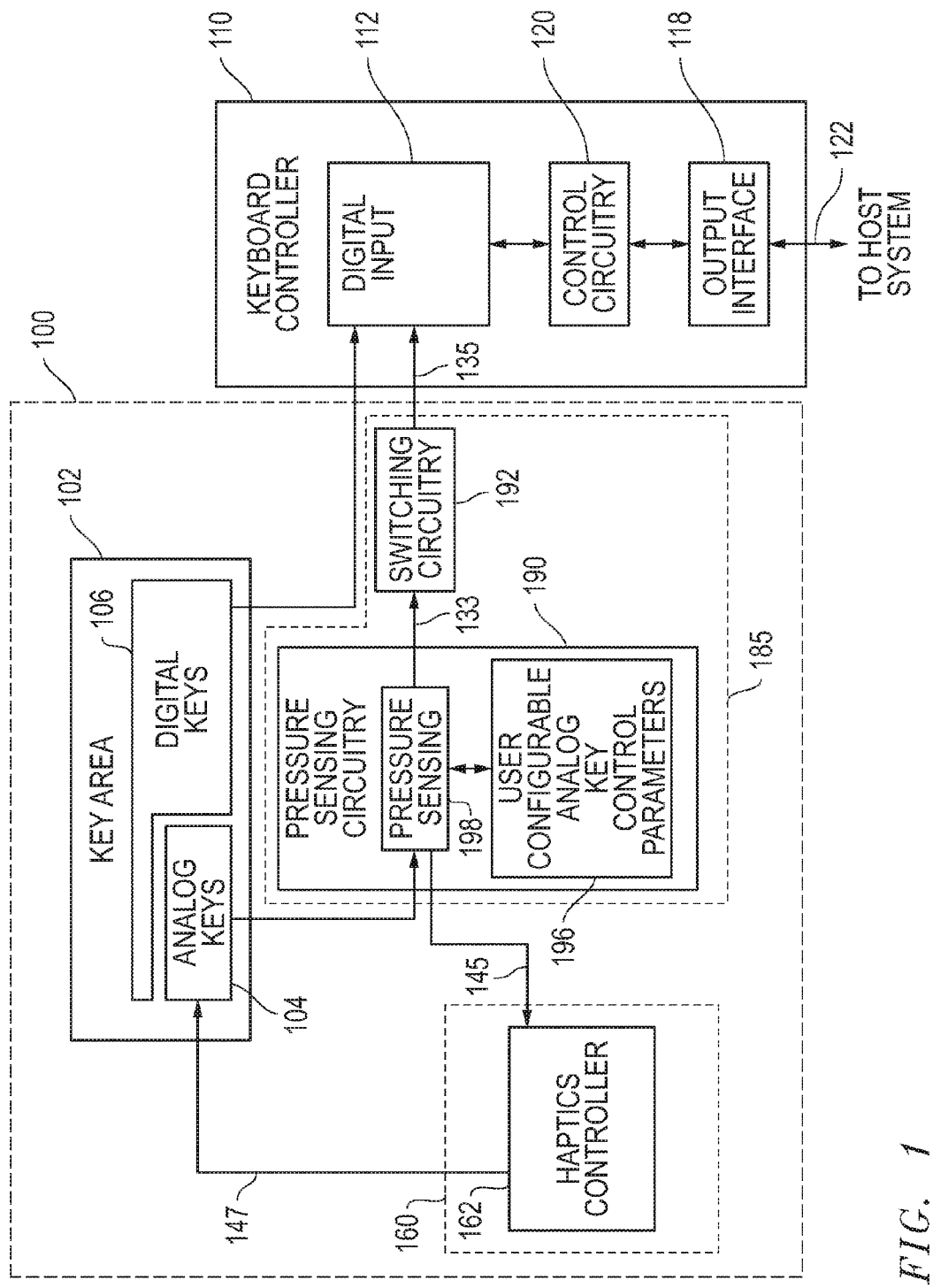
FIG. 1 is a block diagram illustrating a keyboard system according to one exemplary embodiment of the disclosed systems and methods.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a server computer system, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

As described herein, systems and methods are provided to implement haptics for one or more individual keys of an information handling system keyboard (e.g., such as a variable pressure sensitive keyboard) using haptics actuation circuitry (e.g., such as piezo transducer circuitry) that is controlled by haptics control circuitry. For example, the solutions described herein may be employed to enable haptics for keyboard keys including those keys used in variable pressure sensitive keyboards such as described in U.S. patent application Ser. No. 12/316,703 filed Dec. 16, 2008, and U.S. patent application Ser. No. 12/802,468 filed Jun. 8, 2010, each of which is incorporated herein by reference in its entirety for all purposes. Such variable pressure sensitive keyboards may be employed, for example, in gaming applications and information handling systems that are specifically designed for gaming applications. However, the disclosed systems and methods are useful for any other keyboard applications in which variable pressure sensitive keys may be employed.

As further described herein, haptics may be provided for pressure sensitive keys that produce a digital open/short signal that is representative of the amount of pressure applied to a given key at a given time. Conventional keyboards typically use rubber dome based keys that provide a momentary-on switch contact via a make-or-break contact with two layers of flex PCB (printed circuit board) with a raw exposed conductor pad on both layers that come into contact with one another upon a key press. In gaming applications, gamers typically use the W, A, S, and D keys for travel movements (forward, left, backward, right respectively); Q and E keys are typically used for strafing left and right respectively; and the spacebar key is used for jumping, although gaming keys are not restricted to these particular keys or functions. Rather than tapping a button a few times to make a gradual turn, or several rapid taps to make a sharp turn, it is more natural for a user to apply more pressure on the A or D keys to pull a tighter turn and/or turn with gradual or sharpness of turn desired proportionally to the amount of finger pressure applied to the respective keyboard key. Such capability is not only more intuitive, but allows the user easier granular control over game play input such as gradually turning/sharp turn, variable speed of travel movement (slow walk, spring), the rate of fire of a gun, variable degree of the amount of strafing to the left or right, but not limited to these examples. The advantageous solutions described herein enable haptics to be employed in one embodiment with variable capacitance measurement for implementing pressure sensitive keys, and may be optionally implemented with user configurable granularity scales for these pressure sensitive keys to allow enhanced user control of how keys respond in a gaming application and/or any other desired application. Further information on the use of user configuration information, such as user configurable granularity scales, may be found in U.S. patent application Ser. No. 12/316,703 filed Dec. 16, 2008, which is incorporated herein by reference in its entirety.

There are many kinds of game genres. The features and ways to utilize variable pressure control vary from game to game or from genre to genre. For example, in a first person shooter (FPS) game, a particular variable pressure button may be used to control the speed of fire (single shot, multiple shots, faster multiple shots, machine gun rapid fire). For real-time strategy games, the variable finger pressure sensitivity of the key may mean something completely different. With a variety of game genres, and even within a particular genre, there are many game titles, where the user will want to save their keyboard's pressure sensitive button definitions and/or haptics waveform motion characteristics in a profile for the game, even with the ability to categorize by game genre. It is also desirable to allow the user to configure how the pressure sensitive button and haptics waveform motion should work. For example, the user may want the full range of gradual variable control. In another instance, the user may want this button to act like a momentary on/off switch button. In still another instance, the user may want the button to operate as four (4) possible positions (e.g., slow walk, fast walk, jog, sprint) depending on the amount of pressure applied by the finger. This user configuration information, and this user configurable granularity control in particular, as described below, can be communicated to and stored by the keyboard to provide the user this capability of configuring how the keyboard pressure sensitive keys and/or haptics waveform motion for individual keys will operate.

The keyboard embodiments described herein may have from one to all of their keys controlled via pressure-sensitive sensors (e.g., such as variable impedance or variable capacitance sensors), and/or may be provided with corresponding haptics control circuitry and haptics actuation circuitry for one or more of the individual variable pressure sensitive keys of the keyboard. As described in more detail below, an injection molded rubber dome sheet and flex circuitry can be used, in one exemplary embodiment, to accommodate both pressure sensitive keys and traditional momentary-on switch based keys, and any one or more of which keys may also include haptics actuation circuitry.

For example, using the disclosed systems and methods, a typical 24-bit digital pathway can be used from the keyboard array to the keyboard's microcontroller for any momentary-on keys. Typically, a keyboard microcontroller has three dedicated 8-bit digital input ports to take in this data, though it need not be limited to this. Current keyboards use rubber-dome momentary-on switches. The keycap has a rod or "chimney stack" on its bottom side. There is also a nipple or actuator on the bottom side of the rubber dome. As the user presses down on the keycap, the chimney stack presses down on the rubber dome, which in turn presses the nipple/actuator down on the flex circuitry beneath it. This pressing motion brings flex circuitry from one signal layer in direct contact with flex circuitry in a second signal layer. As a result, the two connections make contact, signaling to the microcontroller that the key has been pressed (the momentary-on signal). These rubber-dome momentary-on switches can be used for the non-pressure sensitive keys for the keyboards described herein.

In one exemplary embodiment, pressure sensitive keys may be configured to use rubber dome keys with conductive half-spheres or half-domes located on the underside of the rubber domes. In such an embodiment, the following principle may be employed: as the conductive sphere is pressed harder against a printed circuit board (PCB) or flexible PCB underneath it, the conductive sphere's surface area contact increases with pressure, thus increasing the capacitance of that contact in relationship with a nearby charged trace. The capacitance can be measured and sent to a keyboard controller as alternating open/short (alternating off/on) digital signals representative of the measured capacitance value without the need for further analog to digital signal conversion. The embodiments disclosed herein, therefore, can use analog-based variable-pressure keys and incorporate them with digitally-based momentary-on switches of typical keyboards to make a keyboard that supports both regular make/break keys and keys with variable finger pressure sensitivity, and at the same time that is compatible with legacy "momentary-on" measurement keyboard controllers such as are typically found in information handling systems such as notebook and desktop computers. This variable finger pressure sensitivity is particularly useful for gaming applications where there is a consistent need for more intuitive gaming interfaces.

For keyboards with both types of keys, signal inputs from both types of keys can be provided in one embodiment to a keyboard controller via a digital input block. For example, digital input can be provided directly to the keyboard controller by the typical keyboard array of momentary-on switches. These are the keys that operate as either switch on or off, essentially providing a digital 1 or 0 back to the microcontroller. Capacitive-sensing or other key pressure-sensing circuitry can also be present for providing alternating open/short digital input signals for the keyboard controller that are representative of the amount of pressure applied to a given pressure sensitive key at any given time. At the same time, the keyboard controller can also support any number of digitally based momentary-on switch based keys. The capacitive-sensing or other key pressure-sensing circuitry may also provide key pressure indication signals (e.g., as a digital output signals or other suitable signal type) to haptics control circuitry that are representative of the amount of pressure applied to a given pressure sensitive key. The haptics control circuitry may be configured to in turn produce a haptics control signal that corresponds to the pressure level (i.e., amount of force) applied to the given pressure sensitive key (e.g., as a vibration waveform having a vibration intensity corresponding to the pressure level). The haptics control circuitry may provide the haptics control signal to haptics actuation circuitry that will be described further herein.

In the practice of the disclosed systems and methods, pressure sensing measurement circuitry (e.g., such as capacitive-sensing digital output circuitry) and corresponding haptics control circuitry may be, for example, embedded or integrated within a keyboard controller, though it may also be located external to the microcontroller as well. In the latter case, a "drop-in" keyboard having both conventional momentary-on and pressure sensitive keys, as well as haptics control circuitry and associated haptics actuation circuitry (e.g., including piezo transducers) for one or more of the keys, may be provided that has digital outputs for both momentary-on and pressure sensitive types of keys that are compatible with a legacy digital keyboard controller. This capability may be advantageously employed, for example, to enable a build-to-order methodology in which either type of keyboard (i.e., traditional keyboard with only momentary-on keys or gaming keyboard with at least some pressure sensitive and haptics-enabled keys) may be selectively assembled to a common information handling system notebook chassis or common desktop keyboard chassis having a legacy keyboard controller, e.g., based on details of a specific customer order.

In one embodiment, for example, the pressure sensitive keys may be variable capacitance pads that are coupled to provide an analog signal input to capacitive-sensing digital output circuitry available from Texas Instruments of Dallas Texas and having part number MSP430F2111. However, any other type of suitable capacitive-sensing digital output circuitry may be employed including, for example, any circuitry that uses RC discharge time to measure sensor capacitance as described in U.S. Pat. No. 3,936,674, which is incorporated herein by reference in its entirety. The capacitive-sensing digital output circuitry may be further optionally provided (integrally or separately) with signal switching circuitry, e.g., switch circuitry configured to interface with the legacy keyboard matrix array (e.g., 16 columns×8 rows) which require current sinking capability as well as to provide for capability of providing pressure sensitivity to all keys in a keyboard.

Examples of suitable signal switching circuitry for interfacing with a legacy keyboard controller include, but are not limited to, optoisolators or MOSFET switches that interface with the keyboard controller in a manner as will be described further herein. The momentary-on switch based keys input (when present) can be sent via, for example, a 24-bit digital path to the digital I/O of the keyboard controller, e.g., legacy 8051-based microcontroller available from sources such as Intel, Infineon Technologies, NXP, Silicon Laboratories, etc. The keyboard controller can also have an optional embedded I2C master/slave block used to talk to peripheral ICs (integrated circuits) for additional functionality. A serial EEPROM can also be optionally provided as part of the keyboard to communicate with the keyboard controller, for example, to provide the VID (vendor identification) and DID (device identification) information to the microcontroller via the I2C bus.

It is further noted that for an electronic lighting control embodiment where aspects of key lighting are implemented for the keyboard, a combination pulse width modulator (PWM) and LED (light emitting diode) driver integrated circuit can be used, such as part number MAX6964AEG available from Maxim. Such integrated circuits, for example, can receive commands from a host system, such as a personal computer, through the keyboard controller to drive RGB (red, green, blue) LEDs for keyboard lighting as instructed by the host system. The personal computer or host system, for example, can be configured to communicate with the keyboard controller through a USB connection, and the keyboard controller can be configured to convert these commands into a serial I2C stream provided to the PWM and LED driver integrated circuit which can in turn pulse width modulate the correct amount of light dimming and color to be provided for the keyboard lighting.

The haptics control circuitry may be, for example, a MAX11835 Rev. 2 chip (available from Maxim Integrated Products, Inc. of Sunnyvale, Calif.) that is capable of storing up to 16 different vibration waveforms, and which may be coupled to receive key pressure indication signals (e.g., as high/low digital signals) from the pressure-sensing digital output circuitry (e.g., TI MSP430F2111 controller). The haptics control circuitry may in turn provide haptics control signals (e.g., in the form of selected vibration waveforms having a vibration intensity corresponding to the pressed key pressure level) to haptics actuation circuitry of the pressed key. The haptics actuation circuitry provided for each key may be, for example, a piezo transducer such as KBS-20DA-3AN available from Kyocera Corporation of Kyoto, Japan, or may be another type of piezo transducer (e.g., available from sources such as CUI Inc. of Tualatin, Oreg. or Murata Manufacturing Company Ltd. of Kyoto, Japan).

As described further below, a common injection-molded silicon rubber sheet can be used with built in rubber domes and a common flex circuitry to support both digital momentary-on switches and pressure sensitive sensors (e.g., variable resistance or variable capacitance). For variable capacitance sensing, as the user's finger applies pressure to the plastic keycap, it can be configured to press on the depressible rubber dome which has a conductive spherical shaped actuator on the bottom side. As the keycap is pressed, the conductive spherical shaped actuator comes into contact with one plate of a capacitor. An insulating layer is located above a second plate for the capacitor so that it is isolated from the first plate. Thus, the conductive actuator does not contact the second plate, and a capacitance develops between the two plates. As the user puts more pressure onto the keycap, more surface area of the conductive material from the conductive actuator will lie over first plate thereby increasing the capacitance between the two plates.

Haptics actuation circuitry may be provided for one or more keys of a variable pressure sensitive keyboard using any suitable methodology. For example, a piezo transducer may be mounted to the bottom keyboard housing in position beneath the bottom second capacitor plate of a variable capacitive sensing keyboard such as of the type described above. Alternatively, a piezo transducer may be molded into a keycap or mounted on the underside of the keycap, e.g., in a manner that does not interfere with transmittal of light for backlighting the individual keys.

In operation of one embodiment of the keyboard, the amount of finger pressure applied by a user to a given key is sensed by the pressure sensing (e.g., variable capacitance sensing) digital output circuitry and is digitally provided to the keyboard controller via switching circuitry (e.g., optoisolator, MOSFET, etc.) that provides alternating open/short signal current pull down signals to the keyboard controller in a manner that emulates toggling of a conventional momentary off/on digital key. The pressure sensing digital output circuitry may also simultaneously provide a digital signal (e.g., high/low digital signal) representative of user-applied finger pressure to the haptics control circuitry, which in turn provides a haptics control signal representing a haptics motion (e.g., vibration) intensity corresponding to the amount of user pressure applied to the pressed key.

In an optional embodiment, configuration information provided by a user may be employed to adjust the operation of the pressure sensitive keys, e.g., via the pressure-sensing circuitry, other processing device, or software executing on a host system to which the keyboard is coupled. This user configuration information, for example, can optionally adjust the sensitivity and output levels generated by the Pressure Sensing Interface Circuitry based upon the pressure sensitive signals received with respect to the pressure sensitive keys as described in U.S. patent application Ser. No. 12/316,703 filed Dec. 16, 2008, which is incorporated herein by reference in its entirety. The keyboard controller can then in turn provide output signals to the host system that indicate pressure amounts. The host computer can then use these keyboard output signals with respect to particular software application functions being operated by the host computer. For gaming applications, such pressure sensitive functions may include the variability in the speed of travel (slow walk, trot, run, etc.), the amount of turning (slow, fast, etc.), the amount of strafing for a first-person-shoot game, the amount of braking for a vehicle race game, the degree of the rate of fire, the height of one's jump, and/or any other desired variable gaming feature.

FIG. 1 is a block diagram for a keyboard system 100 including pressure sensitive and haptics-enabled analog keys 104 together with digital keys 106. However, it will be understood that in other embodiments, a keyboard system may be provided only with haptics-enabled analog keys, with both haptics-enabled analog keys and haptics-enabled digital keys, or only with haptics-enabled digital keys. As depicted, for this embodiment a keyboard controller 110 is coupled through pressure sensing interface circuitry 185 to analog keys 104 of a key area 102 that is part of a keyboard device body. In this embodiment, the key area 102 includes both analog keys 104 and digital keys 106 (e.g., in one embodiment key area 102 may include a QWERTY keyboard), although any other style of multi-key key area may be employed. The digital keys 106 represent keys that are momentary on keys that are detected as either depressed or not depressed. When a digital key is depressed, an output signal is sent to an I/O interface in the form of digital input block 112 within the keyboard controller 110. The analog keys 104 represent keys that are detected as being depressed by a variable amount or with a variable amount of pressure and that are each enabled to produce haptics motion feedback to a user indicative of the amount of pressure currently being applied to the pressed key by the user. In one embodiment, all or a portion of keys 104 and 106 may each be implemented using separately actuatable independent mechanical key structure mechanisms with corresponding separate key output circuitry and/or haptics actuation circuitry, and not implemented using membrane key output and/or membrane haptics elements of a multi-key-membrane style keyboard, although in other embodiments multi-membrane-style keys may alternatively by employed.

When an analog key 104 is depressed, an indication of the force or extent to which it is depressed is provided to pressure sensing interface circuitry 185 that in the illustrated embodiment includes pressure-sensing digital output circuitry 190 and switching circuitry 192. Pressure sensing interface circuitry 185 in turn provides a key pressure indication signal 145 that indicates the force or extent to which the key 104 is depressed to haptics control circuitry 160 which is coupled to actuate haptics motion to the pressed analog key by a haptics control signal 147. Also illustrated in FIG. 1 is optional haptics controller 162 that may be present in haptics control circuitry 160 in some embodiments, and which is further described herein. Pressure sensing interface circuitry 185 and/or haptics control circuitry 160 may each be provided in one exemplary embodiment as part of the keyboard device body. However, digital input block 112 and one or more components of pressure sensing interface circuitry 185 and/or haptics control circuitry 160 may alternatively be integrated within a microcontroller that is operating as the keyboard controller 110 and/or as part of the host system to which the keyboard is connected, if desired. The digital input block 112 and one or more of the components of pressure sensing interface circuitry 185 and/or haptics control circuitry 160 could also be implemented with external circuitry, as well.

Still referring to FIG. 1, the pressure-sensing digital output circuitry 190 includes a pressure sensing block 198 that receives an analog signal representative of the pressure applied to each of analog keys 104 and then outputs an alternating key pressure indication signal in the form of a high and low (high/low) digital output bit stream signal 133 having a frequency that is representative of this pressure being applied to each of analog keys 104 to a corresponding switching element of switching circuitry 192 (e.g., optoisolator, transistor such as MOSFETs, etc.). Each switching element of switching circuitry 192 responds to a digital signal 133 corresponding to a given analog key 104 by providing a toggled key pressure indication signal in the form of alternating open/short (off/on) digital signal 135 to a corresponding intersection point in the 16×8 key matrix which corresponds to that analog key 104 in a manner as described further herein. Pressure sensing block 198 also outputs an alternating high and low (high/low) digital output bit stream signal 145 as a key pressure indication signal carrying a bit stream that is representative of this pressure being applied to the analog key 104 to haptics control circuitry 160. It will be understood that any type of signal (e.g., signals 133, 135 and 145) that is representative of pressure applied to a given key may be characterized as a key pressure indication signal.

It will be understood that the particular embodiments illustrated herein are exemplary only, and that the components and function of pressure sensing interface circuitry 185 may be implemented using any one or more circuitry components suitable for receiving analog signals representative of key pressure from pressure sensitive keys 104 and providing corresponding alternating open/short digital output signals having a toggled frequency that is representative of key pressure from pressure sensitive keys 104 that is suitable, for example, for digital input to a legacy keyboard controller 110, and for also providing a signal representative of key pressure from pressure sensitive keys 104 to haptics control circuitry 160. Further, the components and function of haptics control circuitry 160 may be implemented using any one or more circuitry components suitable for receiving signals 145 representative of key pressure from pressure sensing interface circuitry 185 and for providing a haptics control signal 147 to cause haptics actuation circuitry of analog keys 104 to produce a variable haptics motion characteristic corresponding to the pressure level applied to the given pressure sensitive key (e.g., as a vibration waveform having a particular vibration intensity and/or frequency that corresponds to the currently applied real time key pressure level). It will also be understood that one or more pressure sensitive keys may be haptics-enabled using haptics actuation circuitry that is configured to impart haptics motion to the respective one or more pressure sensitive keys based on key pressure indication signals received from any suitable circuitry configuration, e.g., received from either haptics control circuitry 160, or alternatively received directly from pressure-sensing digital output circuitry 190 (e.g., as signals 133, 145 and/or 135) without requiring the presence of haptics control circuitry 160.

The control circuitry 120 within the keyboard controller 110 is coupled to receive on/off signals from the digital input block 112. The control circuitry 120 processes this key information and is connected to an output communication interface 118 so that this key information can be communicated to external devices, such as host components of an information handling system, through communication path 122. In addition, external devices can optionally communicate control and/or other configuration information to the keyboard controller through this same output communication interface 118 through communication path 122. Examples of possible information handling system components may be found described in U.S. patent application Ser. No. 12/586,676, filed Sep. 25, 2009, which is incorporated herein by reference in its entirety.

It is noted that the output communication interface 118 and communication path 122 can take a variety of forms. The communication path 122 can be a wired communication path or a wireless communication path, as desired. With respect to personal computer systems, such as desktop computers and laptop computers, the output communication interface 118 will often be a Bluetooth interface if a wireless interface is desired and will often be a USB (universal serial bus) interface if a wired interface is desired. However, it is again noted that any desired communication interface can be utilized. It is further noted that the keyboard controller 110 and the control circuitry 120 can be implemented as a microcontroller (e.g., legacy 8051-based microcontroller or custom microcontroller) that runs firmware stored on a memory device associated with the keyboard controller 110 and/or control circuitry 120.

It is also noted that the user configuration information 196 can be optionally stored in random access memory (RAM) or other memory storage that is associated with pressure sensing circuitry 190 (either internally or externally). Thus, the configurable analog key control parameters 196 can be stored, for example, on a RAM device in the keyboard or on the host system (e.g., on a hard drive) and can provide a wide variety of configurable parameters that can be adjusted by a user through an application programming interface (API) to a software utility application that, for example, has a graphic user interface (GUI) to allow a user to edit the parameters through the software utility. For example, the user configuration information may be stored, for example, in nonvolatile or volatile memory on board the keyboard system 100. Alternatively, the user configuration information may be stored on the host system or other device that is coupled by communication path 122 to output interface 118 off keyboard controller. Either way, single and/or multiple different user configuration files and/or multiple game (or application) configuration files may be stored allowing a user to select the applicable or desired keyboard configuration file depending on the game or application being used by the user and/or depending upon the particular user using the keyboard at the time in a manner as described in U.S. patent application Ser. No. 12/316,703 filed Dec. 16, 2008, which is incorporated herein by reference in its entirety.

Figure 2A:
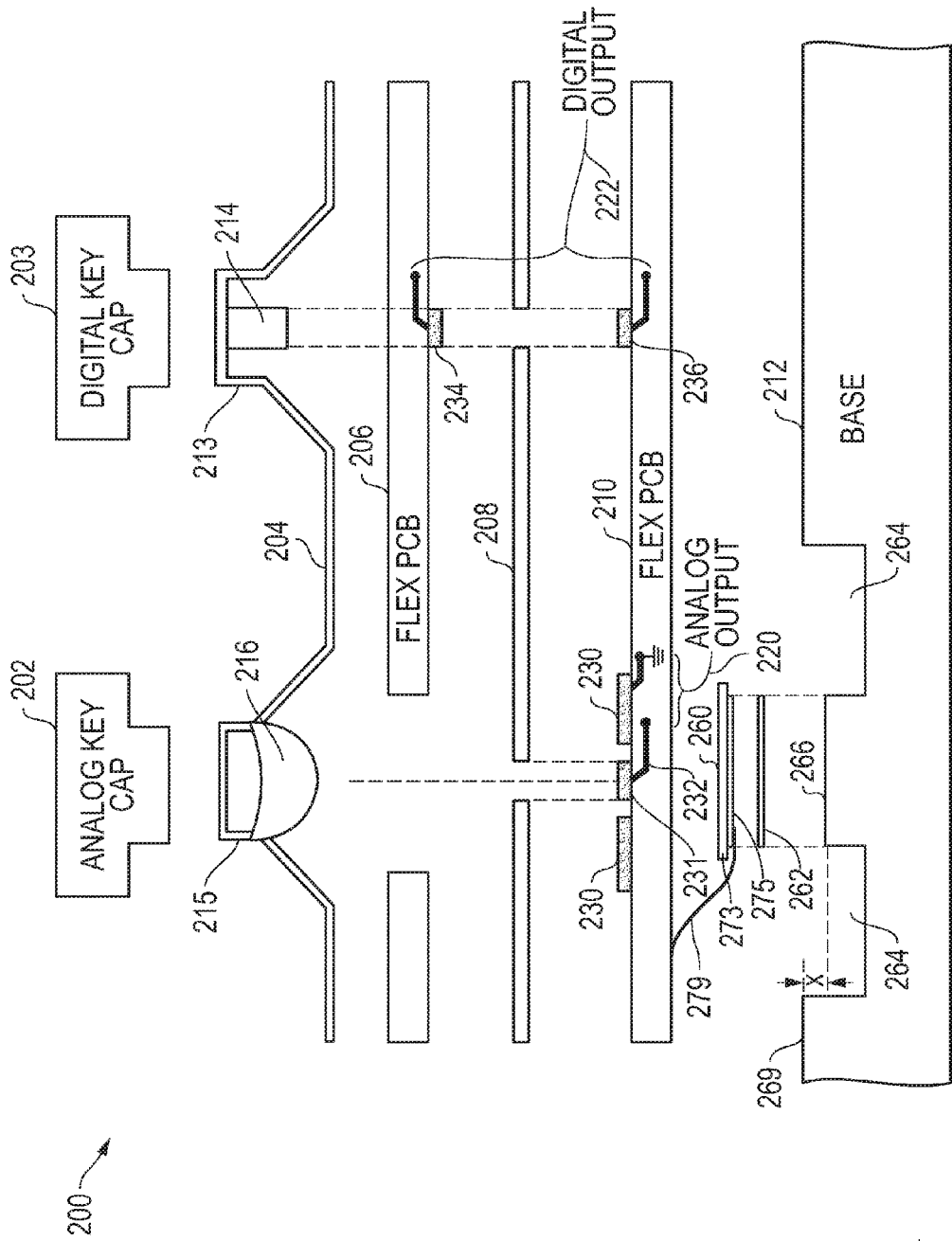
FIG. 2A is a diagram for a structure having both a haptics-enabled analog key and a digital key according to one exemplary embodiment of the disclosed systems and methods.

FIG. 2A is a diagram for an exemplary embodiment 200 for a flexible-dome styled keyboard such as may be employed in USB full size keyboards. In illustrated embodiment of FIG. 2A, the key structures include a haptics-enabled analog key and a digital key. In operation, depressing the analog keycap 202 causes key output circuitry of a key structure that includes keycap 202 to produce a variable or analog output 220 to be provided by the keyboard, and depressing digital keycap 203 causes a digital or on/off output 222 to be provided by the keyboard. The analog keys provide a variable output, and the digital keys provide a momentary-on output. As depicted, the embodiment 200 has a layered structural approach that overlays a base 212. One or more of pressure sensitive analog keys 104 may be implemented in this embodiment by a key structure that includes a separate (e.g., hard plastic) keycap 202, a separate conductive and resilient and flexible half-dome structure 216, and separate haptics actuation circuitry in the form of a piezo transducer 260 that is provided as separate (i.e., non-membrane style) circuitry from the haptics actuation circuitry of any other key structure of the keyboard. In one exemplary embodiment (e.g., as may be implemented with a variable capacitive methodology), flexible half-dome structure 216 may be a GRSP pill as manufactured by ARC USA, Inc. Such a GRSP material is a non-silkscreen conductive ink which is manufactured in a half-dome "pill" form with a soft (rubberish-like) material and that may exhibit a good operation life (number of switching actuations). In another exemplary embodiment (e.g., as may be implemented with a variable impedance methodology), flexible half-dome structure 216 may be a conductive pill made by ShinEtsu Polymer America, as used in their TouchDisc products. In one exemplary embodiment, a pill may be co-molded onto the same silicon rubber sheet with which rubber domes (213 and/or 215) are made from.

As shown in FIG. 2A, base 212 may be configured in this embodiment to contain the corresponding separate haptics actuation circuitry 260 of each separate key structure in a manner described further below. In such a configuration, each haptics-enabled key structure may be characterized as a separately acutatable independent mechanical key structure mechanism with corresponding separate key output circuitry and/or haptics actuation circuitry, i.e., that is not implemented using membrane key output elements of a multi-key-membrane style keyboard. However it will be understood that it is possible that in other embodiments multi-membrane-style keys may alternatively by employed.

In the layered structure of FIG. 2A, base 212 represents the bottom of the layered structure and can be made of a material that can support the key structure, such as a hard plastic material that may also serve as the bottom keyboard housing material. A flexible PCB (printed circuit board) 210 is then provided on top of the base 212. The PCB 210 includes circuit traces or connections that provide for electrical signals to be generated and communicated when keys are depressed. For example, circuit connection 236 is used to provide digital output 222, and circuit connection pads 230 and 231 are used to provide the analog output 220. The next layer is flexible insulator 208, such as a flexible PCB without circuit connections. The next layer is another flexible PCB 206 that can include circuit traces or connections that work in conjunction with the connections on PCB 210 to provide for electrical signals to be generated and communicated when keys are depressed. For example, circuit connection 234 is used to provide the digital output 222. A relatively thin flexible layer 204 can then be provided above PCB 206 and can be made from an injection molded silicon rubber sheet. This flexible layer 204 is configured to have a molded flexible rubber dome for each key. For example, flexible dome 215 is provided for analog keycap 202, and flexible dome 213 is provided for digital keycap 203. In one exemplary embodiment, flexible dome 216 may be co-molded to the rubber dome sheet 204.

Figure 2B:
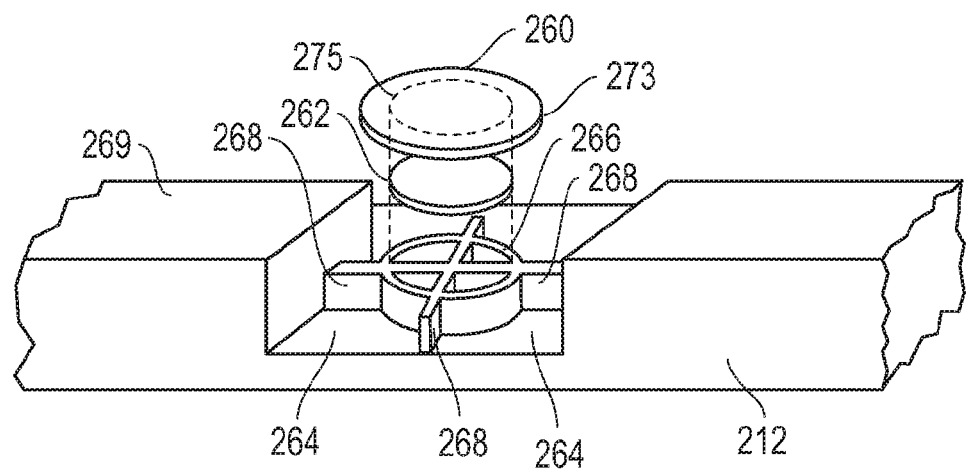
FIG. 2B illustrates a haptics transducer assembly according to one exemplary embodiment of the disclosed systems and methods.

Still referring to the exemplary embodiment of FIG. 2A, haptics actuation circuitry 260 in the form of a piezo transducer may be mounted to (and optionally within) base 212 (e.g., which may be a bottom plastic keyboard housing material structure). In this embodiment, piezo transducer 260 includes a metal plate 273 (for signal +) and ceramic capped electrode 275 (for ground). An example of such a piezo transducer is KBS-20DA-3AN, available from Kyocera Corporation. As shown in FIG. 2A, piezo transducer 260 may be mounted underneath the bottom-most layer 210 of flex circuitry, yet on the upper or top-side surface of base 212 of the keyboard. In this embodiment, piezo transducer 260 is mounted on a raised piezo support structure 266 that is protrudes upward within a cavity 264 of the base 212, e.g., such that the raised support structure 266 is surrounded by a depression or "valley" area. In this embodiment, raised piezo support structure 266 is provided as a circular rib having a diameter that is less than the outer diameter of the metal plate 273 of piezo transducer 260 in a manner such that the outer diameter of the circular rib does not exceed the diameter of the inner circle (ceramic capped electrode 275) of piezo transducer 260. This allows the outer diameter structure of the piezo transducer 260 (e.g., metal plate 273 with a varying electrical input pulse applied to it) to flex (e.g., contract/expand) or flap up and down without restriction in order to produce a vibration haptics motion for the key. In this embodiment, the haptics vibration is up and down, e.g., in a direction parallel to the up and down key travel direction of key cap 202 that is illustrated in FIG. 2D.

A raised piezo support structure 266 may alternatively be provided in the form of a boss or combination of a boss and a rib. Further, as shown in FIG. 2B, optional support ribs 268 may be provided to ensure adequate support for the piezo transducer 260, and to ensure that when the key is pressed that the flexible half-dome structure 216 presses against a flat bottom with adequate pressure distribution due to the ribs. This in turn may increase the reliability of piezo transducer 260 by making it less prone to mechanical damage due to inadequate mechanical support from underneath. Optional support ribs 268 may be shaped in such a way so as to provide mechanical support under ceramic capped electrode 275 so that ceramic capped electrode 275 substantially does not mechanically flex when pressed upon by flexible half-dome structure 216. In one embodiment, the diameter of raised piezo support structure 266 may be equal or greater than the diameter of flexible half-dome structure 216 when pressed with maximal force so as to ensure substantially no physical damage to piezo transducer 260 when pressed on by flexible half-dome structure 216 with a lot of force. In any case, the raised piezo support structure 266 is shaped and dimensioned to provide sufficient mechanical support to the piezo transducer 260 to ensure no flexion when pressed upon by the overlying key structure, while at the same time providing a solid bottom or base for the rubber dome key to press against to "make" the electrical connection (i.e., to indicate a key press).

Piezo transducer 260 may be mounted to raised piezo support structure 266 using any suitable methodology e.g., adhesives such as epoxy or silicon, mechanical mounting such as by press molding, etc. In one embodiment, piezo transducer 260 may be mounted to raised piezo support structure 266 using a dampening mounting structure 262 (e.g., such as ¹⁄₃₂ inch thick 3M Double Coated Polyethylene Foam Tape model 4492W, having a conformable closed cell foam with a high strength acrylic adhesive that provides high adhesion strength to a wide variety of surface materials. In one particular exemplary embodiment, a dampening mounting structure 262 may be a 35-55 mil thick×½ inch diameter double-sided adhesive rubberized "Glue Dot", such as GlueDot model no. XD32-402, available from Glue Dots International, an Ellsworth Adhesives Company, Germantown, Wis. Such a Glue Dot may be manufactured to have a high tack strength adhesive for industrial applications. It will be understood that such Glue Dot double-sided adhesive products may be selected to have varying tack (strength) levels, varying thicknesses from 12 mils to 100 mils, and/or custom made to meet specific mechanical needs of a given application. When employed, a rubberized or dampening consistency of a mounting structure may be selected in order to dampen transmittal of the vibration of the piezo transducer 260 through the piezo support structure 266 to the base 212, while at the same time allowing transmittal of the piezo transducer vibration through layers 210/208/206, flexible half-dome structure 216 and flexible dome 215 to the keycap 202 and the user's finger when the keycap 202 is pressed down by the user in the manner shown in FIG. 2D to cause downward key travel of key cap 202 relative to base 212. It will be understood that the thicknesses of dampening mounting structure 262 may be varied to fine tune the degree of dampening required to obtain the desired degree of vibration in the key cap (202 and/or 203) while dampening any vibration from entering back into the keyboard housing via base 212.

Figure 2C:
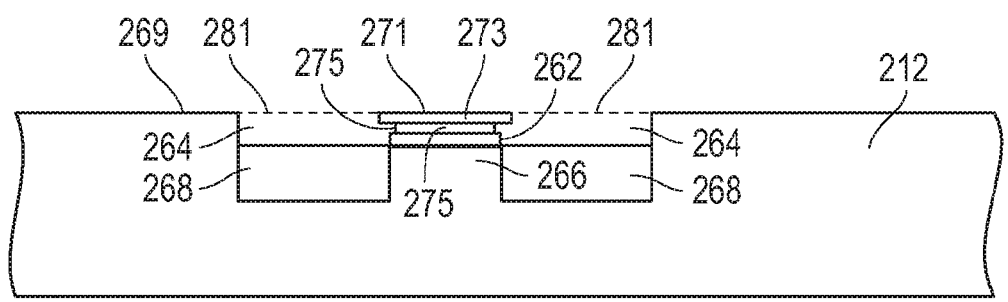
FIG. 2C illustrates a haptics transducer configuration according to one exemplary embodiment of the disclosed systems and methods.
Figure 2D:
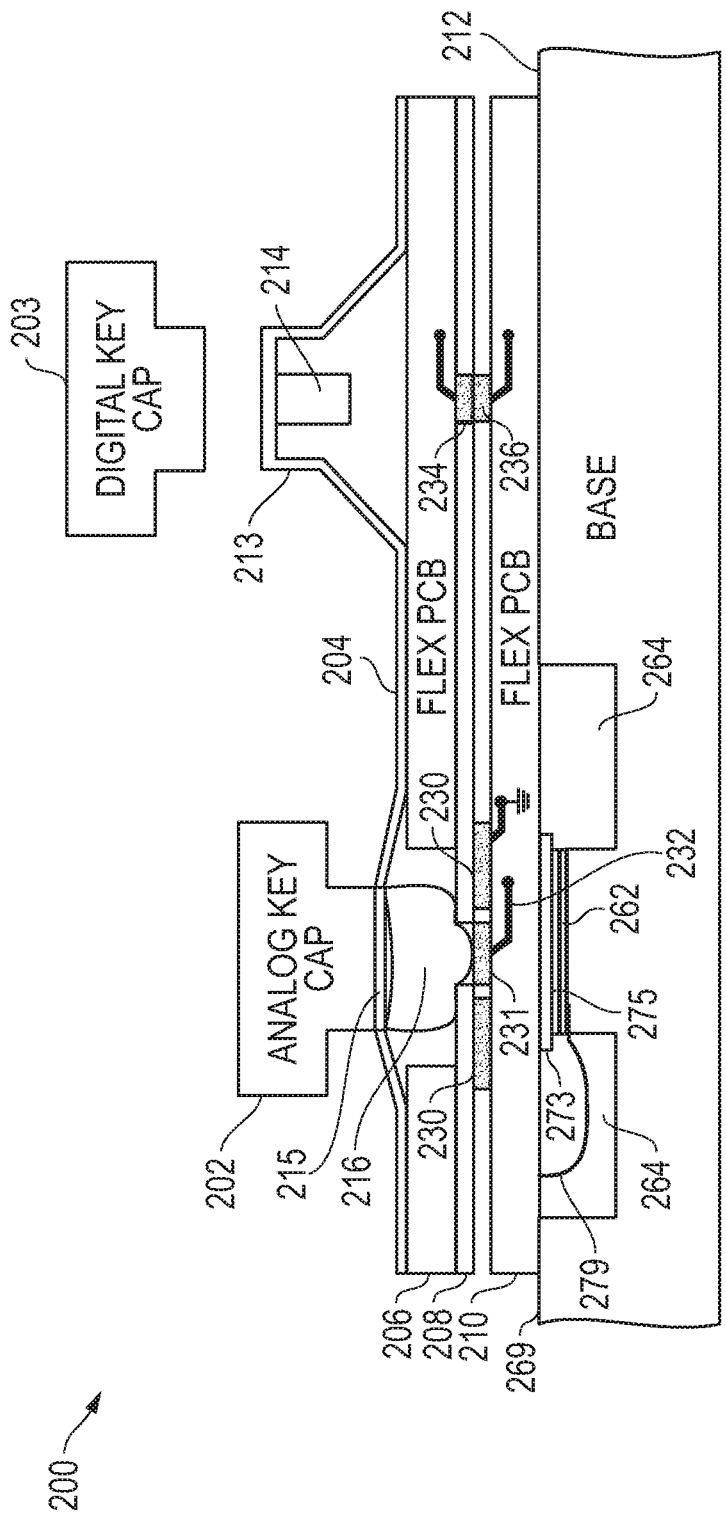
FIG. 2D is a diagram for a structure having both an analog key and a digital key according to one exemplary embodiment of the disclosed systems and methods.

As shown in FIGS. 2A and 2B, the height of the circular rib 266 is less than the height of the top surface 269 of base 212 by a distance "x" that is equivalent to the combined thickness of piezo transducer 260 and dampening mounting structure 262 such that the top surface 271 of piezo transducer 260 is coplanar (disposed in the same plane) or parallel to top surface 269 of base 212 when piezo transducer 260 and dampening mounting structure 262 are assembled to piezo support structure 266 as shown by dashed lines 281 in FIG. 2C. Such a configuration may be employed to ensure that all keycaps 202 press downward against a surface which is disposed along a common plane for each keycap 202. As shown, flex layer 210 may be utilized to route piezo signals (+ and −) via flex trace 279 to haptics actuation circuitry 260.

For the digital key of FIG. 2A, an actuator 214 is also provided underneath the dome 213 that causes circuit trace 234 to be engaged with circuit trace 236 when the digital keycap 203 is depressed. When circuit trace 234 touches the circuit trace 236, a signal is now active indicating the key was pressed, causing a digital output 222 to be generated. This digital output 222 can be configured to provide a momentary-on indication of whether or not the key has been depressed. The digital keycap 203 can be made from hard plastic.

For the analog key, the conductive and flexible half-dome 216 is provided to flex when depressed, as described in more detail below, to vary the capacitance associated between circuit pad 231 and circuit pad 230 when analog keycap 202 is depressed. At the same time flexible half-dome flexes to contact circuit pad 231 through which haptics vibration motion is transmitted from piezo transducer 260 when keycap 202 is depressed. FIG. 2D shows assembled keyboard embodiment 200 with keycap 202 so depressed. Notice that as pressure is applied to the key, flexible half-dome structure 216 not only comes into contact with circuit pad 231, but its surface area on insulator layer 208 starts to increase due to the pressure. With a maximum pressure, the half-dome 216 contact diameter of half-dome 216 on surface of insulator layer 208 approaches that of the diameter of pad 230. As the contact surface area of the half-dome 216 on surface of insulator layer 208 increases, so does the capacitance as measured at signal 232. Flexible half-dome 216 may be resilient so as to return the depressed keycap 202 to its unpressed condition when the keycap 202 is no longer depressed.

Essentially pad 231 and pad 230 are the two plates of a capacitor. The variable capacitance between these two plates are measured from signal trace 232 by sending this trace to capacitance reading circuitry. As stated below, pad 230 can be coupled to ground. It is noted that the conductive and flexible half-dome 216 can be made, for example, from a conductive rubber material, that is conductive, flexible and capable of reforming its shape after being depressed and released. Examples of suitable materials are discussed above. Further, prior art techniques have made this material from a carbon impregnated rubber.

It will be understood that one or more keys of a keyboard assembly may be provided with haptics circuitry in a variety of alternative ways with key output circuitry implemented between a keycap 202 and underlying haptics actuation circuitry 260 that is mounted to (and optionally within) base 212 in a manner described elsewhere herein. Furthermore, different types of keyboard assemblies may be provide with haptics capability, including both desktop information handling system keyboards and keyboards for portable information handling systems, such as notebook computers. For portable information handling system keyboard assemblies, the mounting of a piezo transducer or other haptics actuation circuitry to the keyboard base (under the flex layers or other key output circuitry) as described in relation to FIGS. 2A-2D may not be a desirable option, due to a different key structure that is often employed to maintain a low Z height profile for portable information handling system keyboards. Further, for any type of under key lighted information handling system keyboard, the haptics circuitry needs to be mounted in such a way that intervening opaque materials (e.g., layers) don't obstruct the light produced under the key used for backlighting the key.

Figure 2E:
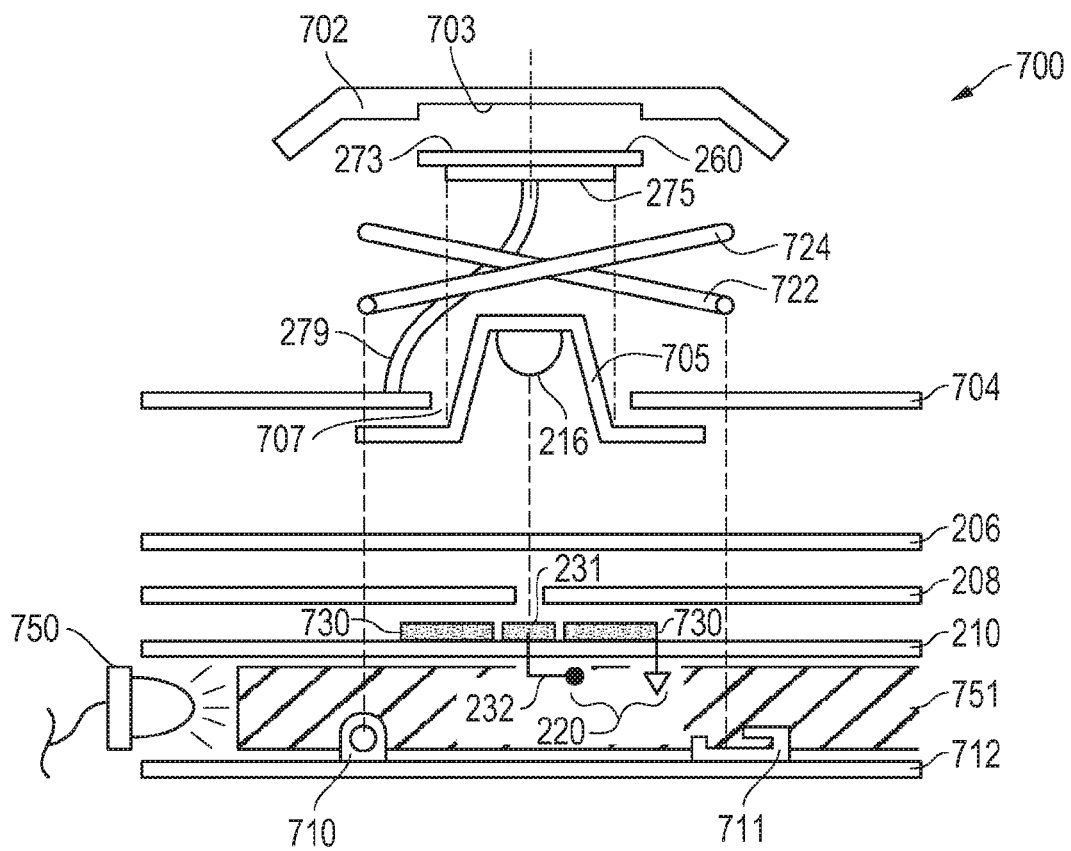
FIG. 2E is a diagram for a structure having a haptics-enabled analog key according to one exemplary embodiment of the disclosed systems and methods.

FIG. 2E illustrates an example of an alternative embodiment in which haptics actuation circuitry may be implemented between the key output circuitry and the keycap 702. In this exemplary embodiment, FIG. 2E illustrates the mounting of piezo transducer type haptics circuitry to the underside of a backlighted keycap 702 of a keyboard such as employed for an Alienware model m11x, m15x and m17x notebook computers available from Dell Computer of Round Rock, Tex., although other types of keycaps may be employed. Such a low profile keyboard may employ a collapsible dual lever action key mechanism that supports the keycap 702 by utilizing mating lever members 722 and 724 that are secured at one end through intervening layers 210, 208, 206 and 704 to a metal base 712 of an analog pressure sensitive keyboard assembly 700 at a hinge point 710 and to a slideable stopper 711 at the other end. The mating lever members 722 and 724 are configured to pivot downward relative to each other with a scissor-like action when the keycap 702 is depressed, and are provided with a resilient member that returns the keycap 702 upward to its unpressed position when the keycap 702 is no longer pressed. An example of such a collapsible key mechanism may be found in Flextronics model no. DELH-B2625040G00001 keyboard (e.g. as found in the Alienware m15x) and manufactured by Darfon of Gueishan, Taoyuan 333, Taiwan, R.O.C.

Figure 2H:
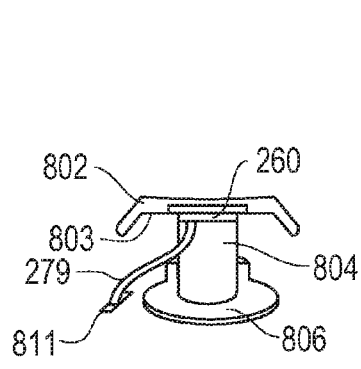
FIG. 2H illustrates a haptics-enabled keycap assembly according to one exemplary embodiment of the disclosed systems and methods.
Figure 2H:
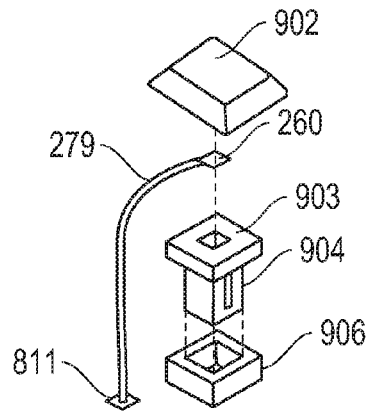
Figure 2H:
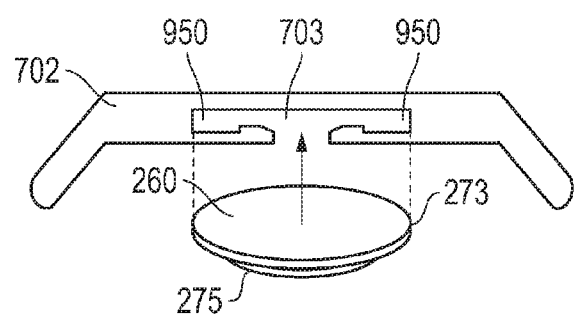
Figure 2I:
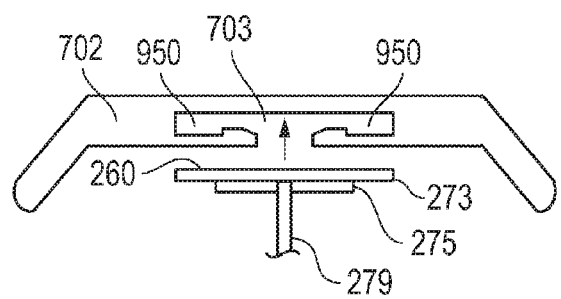
FIG. 2I illustrates a haptics-enabled keycap assembly according to one exemplary embodiment of the disclosed systems and methods.

As shown in FIG. 2E, a single layer disc type piezo transducer 260 is mounted on the underside of keycap 702 such that the larger diameter metal plate 273 of the transducer is mounted against the keycap within a complementarily-dimensioned recessed area 703 (e.g., adhered to and/or mechanically mounted by sliding into grooves 950 provided in the sides of recess 703 as shown by the arrows in FIGS. 2H and 2I), and with the smaller diameter ceramic electrode portion 275 of the transducer facing downward toward a transparent or translucent flexible rubber dome structure 705 which extends through an opening 707 provided in a top flex circuit layer 704. A conductive and flexible half-dome structure 216 is provided to flex when depressed as previously described to vary the capacitance associated between circuit pad 231 and circuit pad 230 when analog keycap 702 is depressed.

Still referring to FIG. 2E, a two-wire flex circuit 279 may be provided as shown to electrically connect the piezo transducer 260 (e.g., Kyocera Corporation, Model No. KBS-20DA-3AN piezo transducer) to the top flex circuit layer 704. Top flex circuit layer 704 is typically printed with black ink and used in non-haptics enabled keyboard assemblies only for purposes of blocking light from an underneath backlight element 750 (e.g., RGB LED, single color LED, etc.) from bleeding through at locations between openings between backlit keys. In this embodiment, the backlight element 750 shines thru the side of a polycarbonate sheet 751 which acts as a backlight-light spreader, to spread the backlight under many keys. However, in the illustrated embodiment of FIG. 2E, this existing layer 704 of flex circuit may be used to route signals between the haptics circuitry (e.g., piezo transducer 260) and haptics control circuitry which is described further herein.

As previously described and illustrated in FIG. 2E, piezo transducer 260 or other type of haptics circuitry may be mounted into a recessed area 703 that is molded into the bottom side of a keycap 702. This particular configuration allows for easier assembly in manufacturing, provides protection to the piezo transducer from flexion, and helps improve the reliability of the rubber dome 705 by preventing it from getting accidentally punctured from any sharp edges on the piezo (e.g., such as by solder connection to the wires 279 or flex circuitry 704). However, haptics circuitry may be mounted to the bottom side of a keycap 702 using any other suitable methodology, e.g., using double sided adhesive foam tape or an adhesive "Glue Dot" such as described in relation to FIGS. 2A-2D. Further, flex cable 279 may be routed from the side of the key where the dual-lever scissor action key switch pivots from connection between levers 722 and 724 to help avoid flex cable 279 from getting accidentally pinched by the action of dual levers 722 and 724 when keycap 702 is pressed by a user. In one embodiment, an opening complementary to the outer dimensions of rubber dome 705 may be formed in both levers 722 and 724 through which rubber dome 705 upwardly extends such that the top surface of the rubber dome 705 rests upon the bottom surface of ceramic electrode 275 of piezo transducer 260. When a backlit keyboard is desired and an opaque piezo transducer 260 is employed, a light pipe may be optionally added to keycap 702 to transfer backlight light as it shines through flex circuitry 704 where there's no blank ink acting as an aperture control.

FIGS. 2F and 2G illustrate alterative embodiments of multi-part haptics-enabled keycap assemblies that may be employed for "chimney stack" style key applications such as used for USB or desktop computer type keyboards. Such keyboards may employ chimney stacks that may be provided, for example, as circular or square cross-sectional plastic rods connected to the keycap that press down onto a rubber dome to which provide a spring-like action to return the key back up to position when no finger is pressed on it. Disclosed herein are two-piece keycaps that may be provided in one embodiment in the form of a keycap that's molded or adhered onto a chimney stack once the piezo is mounted inside of it such that the piezo is very close to the finger (under key cap) to strengthen the vibration haptics effect felt by the user while at the same time weakening the haptics vibrations transferred to the keyboard housing or base 212.

In the exemplary embodiment of FIG. 2F, a piezo transducer 260 or other haptics circuitry may be molded as part of a multi-piece keycap structure that is assembled together at the factory. As shown, piezo transducer 260 is mounted within a recessed area 803 of keycap 802 that is then molded to chimney stack 804 which is in turn received within a complementary aperture of key guide 806. Piezo transducer 260 is thus configured in a position in which it is allowed to flex (or vibrate) underneath the keycap lid 802 once keycap 802 is applied and sealed to the chimney stack 804 with piezo transducer 260 positioned therebetween. As shown, flex circuit 279 connects piezo transducer 260 to underlying piezo control circuitry through access opening 811 that is defined in a surface of the keyboard assembly through which key guide 806 with chimney stack 804 key guide downwardly extends to key activation circuitry that senses when each keycap 802 is depressed downward with its respective chimney stack 804. In this regard, each chimney stack 804 "spring loaded", via a rubber dome located inside circular opening 806 whereby cylindrical shaped chimney stack 804 presses against the top surface of the rubber dome, to return to a raised position when downward user key pressure is removed.

In the exemplary embodiment of FIG. 2G, a piezo transducer 260 may be mounted within a recessed area 903 of a chimney stack 904 that is then molded to keycap 902 with piezo transducer 260 positioned therebetween. Chimney stack 904 is in turn received as shown within a complementary aperture of key guide 906. Piezo transducer 260 is thus configured in a position in which it is allowed to flex (or vibrate) underneath the keycap lid 902 once keycap 902 is applied and sealed to the chimney stack 904 with piezo transducer 260 positioned therebetween. As with the embodiment of FIG. 2F, flex circuit 279 connects piezo transducer 260 to underlying piezo control circuitry through access opening 811 that is defined in a surface of the keyboard assembly through which key guide 906 with chimney stack 904 key guide downwardly extends to key activation circuitry that senses when each keycap 902 is depressed downward with its respective chimney stack 904. In this regard, each chimney stack 904 is "spring loaded", via a rubber dome located inside square shaped opening 906 whereby rectangular shaped chimney stack 904 presses against the top surface of the rubber dome, to return to a raised position when downward user key pressure is removed.

Figure 3A:
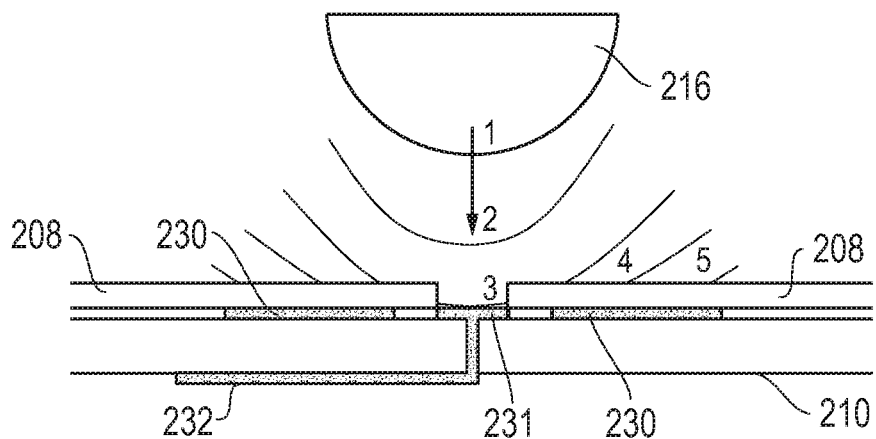
FIG. 3A is a diagram for different depressed states for a half-dome structure according to one exemplary embodiment of the disclosed systems and methods.
Figure 3B:
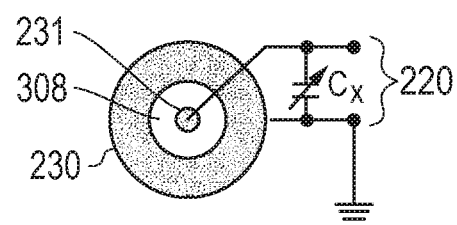
FIG. 3B is a diagram for a top view of the capacitive contacts for the half-dome structure according to one exemplary embodiment of the disclosed systems and methods.

Referring to the exemplary key output circuitry embodiment of FIG. 3B, to measure the capacitance change, plate two 230 may be connected to ground, and plate one 231 may have a trace connected to it that is routed to an I/O pin on pressure-sensing digital output circuitry 190 (e.g., TI MSP430 controller). The conductive material for the capacitive actuator may either be impregnated into the rubber dome material, or may be an external piece of material that is attached to the rubber dome via co-molding, mechanical/snap-in means, via adhesive, or a hot fusing method. Other methods for providing a conductive and flexible actuator can also be used.

As shown in more detail with respect to FIG. 3B described below, electrical pad 230 is shaped like a donut with an insulative material in the middle. Circuit trace 232 connects to the circuit pad 231 through a via within the insulative material with the conductive pad 231 being located in the middle of the insulative center of the donut area. Pad 230 may be attached to a signal trace, but the preferred method of embodiment has pad 230 being coupled to a given charge, such as being attached to ground. Due to insulator layer 208, the conductive half-dome 216 may only make contact to circuit pad 231 through the hole in the insulator 208.

As described further below, as the conductive and flexible half-dome 216 makes contact with circuit pad 231 and is deformed by pressure from the analog keycap 202, the capacitance between pad 231 and pad 230 increases. As more pressure is applied to the analog keycap 202, the half-dome 216 gradually deforms and flattens-out on top of the insulator, causing a larger conductive surface area to run parallel to pad 230. Effectively, there are two parallel plates provided by pads 231 and 230 with a fixed thickness insulator/dielectric between them. Pad 230 has a fixed surface area as it is printed onto the PCB 210. However, pad 231 has a variable surface area or is a variable sized parallel plate due to the action of half-dome 216 as it is depressed. As the surface area of pad 231 gradually increases due to action of half-dome 216 as greater force is applied to the analog keycap 202, the capacitance between plates 231 and 230 gradually increases as well. This variable capacitance can be sensed, measured and used as an indication of the pressure being applied to the analog keycap 202. When implemented using variable capacitance methodology, the sensor may be implemented on the PCB directly. However, it will be understood that haptics enabled keys may be implemented with other types of pressure sensitive keys (e.g., via the use of force sensitive resistors or the conductive flexible half-dome material —both of which employ materials that change their electrical impedance with applied pressure) using haptics circuitry and/or haptics control circuitry described herein. Further, it will be understood that conventional digital keys may be provided with haptics capability using systems, apparatus and/or methods described herein.

In one embodiment disclosed herein, pressure sensitive capacitive keys may be configured to generate a variable indication of how hard a key has been depressed. In this regard, FIG. 3A is a diagram for different depressed states for the conductive and flexible half-dome structure 216 of FIG. 2A. In its initial state, the bottom edge of the half-dome structure 216 has a bottom edge position indicated by Line 1. As the key is depressed, the half-dome structure 216 will move through the gap in the Flex PCB layer 206 (see FIG. 2A) and down towards insulator 208 and connection pad 231 on PCB 210. Line 2 represents the bottom edge of half-dome structure 216 when it has been depressed some distance. Line 3 represents the bottom edge of half-dome structure 216 when it has been depressed far enough to touch connection pad 231 through the gap in insulator 208. It is also noted that bottom edge will have flattened out slightly due to this contact, as shown with respect to Line 3. Line 4 shows that the bottom edge of half-dome structure 216 will continue to flatten as it is depressed. And Line 5 is a further indication of this flattening of the half-dome structure 216. As stated above, as the half-dome structure 216 is moved closer to connection pad 231, half-dome structure 216 will touch connection pad 231 and will then flatten out causing a larger surface area for electrical plate 231 relative to electrical plate 230. As the surface area of the plate 231 increases due to increased pressure on analog keycap 202, the capacitance between pad 231 and pad 230 correspondingly increases. This change in capacitance ($\Delta C$) can be used as an indicator of the pressure that has been used to depress the key associated with the half-dome structure 216. Connection pad 231 can be coupled to pressure sensing block 198 (of pressure-sensing digital output circuitry 190) that operates to sense and measure the electrical information provided from connection pad 231.

FIG. 3B is a diagram for a top view of the capacitive contact pads 230 and 231 for the half-dome structure. As depicted, an insulative material 308 sits between the contact pad 230 and the contact pad 231. As indicated above, the contact pad 230 can be coupled to ground. And the variable capacitance (Cx) between the pads 230 and 231 caused by the motion of the half-dome structure 216 can be used to provide the analog output 220. The variable capacitance (Cx) between pads 230 and 231 can be represented by a fixed capacitance component associated with the position of the pads 230 and 231 ($C_{fixed}$) and a varying capacitance component ($C_{variable}$) associated with the action of the half-dome 216, such that $Cx=C_{fixed}+C_{variable}$. The deforming of the conductive flexible half-dome structure 216 effectively increases the capacitor plate area associated with the pad 230, thereby effectively increasing the capacitance between pads 230 and 231. As stated above, the change in capacitance ($\Delta C$) caused by varying capacitance component ($C_{variable}$) due to the half-dome 216 can be then used as an indicator of the pressure that has been used to depress the key associated with the half-dome structure 216.

Figure 4A:
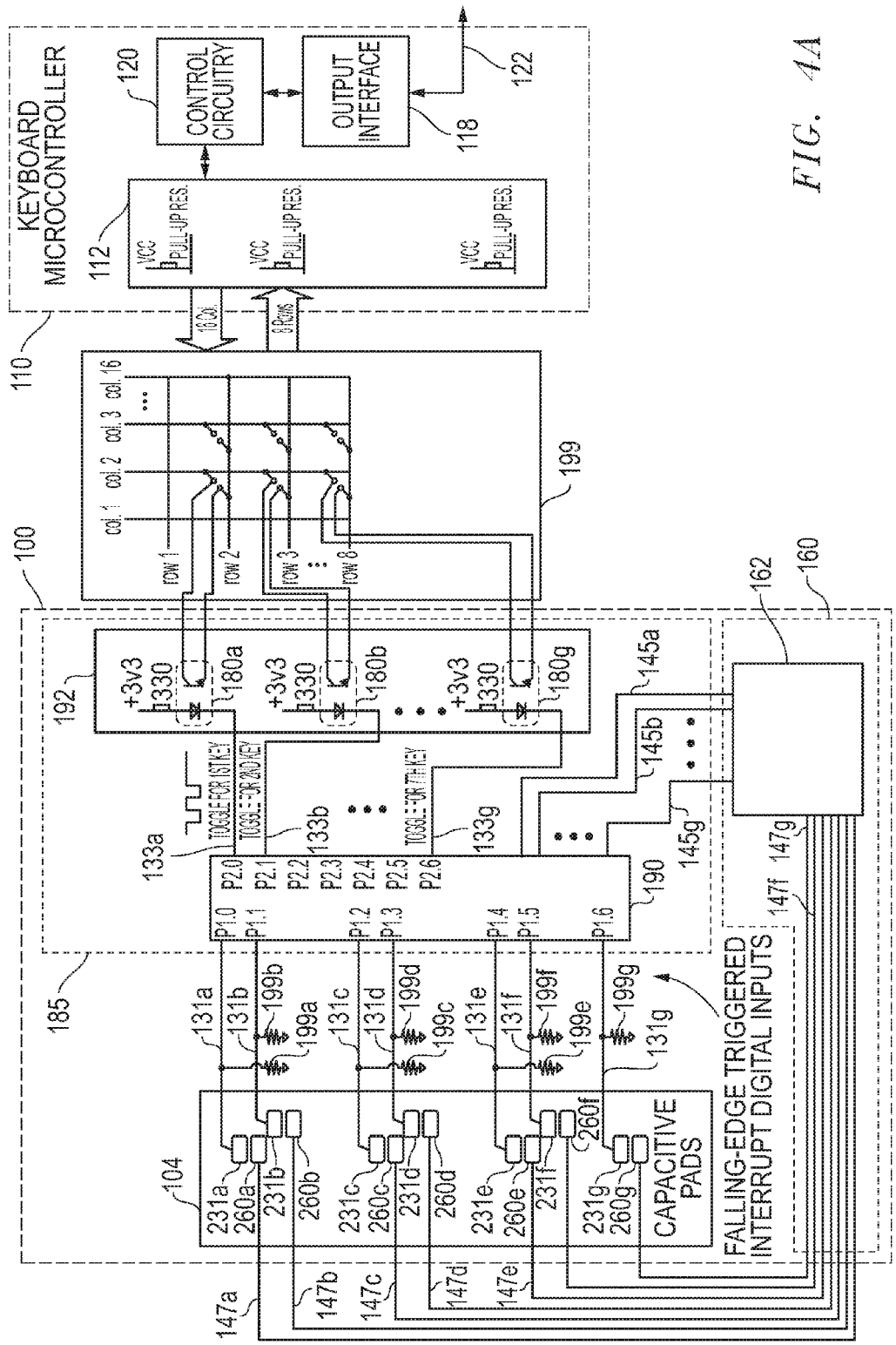
FIG. 4A is a block diagram illustrating a keyboard system according to one exemplary embodiment of the disclosed systems and methods.

FIG. 4A illustrates one exemplary embodiment of a keyboard system 100 in which analog keys 104 are haptics-enabled pressure sensitive capacitive keys (such as described in relation to FIGS. 2A-2I, 3A and 3B), having capacitive pads 231a-231g that are coupled to pressure-sensing digital output circuitry 190. One exemplary embodiment may implements the pressure-sensing digital output circuitry 190 as a Texas Instruments 16-bit ultra-low power capacitive sensing microcontroller part number MSP430F2111, however other microcontrollers may be used. In this exemplary embodiment, pressure-sensing digital output circuitry 190 is specifically coupled for sensing and measuring capacitance for each key via a corresponding general purpose input output (GPIO) port P1.0 to P1.6 that incorporates a falling edge triggered digital interrupt. Although configured in this embodiment with one GPIO input provided per corresponding single capacitive pad 231, it is alternatively possible that multiple capacitive pads 231 may be coupled to a single GPIO input pin. However, for some embodiments, it may be found that less noise and improved performance may be achieved by coupling just one capacitive pad to each GPIO of pressure-sensing digital output circuitry 190.

In this exemplary embodiment, pressure-sensing digital output circuitry 190 employs RC capacitive measurement methodology with falling edge event driven interrupt performed on a per pin basis. Information on RC capacitive measurement may be found, for example, in U.S. Pat. No. 3,936,674, which is incorporated herein by reference in its entirety. Using this methodology, each capacitive pad 231a through 231g is charged and discharged via traces 131 one at a time, and the amount of time for the discharge of each corresponding pad 231 is measured using a timer operating at a high speed (e.g., timer operating at about 16 MHz or other suitable speed). Using this methodology, the higher the capacitance the longer the discharge time, thus providing a higher digital "count" output from the timer of digital output circuitry 190. In this regard, as the depressible half-sphere on the bottom side of the keycap of each capacitive pad 231 is depressed by applied finger pressure, the amount of surface area in contact increases, thus resulting in an increased capacitance on the pad. According to the capacitance relationship, as a plate surface area increases, its capacitance increases.

In one exemplary embodiment, pressure-sensing digital output circuitry 190 may be implemented by a TI MSP430F2111 microcontroller or other suitable circuitry that employs RC discharge time to measure the variable capacitance of each analog key 104 as follows. In this exemplary embodiment, each signal lines 131 acts as a single input/output (I/O) line between a given falling-edge triggered interrupt digital port P1.X of pressure-sensing digital output circuitry 190 and a corresponding given analog key 104. The capacitive plate of each analog key 104 is also coupled to ground through a resistor 199 (e.g., 6 M$\Omega$ or other resistor value selected to provide sufficiently slow RC discharge time to provide the desired measurement resolution for the given application). In this configuration, each signal line 131 is employed to charge, discharge and produce an interrupt when the voltage of the capacitor of analog key 104 crosses a low voltage threshold. For example, a given port P1.X of a given I/O line 131 may be set to output high to charge (e.g., with 500 nA charging current) the capacitive plate of a corresponding analog key 104 to near $V_{CC}$, and a free-running timer of the pressure-sensing digital output circuitry 190 read to mark the start time. Then the given port P1.X is set to input with negative-edge interrupt enabled and the resistor coupled to the capacitive plate of the corresponding analog key 104 discharges the capacitive plate of the analog key 104 to ground, during which pressure-sensing digital output circuitry 190 may go into low power mode to save power. When the voltage of the capacitive plate crosses an interrupt voltage $V_{IL}$ due to this discharge to ground, an interrupt is generated which causes the free-running timer to be read again and the elapsed time for discharge of the capacitive plate of the analog key 104 from near $V_{CC}$ to $V_{IL}$ is calculated. Pressure-sensing digital output circuitry 190 may then return to high power mode. The discharge timer count of the capacitive plate of each analog key 104 is proportional to its present capacitance, which depends on the amount of pressure currently applied to the key 104. In one exemplary implementation, multiple capacitor readings of a given analog key 104 may be averaged to filter out common mode noise, e.g., by using a charge cycle followed immediately by a discharge cycle and averaging the two values.

Still referring to the exemplary embodiment of FIG. 4A, pressure-sensing digital output circuitry 190 provides a corresponding digital output 133 for each capacitive pad 231 and its input 131. Each digital output signal (P2.x) 133 corresponds to a respective capacitive pad input (P1.x) 131. In this embodiment, each digital output signal 133 is produced in an intermittent alternating high/low manner with a frequency that emulates the action of a user's finger toggling away at a conventional digital "momentary on" digital key at a variable speed that is based on the amount of pressure being applied to the corresponding pressure sensitive analog key 104. Thus, open/short mechanical user toggling control may be advantageously replaced by electrical control based on the key pressure applied by a user to provide a similar intermittent alternating high/low signal output without requiring a user to toggle the keys. It will be understood that although the exemplary microcontroller of pressure-sensing digital output circuitry 190 of FIG. 4A employs 8 digital falling-edge triggered interrupt inputs Port 1 (P1.x), and 8 digital outputs Ports 2 (P2.x), it is possible to select a different chip(s) to support more pressure sensitive keys.

In addition to digital outputs 133, pressure-sensing digital output circuitry 190 also provides a signal 145 corresponding to each capacitive pad 231 that indicates the force or extent to which the key 104 is depressed to haptics control circuitry 160. In one embodiment, each signal 145 is a digital signal similar to the corresponding digital output signal 133 produced by pressure-sensing digital output circuitry 190, i.e., being produced in an intermittent alternating high/low manner at a variable speed that is based on the amount of pressure being applied to the corresponding pressure sensitive analog key 104. However, a pressure indication signal 145 may be any other type of signal suitable for indicating pressure applied to a corresponding pressure sensitive analog key 104. Haptics control circuitry 160 in turn produces a corresponding haptics control signal 147 to actuate the haptics circuitry 260 that corresponds to (e.g., is mechanically coupled to or otherwise associated with) the particular pressed key 104. In one exemplary embodiment, haptics control signal 147 may be operable to cause haptics circuitry 260 to produce a vibration or other type of movement for the pressed key 104 that is proportional or otherwise variable relative to the amount of pressure currently being applied to the corresponding pressed key 104.

In the illustrated embodiment of FIG. 4A, haptics control circuitry 160 may include at least one haptics controller 162 as shown. Although one haptics controller 162 receiving multiple pressure indication signals 145 and producing multiple corresponding haptics control signals 147 is illustrated in FIG. 4A, it will be understood that haptics control circuitry 160 may include more than one haptics controller, e.g., with one haptics controller 162 being provided for independently actuating haptics circuitry 260 of each separate pressure sensitive key 104. In this regard, additional embodiments are illustrated further herein that show just a few of the different circuit configurations that are possible in the implementation of the disclosed systems and methods.

In the exemplary embodiment of FIG. 4A, keyboard system 100 is implemented to be interchangeable with a legacy USB keyboard for interconnection with standard 8 bit keyboard controller 110 via a standard 16×8 key matrix 199 with 16 columns×8 rows and native device drivers. However, it will be understood that one or more features of the disclosed systems and methods may be implemented in non-legacy or customized keyboard systems, and in any arrangement of one or more circuitry components as may be suitable for a given application.

In the exemplary embodiment of FIG. 4A, legacy keyboard controller 110 has a standard keyboard matrix open/short input 199 provided for the 104 keys on a standard keyboard that is arranged as 16 columns by 8 rows, so that only 24 signals interface with the keyboard controller 110, rather than a signal line per key which would require over 100 signals to the keyboard controller 110. The keyboard controller 110 operates by initially selecting a single row and applying a logic level 1 to it. There are 16 keys in a column, with only one of those keys intersecting with the particular row that's at logic 1. To detect if a key is pressed in a row, each column is sequentially grounded. If a key is pressed, it shorts the column to the row, thus causing the row voltage to drop or go low. When the keyboard controller 110 detects the low voltage on the selected row, the pressed key can be determined by the column/row intersection that was electrically shorted. Once all columns have been queried in a single row, the keyboard controller 110 sequences to the next row, and so on until all rows have been queried, thus sampling the logic level for every key.

In summary, though a low voltage sense is used to detect a key press in normal keyboard microcontroller operation, an electrical short is required at each intersection of the keyboard key matrix 199 to indicate the press of a key. Thus, a direct alternating high/low digital output signal 133 from a microcontroller such as IT MSP430F2111 is incompatible with the inputs to such a legacy keyboard controller 110. However, in the illustrated embodiment, switching circuitry 192 may be provided as an interface between pressure-sensing digital circuitry 190 and legacy keyboard controller 110 for analog keys 104. The purpose of the switching circuitry 192 is to convert a high/low digital output stream into a stream of opens/shorts. For example, as shown in FIG. 4A, a separate optoisolator 180 has been provided for each corresponding analog key switch location. Examples of such optoisolators include, but are not limited to, AVAGO 4N35 or ACPL-227 optocouplers available from Avago Technologies of San Jose, Calif.

In the exemplary embodiment of FIG. 4A, each optoisolator 180 provides an electrical control over the make or break (short or open circuit) connection at a given column/row intersection location of keyboard matrix open/short input 198 for that particular key. This advantageously allows analog keys 104 to be implemented with a conventional keyboard matrix arrangement and legacy keyboard controller 110 (along with its firmware and device driver). Further, the implementation of this embodiment of switching circuitry 192 allows any key (and/or any number of keys) of a conventional keyboard matrix to be provided with pressure sensing capability.

Figure 4B:
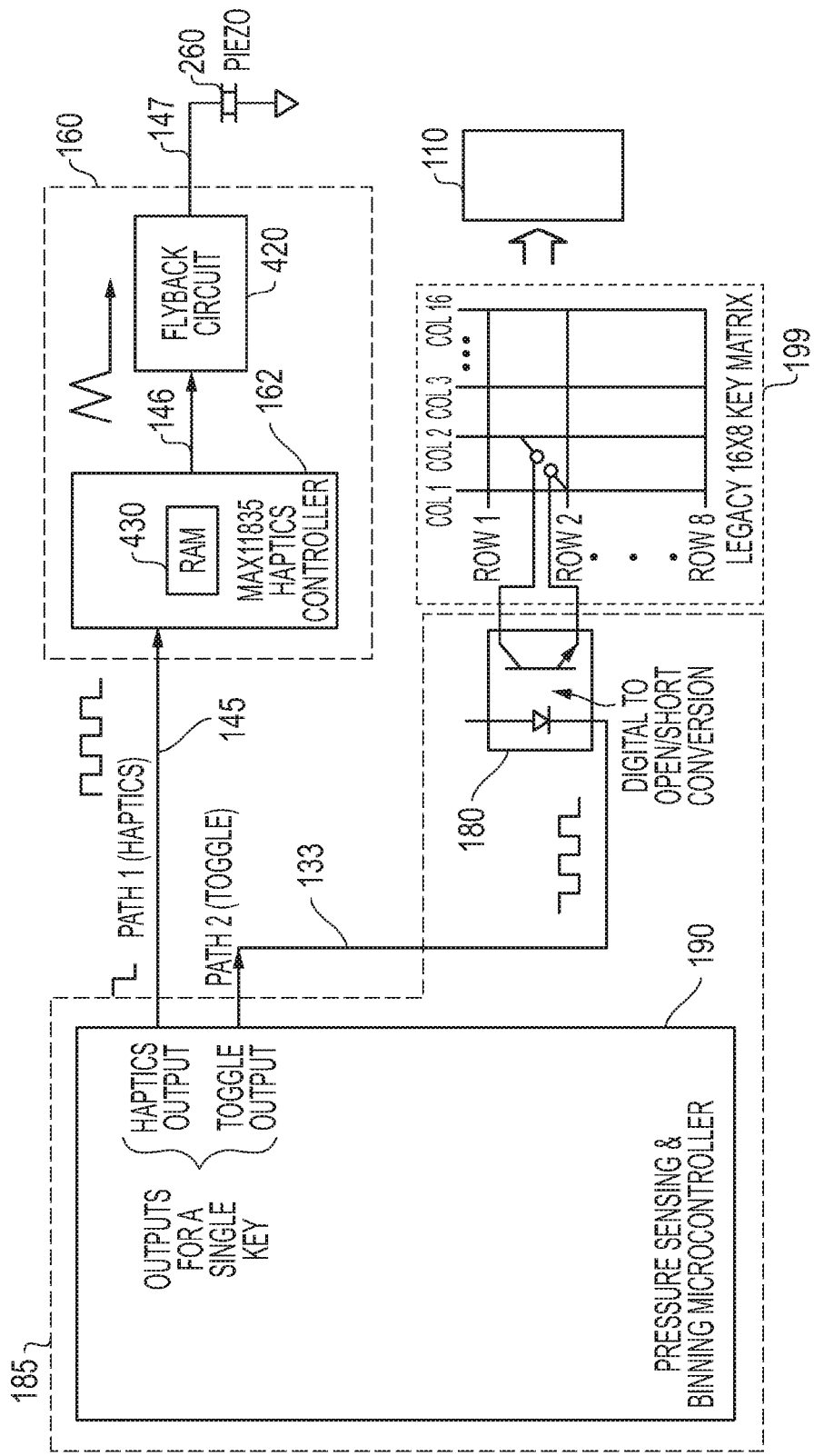
FIG. 4B illustrates haptics control circuitry and other associated circuitry according to one exemplary embodiment of the disclosed systems and methods.

FIG. 4B illustrates one exemplary embodiment of haptics control circuitry 160 as it may be implemented with pressure sensing interface circuitry 185, a keyboard controller 110, and haptics actuation circuitry 260 provided in the form of a piezo transducer or other suitable haptics actuator. Haptics control circuitry 160 may be implemented using any circuitry or combination of circuits suitable for controlling haptics actuation circuitry 260 based on the amount of pressure applied to an analog key 104 in a manner as described further herein. In one exemplary embodiment, haptics control circuitry 160 may include a haptics controller 162 (e.g., MAX11835 available from Maxim) and a flyback converter (transformer) circuit 420 as shown. In such an embodiment, haptics controller 162 outputs a low voltage (e.g., 3 volt)

waveform signal 146 representative of a selected vibration waveform that corresponds to the pressure applied to an analog key 104. Optional flyback converter circuit 420 may be present to amplify the low voltage waveform signal 146 (e.g., to about 160 volts sawtooth) and to provide this amplified signal 147 to the piezo transducer 260 of haptics actuation circuitry 260. In the exemplary embodiment of FIG. 4B, haptics controller 162 and pressure-sensing digital output circuitry 190 (e.g., pressure sensing and binning controller) operate in parallel, and also interact with each other to enable variable pressure haptics for keys 104 using a two-path output signal architecture from pressure-sensing digital output circuitry 190 (i.e., a trigger/waveform address signal path 145, and a toggle signal path 133).

As shown in FIG. 4B, haptics controller 162 may include or otherwise access memory 430 (e.g., RAM or any other suitable non-volatile or volatile memory) that stores one or more vibration waveforms. For example, memory of a MAX11835 controller may store up to 16 different vibration waveforms that are selected to correspond to different pressure force levels applied to a variable pressure sensitive key 104. Each of the vibration waveforms may be assigned a corresponding waveform address in memory of the controller. In operation of PATH 1 (haptics path) of FIG. 4B, pressure-sensing digital output circuitry 190 may output a pressure indication signal 145 as a falling edge trigger event to haptics controller 162. The pressure indication signal 145 may include the selected waveform address (e.g., 4 bit waveform address) that corresponds to the desired vibration waveform and current pressure level applied to a given key 104. The haptics controller may then retrieve the selected particular waveform from memory 430 according to the waveform address, and then output this selected waveform as low voltage waveform signal 146 to flyback circuit 420. Duration of signal 146 may be of any selected and suitable time, but in one embodiment may be a short duration waveform signal (e.g., of about 45 milliseconds) that loops or repeats over and over for a period corresponding to a polling period of pressure-sensing digital output circuitry 190 (e.g., for a period of about ½ second or other greater or lesser time value).

Still referring to FIG. 4B, PATH 2 (toggle path) is implemented by the illustrated components as follows. After the 4 bit waveform of PATH 1 is loaded, key toggling is initiated by pressure-sensing digital output circuitry 190 by providing digital signal 133 to keyboard key matrix 199 and keyboard controller 110 via optoisolator 180 of output switching circuitry 192 in a manner as described elsewhere herein. The rate of the key toggling of digital signal 133 is dictated by the applied pressure level, and toggling occurs for a period corresponding to a polling period of pressure-sensing digital output circuitry 190 (e.g., for a period of about ½ second or other greater or lesser time value). In this regard PATHS 1 and 2 may operate in parallel, although PATH 1 may be started first due to the latency of loading in the waveform address via signal 145.

Figure 4C:
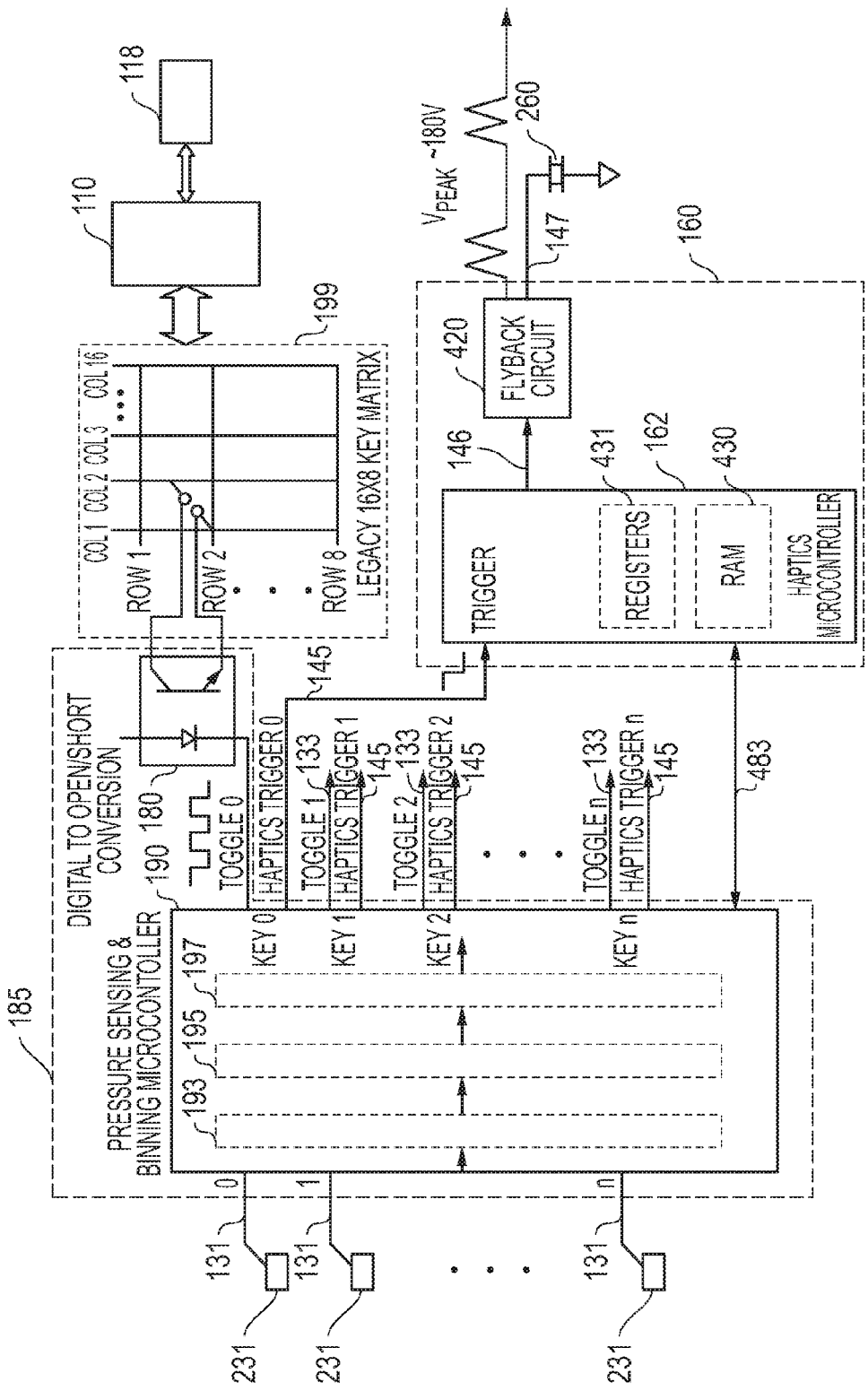
FIG. 4C illustrates haptics control circuitry and other associated circuitry according to one exemplary embodiment of the disclosed systems and methods.

FIG. 4C illustrates the embodiment of FIG. 4B in more detail, it being understood that in this exemplary embodiment separate haptics control circuitry 160 (with a separate haptics controller 162 and flyback circuit 420) may be provided to receive each corresponding pressure indication (haptics trigger output) signal 145 and to provide a respective haptics control signal to the corresponding haptics transducer 260 of each haptics enabled key 104. As shown in FIG. 4C, at least three function blocks may be implemented by pressure-sensing digital output circuitry 190: block 193 performing sense and measure capacitance in round-robin cycle; block 195 performing identification of a particular pressed key 104 and corresponding digital output count; and block 197 performing determination of pressure level, selection of vibration waveform, output of the selected waveform for the determined key pressure level, and output of the key-toggle rate output rate for the determined key pressure level. Also illustrated in FIG. 4C is register 431 provided for haptics controller 162 for purposes of setting parameters and functions internal to the Haptics controller 162 for the desired functional operation and performance. I2C bus 483 is also shown present between pressure sensing interface circuitry 185 and haptics control circuitry 160 for the purpose of initializing the clocks and registers of the haptics controller 162, as well as providing an alternative method of communicating the address of the vibration waveform from RAM 430 to the registers 431 in real-time which results in an amplified vibration waveform outputted from the flyback circuit 420 to the piezo transducer 260.

Figure 4D:
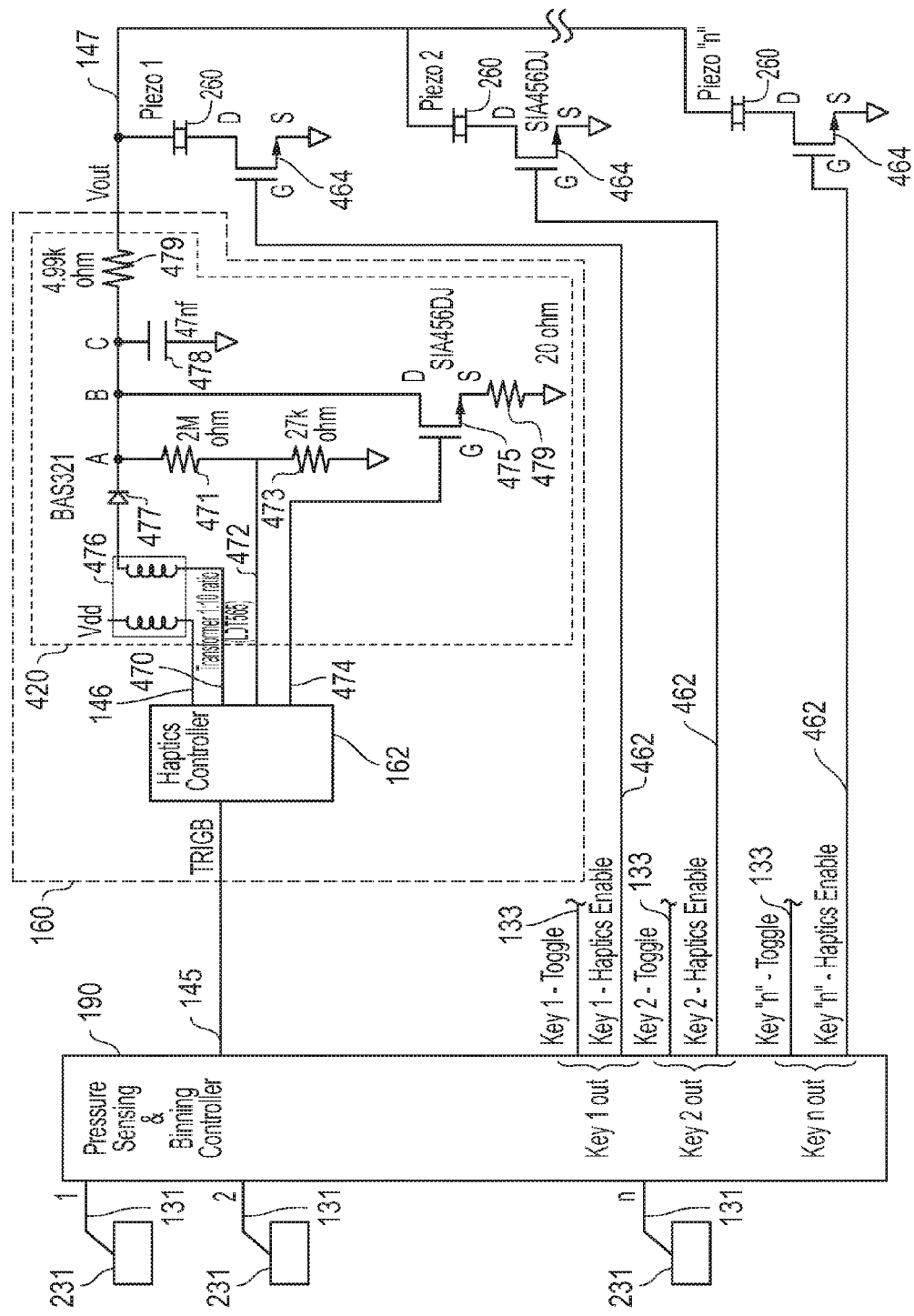
FIG. 4D illustrates haptics control circuitry and other associated circuitry according to one exemplary embodiment of the disclosed systems and methods.

FIG. 4D illustrates another exemplary embodiment in which haptics control circuitry 160 may be implemented using a single haptics controller 162 to support actuation of multiple haptics transducers 260, e.g., for multiple pressure-sensitive keys 104. In this regard, it will be understood that similar architecture may also be employed with haptics control circuits 160 that include more than one haptics controller 162, but in which at least one of the multiple haptics controllers itself supports more than one haptics transducers 260. As shown in FIG. 4D, a single common haptics controller 162 of haptics control circuit 160 is coupled to receive a common pressure indication signal 145 output by pressure-sensing digital output circuitry 190 whenever any one of the multiple variable pressure sensitive keys 104 are pressed. This common pressure indication signal 145 indicates the force or extent to which any one of the given multiple keys 104 (i.e., one of keys 1-n) is currently pressed. Haptics controller 162 then provides a corresponding low voltage waveform signal 146 to flyback circuit 420, which in turn produces a haptics control signal 147 in a manner as described elsewhere herein.

In the exemplary embodiment of FIG. 4D, only a single haptics control signal 147 is generated for controlling any given one of the multiple haptics transducers 260 corresponding to multiple analog keys 104. In this regard, pressure-sensing digital output circuitry 190 controls actuation of only the appropriate haptics transducer 260 that corresponds to the currently-pressed analog key 104 by generating an appropriate haptics enable signal 462 to switch on the respective haptics control switch 464 (e.g., MOSFET such as SiA456DJS available from Vishay of Shelton, Conn.) corresponding to the haptics transducer 260 of the appropriate pressed key 104. Since only one haptics control switch 464 is switched on at any given time by pressure-sensing digital output circuitry 190, haptics motion is only provided by the haptics control signal 147 to the transducer 260 of the key 104 being currently pressed. FIG. 4D further illustrates that pressure-sensing digital output circuitry 190 is also configured to provide a separate alternating high and low (high/low) digital output bit stream signal 133 for each variable pressure sensing key 104 for output switching circuitry 192 in a manner as described elsewhere herein. It will be understood that pressure-sensing digital output circuitry 190 may be configured as desired or needed to arbitrate between multiple analog keys 104 that are pressed simultaneously in a system configured according to the exemplary embodiment of FIG. 2D, e.g., so that the hardest pressed analog key 104 at any given time is provided with haptics motion, so that the most lightly pressed analog key 104 at any given time is provided with haptics motion, so that the analog key 104 continuously pressed for the longest duration is provided with haptics motion (i.e., the first pressed analog key 104 of simultaneously-pressed analog keys 104 is provided with haptics motion), etc.

FIG. 4D also shows exemplary details of a MAXIM-specified flyback converter circuit 420 that may be employed in one embodiment, it being understood that other flyback converter circuit and/or transformer circuit configurations are possible. In particular, MAXIM-specified flyback converter circuit 420 of this exemplary embodiment includes a 1:10 transformer 476 (e.g., LDT565 available from TDK Corporation of Tokyo, Japan) that is coupled to receive low voltage waveform signal 146 and efficiently amplify it to produce a high voltage haptics control signal 147. Boost secondary current-sense input 470 couples to secondary side of transformer 476 for purposes of current measurement by the haptics controller 162. As shown, a diode 477 (e.g., BAS321 general purpose diode available from NXP Semiconductor of Eindhoven, Netherlands) may be provided at the secondary side of transformer 476 for rectification along with prevention of reverse surge. A 4.99K ohm resistor 479 is present between piezo transducer 260 and diode 477 and is a filter resistor used to reduce audible noise. A 47 nF capacitor 478, coupled to ground is connected at a node C between resistor 479 and diode 477, is a reservoir cap that internal DC-DC converter dumps charge to. The value may also be modified according to the waveform being driven. Haptics controller 162 is also coupled by a separate signal line 472 and 2 M ohm resistor 471 to a node A positioned between resistor 479 and diode 477. The output voltage at nodes A, B and C, is sampled by the haptics controller 162 on analog feedback input signal 472 via resistive voltage divider which is composed of 2M ohm resistor 471 and 27K ohm resistor 473. The analog input signal 472 is sampled by an A/D converter internal to the haptics controller. Based on the A/D conversion and the particular vibration waveform pattern selected to output, either the voltage boost is turned on or the current sink, based on MOSFET (Vishay pn SIA456DJ) 475, is turned on.

Figure 5:
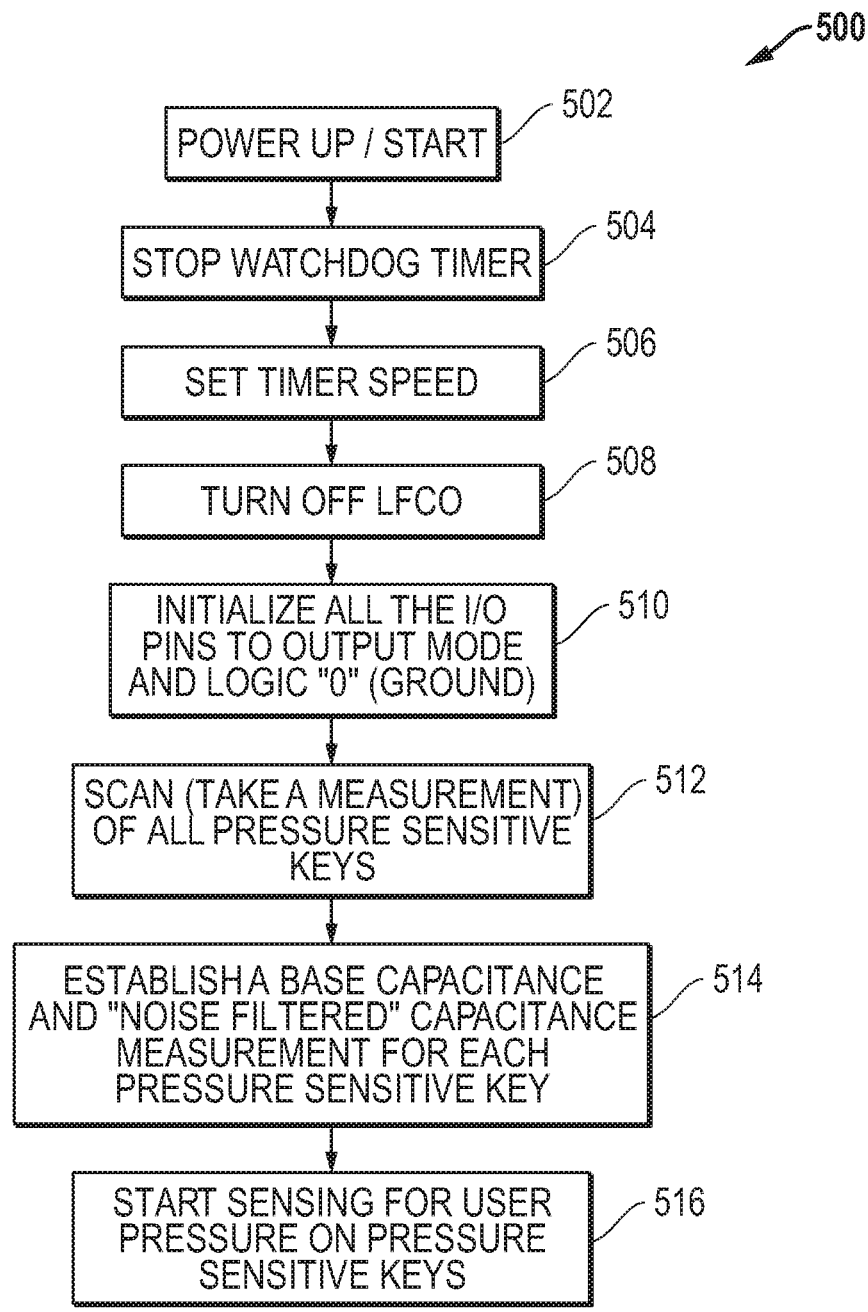
FIG. 5 illustrates methodology for initialization of pressure-sensing digital output circuitry according to one exemplary embodiment of the disclosed systems and methods.

FIG. 5 illustrates one exemplary embodiment of methodology 500 that may be employed for initialization of pressure-sensing digital output circuitry 190 of keyboard system 100 of FIG. 4. As shown, methodology 500 starts in step 502 with power up of an information handling system to which keyboard system 100 is coupled. The watchdog timer is stopped in step 504, and timer speed (e.g., digitally controlled crystal oscillator speed) is set in step 506 (e.g., to 16 MHz for TI MSP430F2111 microcontroller). Note that the faster the Timer's clock (e.g., DCO) is running, the more accurate the timing measurement of the RC discharge. Next, in optional step 508, any embedded low frequency crystal oscillator when present (e.g., such as is the case with the TI MSP430F2111) is turned off because the I/O pins for this oscillator can also function as I/O pins for additional capacitive pads supporting negative edge triggered interrupts. In such a case these oscillator pins may be optionally used as I/O pins to keep the package size (and pin out count) of the microcontroller as small as possible. Further, since there is no need for any additional clocks, any on-board low speed clock may be disabled in order to reduce power consumption and eliminate an unnecessary source of electrical noise. In step 510, all I/O pins of pressure-sensing digital output circuitry 190 are initialized to output mode and logic "0" (ground). Then in step 512, all analog pressure sensitive keys 104 are scanned, one at a time in a sequential or round-robin fashion, by measuring the voltage of each analog key 104 while all other analog keys are grounded. It does this by operating as such:

1. The I/O pin is set to output high. A Timer is read to mark the start time.
2. The I/O pin is set to input mode with negative edge interrupt enabled. The resistor then discharges the capacitive pad. The TI MSP430 microcontroller goes into low power mode for reduced power consumption, however, it's still able to monitor the interrupt enabled input I/O pins.
3. When the voltage of the sensor crosses the low level voltage threshold, an interrupt is generated.
4. The interrupt service routine (ISR) reads the Timer and calculates the time to discharge to the low voltage threshold level. This is referred to as a "count" value. The MSP430 exits low power mode and continues operation.

In one embodiment, upon host boot-up, a measurement of each of the analog keys may be performed sequentially ("scanning process") as labeled in step 512. This scanning process may be performed multiple times (e.g., 100 times) in order to allow the master clock and PCB conditions to stabilize.

Though not required, for some applications it may be advisable to provide additional filtering of the "count" measurement to remove any residual noise and further increase sensitivity of the capacitive pads as capacitive pad measurements are often noisy due to a number of factors such as temperature, humidity, voltage drift, component tolerances and 50/60 Hz mains. In step 514, a base capacitance is established and tracked, as the base capacitance of the capacitive pad can change due to environmental conditions such as temperature, humidity, voltage drift and/or component tolerances. Note that this is a slow type of change as changes occur in minutes, not microseconds. A baseline capacitance is established as the capacitance of each pad during the open state (when no finger is pressing on the key). As any of the above mentioned environmental factors changes, the base capacitance for each pad is updated and stored. If a decrease in capacitance is detected, the software must adjust the base capacitance rapidly since this is not a function of the sensor excitation. We can do this be re-averaging with the current count result. If an increase in capacitance is detected, the base capacitance may be adjusted very slowly as this may be due to a finger hovering over a key, and not because of an environmental drift effect. For example, the base capacitance may be adjusted by 1 with each measurement, but only if no keys are pressed. Additionally, an optional low pass filter (e.g., implemented in firmware/software or otherwise), may also help to eliminate the presence of any 50/60 Hz main-power noise that may be coupled onto the capacitive pads. For example, in one exemplary embodiment, the low pass noise filter may be implemented as a software based IIR (infinite impulse response) filter, or essentially as a DC tracking filter.

Finally, in step 516, sensing for user pressure on each of analog keys 104 is started. The endless loop of this sensing process is described further below in relation to FIG. 6A and FIG. 6B.

Figure 6A:
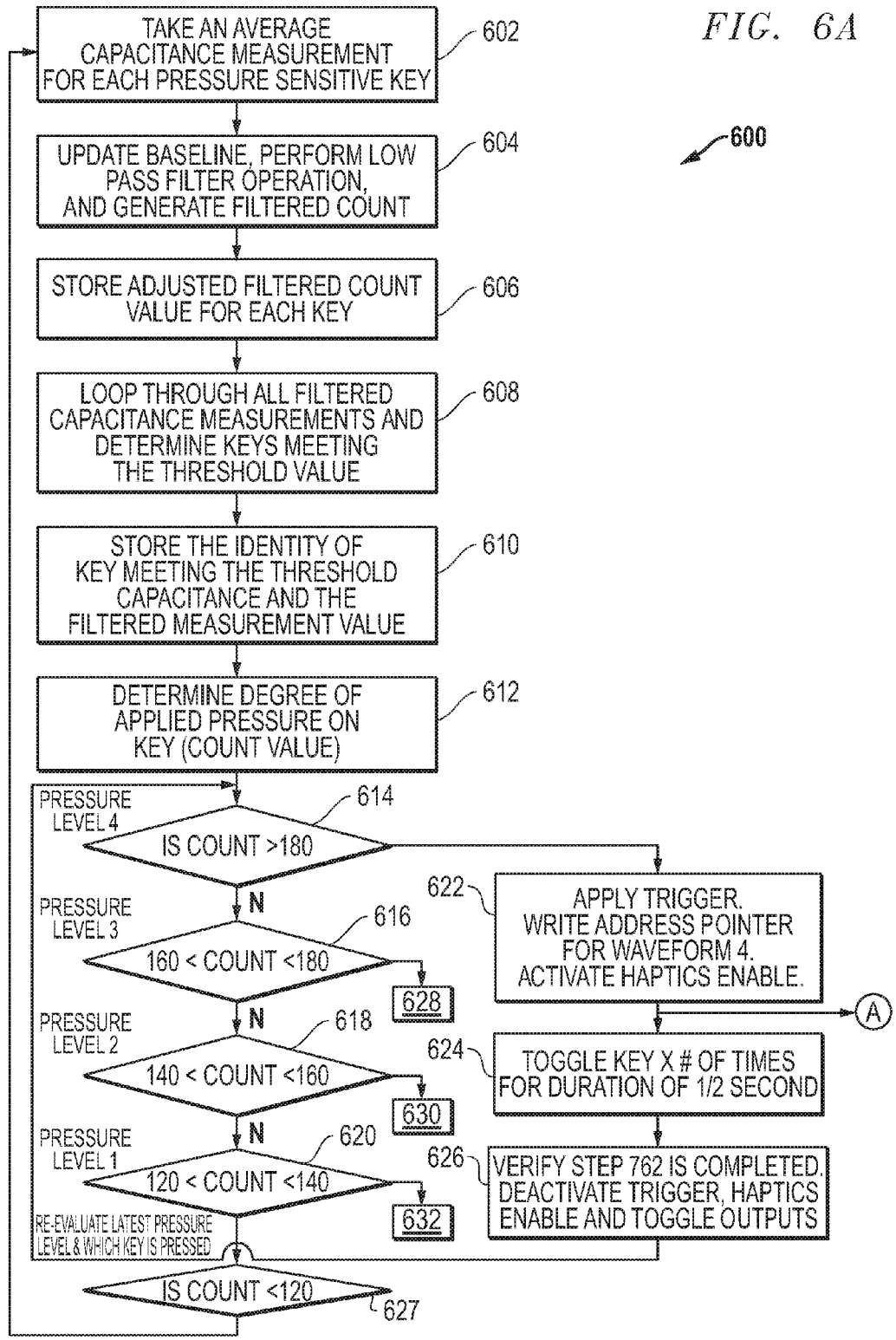
FIG. 6A illustrates a first portion of methodology for initialization of haptics control circuitry, sensing pressure applied to keys, producing a toggled digital signal representative thereof, and inducing haptics motion in a pressed key according to one exemplary embodiment of the disclosed systems and methods.

FIG. 6A illustrates methodology 600 for sensing, in real time, pressure applied to analog keys 104, and producing a toggled (alternating open/short) digital signal 133 representative thereof. FIG. 6A starts in step 602 by taking an averaged capacitance measurement for each pressure sensitive key 104 from signals 131 based on timer counts in a round robin manner as previously described. This may be done by actually taking multiple (e.g., two) measurements at a given pad. If these multiple measurements are conducted in quick succession, the average behaves like a differential measurement, thus helping filter out common-mode noise. Next, in step 604, the baseline count may be evaluated and updated per pad, as per the rules described above, and run through the low pass filter to generate a filtered count output (also called the adjusted capacitance measurement). In step 606, the present adjusted capacitance measurement value for each key 104 is then stored, e.g., in memory of pressure-sensing digital output circuitry 190. Next, in step 608, all the stored present adjusted capacitance values are examined to determine key(s) 104 having a present value of adjusted capacitance that exceeds a pre-determined adjusted capacitance threshold (this is the currently pressed key(s) 104). Then in step 610 the present identity (e.g., key number) of each of the key(s) 104 meeting the threshold adjusted capacitance value is stored along with corresponding present capacitance value(s). Alternatively, the key 104 being currently pressed may be identified as the key 104 having the largest adjusted capacitance measurement of all keys 104 in the current round robin cycle, i.e., rather than using the adjusted capacitance threshold value to determine pressed keys.

Example code for executing steps 602-610 is as follows:

```
/* TAKE MEASUREMENT ON 4 CAPACITIVE PADS */
int scan_keys(void)
{
  int i;
  int margin;
  for (i = 0; i < NUM_LINES; i++)
  {
    /* take pad measurement and establish */
    margin = measure_key_capacitance(i) –
    key_line[i].base_capacitance;
    /* convert measurement to filtered value using a single pole IIR
    low pass
    filter */
    key_line[i].filtered += (margin – (key_line[i].filtered >> 4));
    /* KEY_LINE[I].FILTERED IS OUR "COUNT" WE WANT
    TO USE */
  }
  return 0;
}
/* FIGURE OUT WHICH KEY LINE IS PRESSED ON (IF ANY) */
int find_finger_position(void)
{
  int i;
  int min;
  int max;
  int max_pos;
  /* Find the minimum and maximum responses for all the 4 key lines */
  min = 32767;
  max = –32768;
  max_pos = –1;
  for (i = 0; i < NUM_LINES; i++)
  {
    if (key_line[i].filtered < min)
      min = key_line[i].filtered;
    if (key_line[i].filtered > max)
    {
      max = key_line[i].filtered;
      max_pos = i;
    }
  }
  /* If the maximum response isn't that big, there is no finger present. */
  if (max < 200)
  {
    P1OUT &= 0xCF; /* no key pressed = "00" (P1.5, P1.4) */
    P1DIR |= 0x30;
    return 0;
  }
  /*P1.5, P1.4 are the 2 bit output pins*/
  /* TRUTH TABLE BELOW FOR KEY PRESS */
  /* P1.5 P1.4
    0    0    NO KEY IS PRESSED
    1    0    P1.0 IS PRESSED
    1    1    P1.2 IS PRESSED
    0    1    P1.3 IS PRESSED
  */
  if (max_pos == 0)
  {
    P1OUT |= 0x20; /* P1.0 IS PRESSED = "10" */
    P1OUT &= 0xEF;
    P1DIR |= 0x30;
    return max;
  }
  if (max_pos == 2)
  {
    P1OUT |= 0x30; /* P1.2 IS PRESSED = "11" */
    P1DIR |= 0x30;
    return max;
  }
  if (max_pos == 3)
  {
    P1OUT &= 0xDF; /* P1.3 IS PRESSED = "01" */
    P1OUT |= 0x10;
    P1DIR |= 0x30;
    return max;
  }
  if (max_pos == 1)
  {
    P1OUT &= 0xCF; /* otherwise = "00" */
    P1DIR |= 0x30;
    return 0;
  }
  else
  {
    P1OUT &= 0xCF; /* otherwise = "00" */
    P1DIR |= 0x30;
    return 0;
  }
}
int pressed_key_pressure = 0;
void main(void)
{
  .
  .
  .
  /* INITIALIZE ALL PADS TO BE SCANNED TO GROUND */
  for (i = 0; i < NUM_LINES; i++)
    init_key(&key_line[i], &key_line_config[i]);
  TACTL = TASSEL_2 | MC_2; // | ID_3;
  /* Scan the keys 100 times, allowing plenty of time for the MCLK and
  board conditions to stablise */
  for (i = 0; i < 100; i++)
    scan_keys( );
  /* Establish base capacitance and filtered "count" per active pad */
  for (i = 0; i < NUM_LINES; i++)
  {
    key_line[i].base_capacitance = key_line[i].filtered >> 4;
    key_line[i].filtered = 0;
  }
  for (;;)
  {
    scan_keys( );
    if ((pressed_key_pressure = find_finger_position( )) > 0)
    {
      /* There is a finger on the pad */
      send_to_host(pressed_key_pressure);
    }
    else
    {
      /* There is no finger on the pad */
      send_to_host(0);
    }
  }
}
```

Still referring to FIG. 6A, the degree of applied pressure to a presently-pressed key is next determined, e.g., in a binning operation by comparing the filtered count value to a pre-determined scale of counts per resolution in step 612 based on the stored adjusted capacitance value (or filtered count value) of step 610.

For example, in one exemplary embodiment, four levels of different toggle output resolution (i.e., alternating toggle rate frequency) may be pre-defined for measured timer counts of a pressed key 104. As an example, a maximum toggle rate may be defined to correspond to a maximum timer count level of 200 with four decreasingly lower toggle rate levels defined for timer counts of 180, 160, 140 and 120, and anything less than or equal to 120 being disregarded as noise, e.g., toggle rate frequency of 20 times/second for timer count range of anything greater than 180 up to 200, toggle rate frequency of 16 times/second for timer count range of anything greater than 160 up to 180, toggle rate frequency of 10 times/second for timer count range of anything greater than 140 up to 160, toggle rate frequency of 8 times/second for timer count range of anything greater than 120 up to 140, and no toggling for timer count range of less than or equal to 120. This example toggle output scheme may be expressed as follows:

pressure level 4: count>180
pressure level 3: 160<count<=180
pressure level 2: 140<count<=160
pressure level 1: 120<count<=140
pressure level 0 (do nothing): anything else However, it will be understood that this particular number of timer count levels and corresponding timer count values is exemplary only and that greater or fewer numbers of timer count levels and/or different timer count values may be employed in other embodiments.

Following is example code for the four timer count level embodiment described above:

```
if (count > 180)
    for (num_toggles = 20; num_toggles >0 ; num_toggles--)
    {
        P2OUT ^= 0x02;      /*Toggle P2.1 low 10 times in 1 sec */
        /* loop provides delay of 0.05 sec/.000017922 sec = 2789 loops */
        for (loop=2789; loop>0; loop - -);
    }
else if ((count > 160) && (count <= 180))
    for (num_toggles=16; num_toggles>0; num_toggles - -)
    {
        P2OUT ^= 0x02;      /*Toggle P2.1 low 8 times in 1 sec */
        /* loop provides delay of 0.0625 sec/.000017922 sec =
        3487 loops */
        for (loop=3487; loop>0; loop - -);
    }
else if ((count > 140) && (count <= 160))
    for (num_toggles=10; num_toggles>0; num_toggles - -)
    {
        P2OUT ^= 0x02;      /*Toggle P2.1 low 5 times in 1 sec */
        /* loop provides delay of 0.1 sec/.000017922 sec = 5579 loops */
        for (loop=5579; loop>0; loop - -);
    }
else if ((count > 120) && (count <= 140))
    for (num_toggles=4; num_toggles>0; num_toggles - -)
    {
        P2OUT ^= 0x02;      /*Toggle P2.1 low 2 times in 1 sec */
        /*loop provides delay of 0.25 sec/.000017922 sec =13949 loops */
        for (loop=13949; loop>0; loop - -);
    }
else
    {
        / * DO NOTHING. KEY IS NOT PRESSED ON */
    }
```

It will be understood that step 610 described above is optional and only may be employed when the number of analog keys 104 exceeds the number of output lines 133. Alternatively, methodology 600 may: pause the round robin measurements whenever a pressed key 104 is identified as exceeding the threshold adjusted capacitance value, determine the degree of applied pressure to pressed key 104 based on its capacitance, and toggle the output signal of the pressed key 104. The count value of the identified pressed key 104 may be monitored and reevaluated for as long as it remains pressed by reevaluating the pressed key's timer count by rerunning it through the binning operation to see if the pressure is changed, and outputting an updated digital bit stream signal 133 based thereon. Once it is determined that the identified key 104 is no longer being pressed, then the round robin procedure may resume to the next key 104 and inquire of its count value for this round robin cycle. Either way, the round robin cycle continues for as long as the keyboard system 100 is powered up. After shut down, the pressure-sensing digital output circuitry 190 may be reset on next power up, all keys reinitialized (e.g., per FIG. 5), and the round robin key capacitance measurement routine initialized again.

In steps 614 to 620 of methodology 600, the haptics vibration waveform and toggle rate is selected based on the determined key pressure of step 612 which is sensed by pressure-sensing digital output circuitry 190 based on the key capacitance value (e.g., each variable pressure key 104 generates a variable capacitance with the capacitance value increasing as a user applies greater finger pressure to the key 104). As described elsewhere herein, pressure-sensing digital output circuitry 190 generates a digital count value that increases with increased capacitance, and a value that identifies which key 104 is currently being pressed. Thus, at the start of the binning operation, the digital count and the pressed key identifier values are known.

Once the pressed key identifier value has been processed, the digital count value is then sorted in steps 614 to 620 of FIG. 6A to determine the amount of pressure applied (e.g., on a scale of 1 to 10, 1 to 4, or any other acceptable or selected range of pressure resolution that has been programmed). In one exemplary embodiment, this pressure resolution value range may be programmable by the user using a software graphical user interface (GUI) utility. In the exemplary embodiment of FIG. 6A, methodology for a pressure scale of 1 to 4 is illustrated, where pressure level 1 is associated with light finger pressure and pressure level 4 is associated with max finger pressure. A digital count value of less than 120 is taken to indicate that the respective key 104 has not been pressed hard enough to make an electrical "make" connection, while a digital count value greater than 180 indicates maximum finger pressure has been applied to the respective key 104. The separate pressure levels of 1, 2, 3 and 4 are defined in this embodiment by four equal 25% increments between the minimum and maximum pressure levels to define four levels of finger pressure, it being understood that equal increments are not required.

Still referring to FIG. 6A, if the measured timer counts of a pressed key 104 is determined to exceed 180 in step 614, then methodology 600 proceeds to step 622 where pressure-sensing digital output circuitry 190 applies a falling edge trigger and writes to haptics controller 162 an address pointer corresponding to the appropriate haptics vibration waveform (e.g. "waveform 4"), previously stored in RAM 430 upon power-up, corresponding to pressure level 4, on Haptics Trigger output signal 145 for respective pressed key 104. Also in step 622, the pressure-sensing digital output circuitry 190 enables the respective Key Haptics Enable output signal to turn on the respective output MOSFET 464 to enable vibration on the respective piezo transducer 160 for the analog key 104 that's being pressed on. In such an example, methodology 600 then proceeds to step 624 where a low active toggle output 133 of pressure-sensing digital output circuitry 190 is toggled that corresponds to the identity of the presently-pressed key (e.g., output P2.1 is toggled for corresponding input P1.1). This toggled signal mimics or emulates the action of a user repeatedly pressing a conventional digital key 106 for a number of times that is proportional or otherwise relative to the strength of the desired input (i.e. greater pressure on analog key 104 corresponds to more rapid user repeat rate on digital key 106). Thereafter, once the Haptics controller 162 notifies the Pressure Sensing & Binning Controller 190 that it's done outputting the vibration waveform from RAM, controller 190 deactivates the Haptics Trigger output 145, the respective Key Haptics Enable output 462, and the Toggle output 133. This assures no possible race condition or condition where controller 190 is accidentally deactivating vibration activity to the key prematurely. Controller 190 then resamples the latest key pressure level and identity of currently-pressed key output at step 612 and re-evaluates the degree of pressure applied again in steps 614 to 620.

If the measured timer counts of a pressed key 104 is determined not to exceed 180 in step 614, then methodology 600 proceeds to step 616 where pressure-sensing digital output circuitry 190 determines if the number of measured timer counts of pressed key 104 is between 160 and 180. If so, then methodology 600 proceeds to step 628 where circuitry 190 generates a falling edge trigger for haptics controller 162 and also writes to haptics controller 162 on Haptics Trigger output 145 an address pointer corresponding to the appropriate haptics vibration waveform (e.g. "waveform 3"), previously stored in RAM 430 upon power-up, corresponding to pressure level 3 for this count range, enables the respective Key Haptics Enable output 462, and toggles low active output 133 of pressure-sensing digital output circuitry 190 to the identity of the presently-pressed key using a toggle signal that is proportional or otherwise relative to the strength of the desired input before resetting toggle line 133 and repeating back to step 614 in a manner similar to steps 622 to 626. A similar methodology is implemented by each of steps 618/630 and 620/632 for respective measured timer count ranges of greater than 140 up to 160 and greater than 120 up to 140, corresponding to pressure levels 2 and 1 as shown. If measured timer count is less than 120 (interpreted in this embodiment as being no applied pressure) in step 627 then methodology 600 returns to step 602 as shown.

Figure 6B:
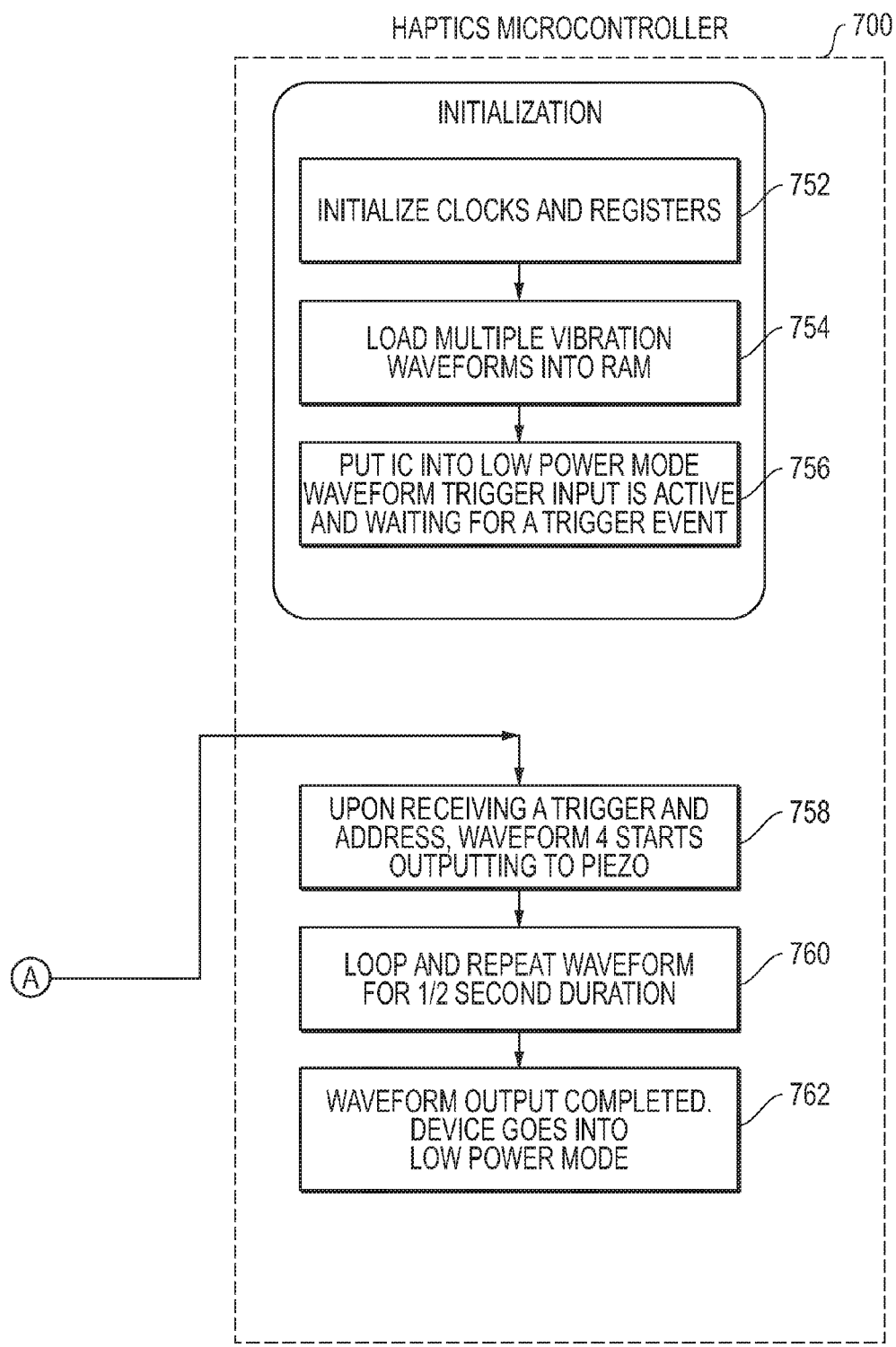
FIG. 6B illustrates a second portion of methodology for initialization of haptics control circuitry, sensing pressure applied to keys, producing a toggled digital signal representative thereof, and inducing haptics motion in a pressed key according to one exemplary embodiment of the disclosed systems and methods.
Figure 7:
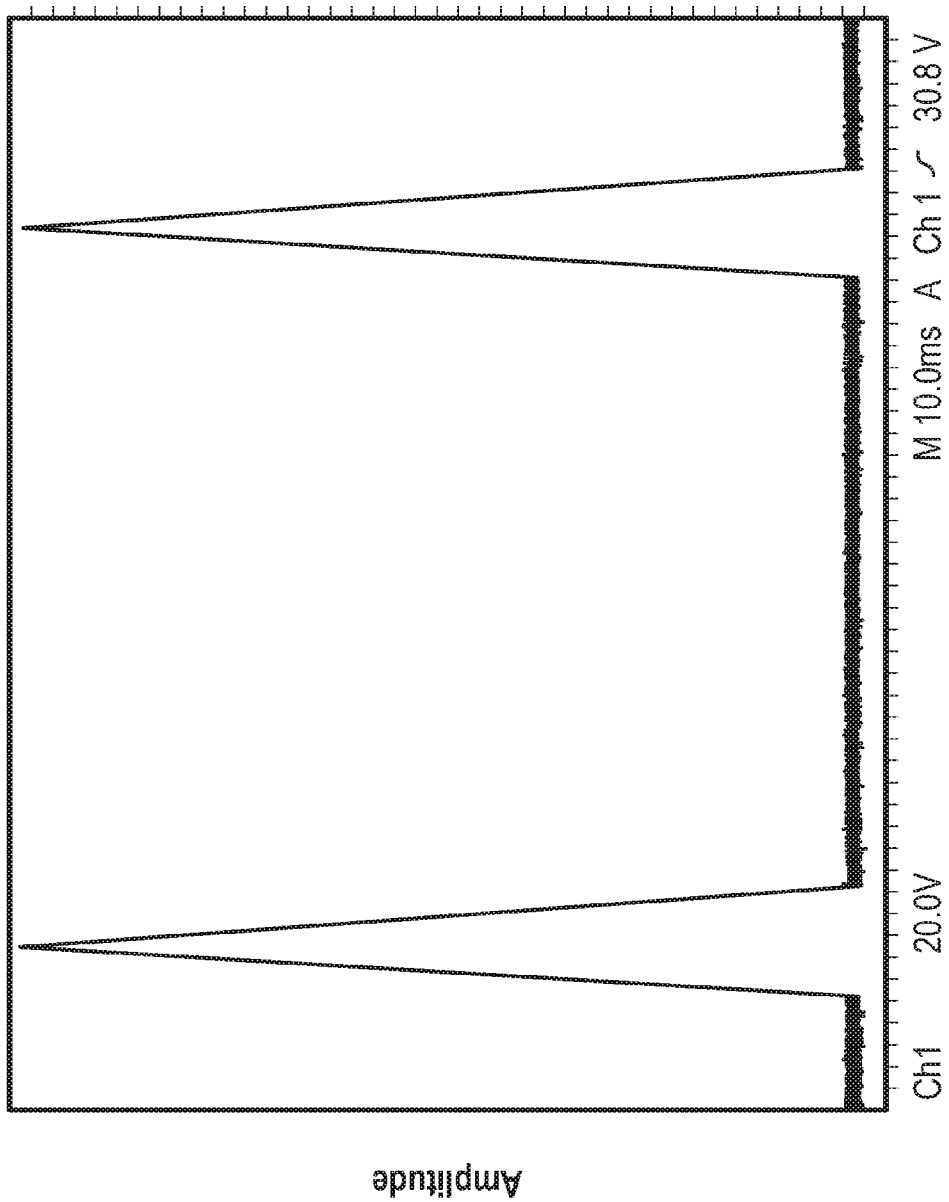
FIG. 7 illustrates a haptics vibration waveform according to one exemplary embodiment of the disclosed systems and methods.
Figure 8:
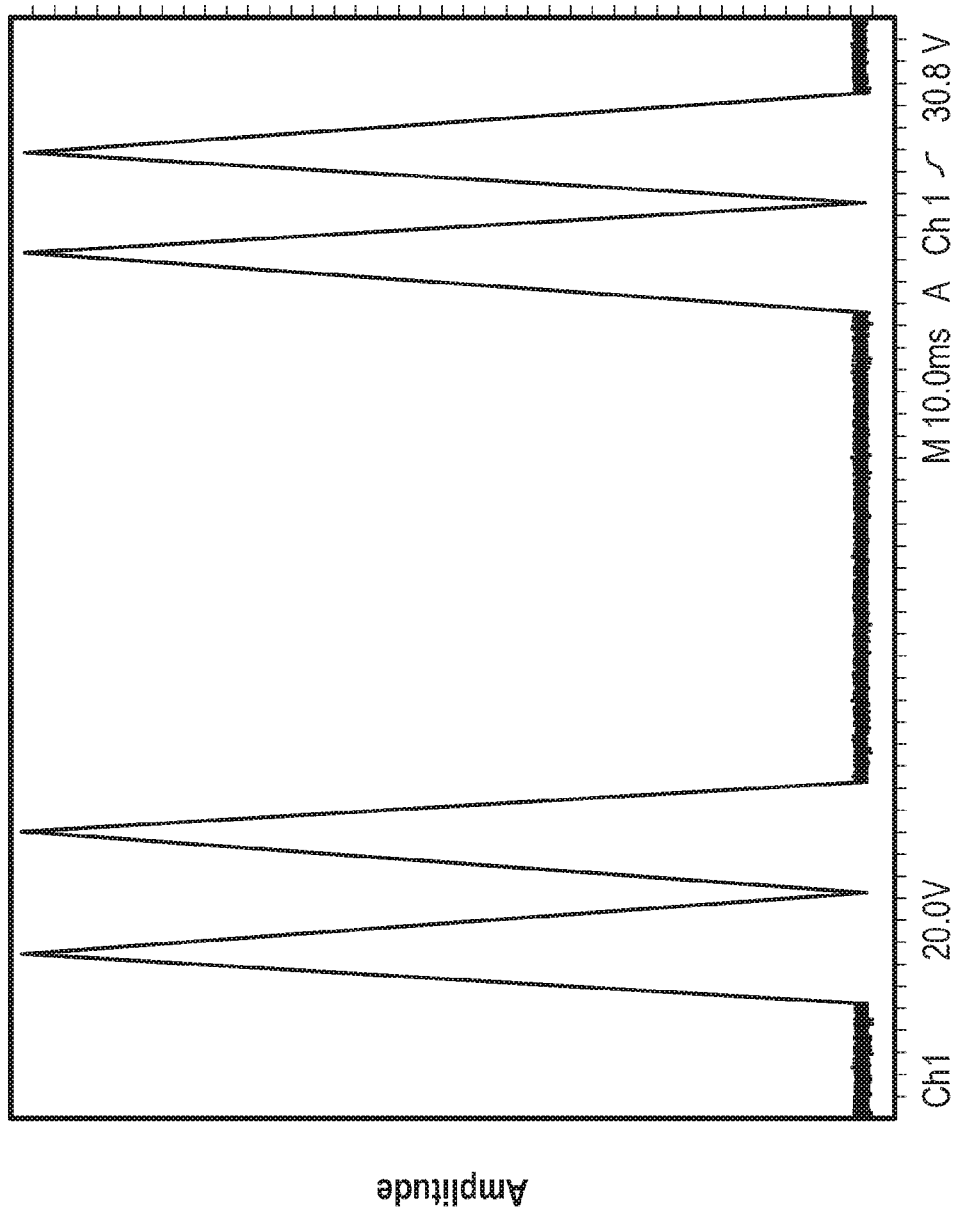
FIG. 8 illustrates a haptics vibration waveform according to one exemplary embodiment of the disclosed systems and methods.
Figure 9:
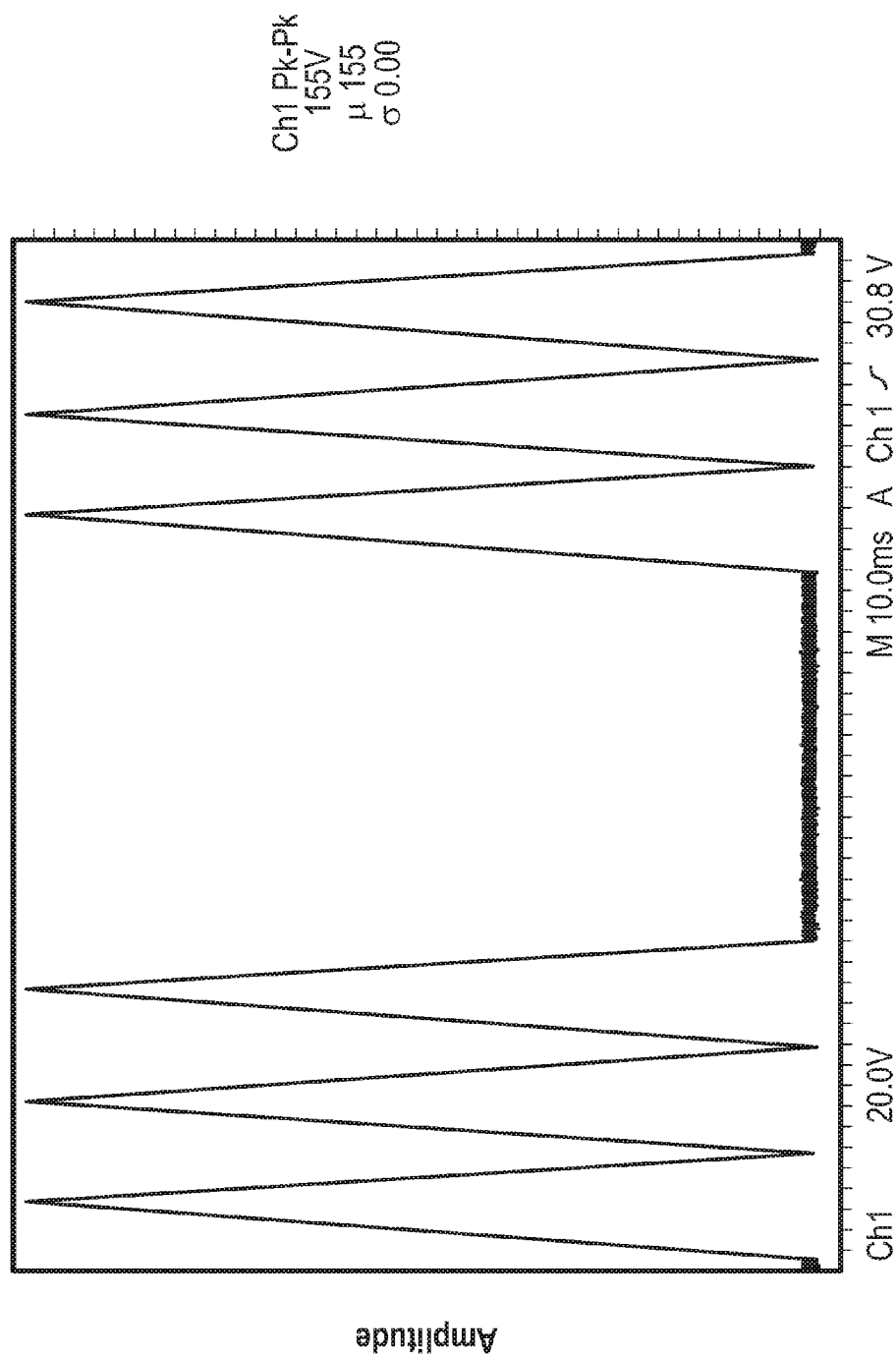
FIG. 9 illustrates a haptics vibration waveform according to one exemplary embodiment of the disclosed systems and methods.
Figure 10:
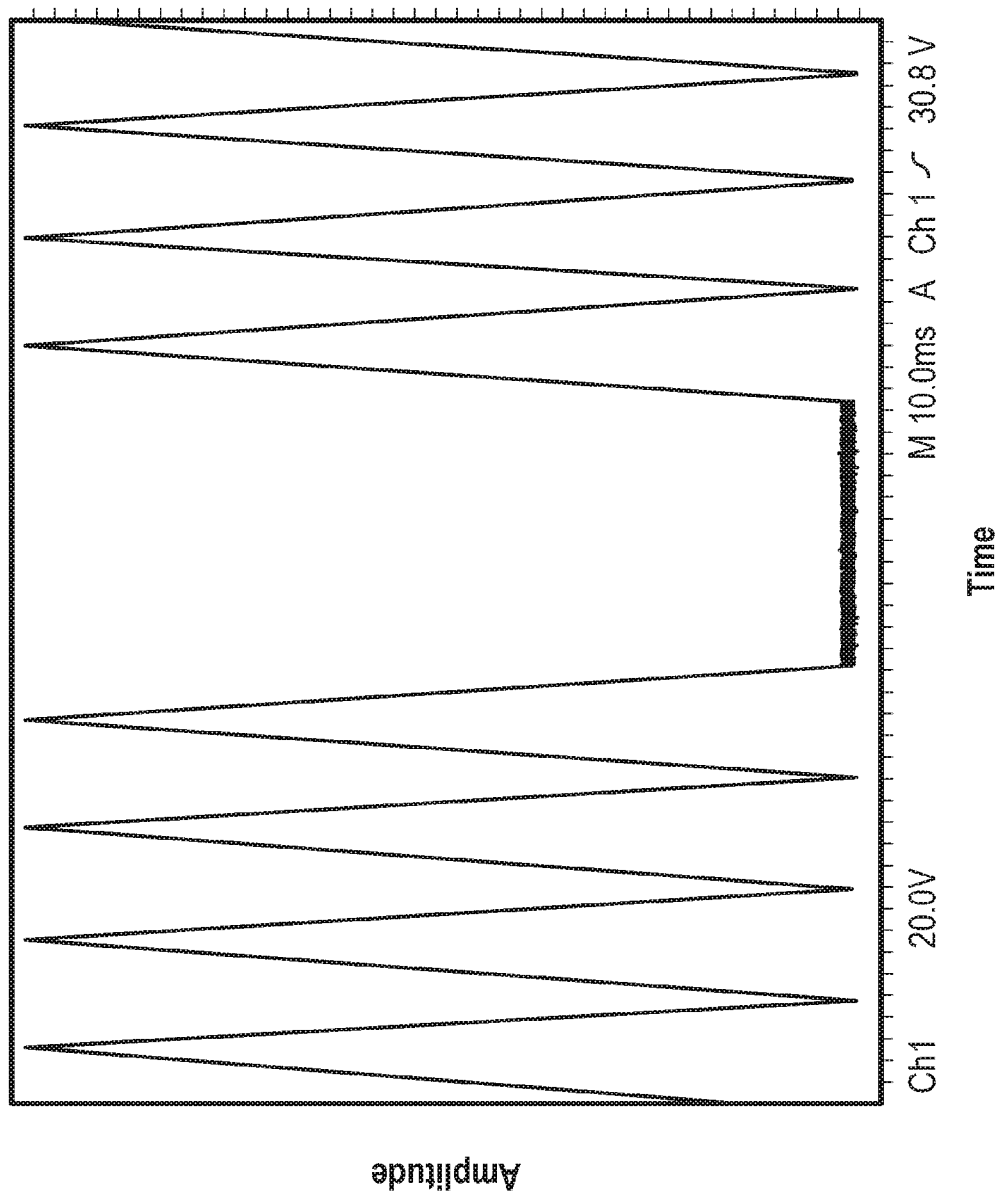
FIG. 10 illustrates a haptics vibration waveform according to one exemplary embodiment of the disclosed systems and methods.

FIG. 6B also illustrates exemplary methodology 700 that may be implemented, for example, by haptics controller 162. As shown in FIG. 6B, haptics controller 162 is first initialized in steps 752 to 756, at the same time that clocks, resets and registers of pressure-sensing digital output circuitry 190 are initialized. These initialization actions for both controllers 190 and 162 may occur upon power up of the system. In the case of FIG. 6B, clocks and registers of haptics controller 162 are initialized in step 752. In the haptics controller 162, these registers are used to control waveform shape, period, and playback attributes such as looping the waveform for a particular time duration. Then multiple haptics vibration waveforms (e.g., 16 waveforms in the case of Maxim MAX11835 Rev. 2 chip) are loaded into memory (e.g., RAM 430) of haptics controller in step 754, prior to putting the controller circuitry into low power mode in step 756. During this low power mode, a waveform trigger input of haptics controller 162 is active (awake) and waiting for a suitable trigger event (e.g., falling edge trigger event) from pressure-sensing digital output circuitry 190 on Haptics Trigger output signal 145.

Next, haptics controller 162 begins steps 758 to 762. In step 758, haptics controller receives a falling edge trigger and waveform address from Haptics Trigger output signal 145 from step 622 of pressure-sensing digital output circuitry 190. The falling edge trigger, along with some preset registers in the haptics controller, notifies the haptics controller 162 that it needs to grab a particular vibration waveform from RAM that corresponds to the pressure level determined in step 612, and output the waveform (e.g., waveform 4) to the flyback circuit 420 which is then outputted with a high voltage to the piezo transducer 260. The output of step 622 ensures that the Key Haptics Enable signal 462 is active which activates output MOSFET 464 to ensure the respective piezo transducer 260 receives the high voltage output signal 147 from the flyback circuit 420. In one exemplary embodiment, the waveform stored in RAM may last about 45 milliseconds. In such a case, in step 760, the selected waveform is looped and repeated for a selected duration (e.g., for about 0.5 seconds). It will be understood that this duration may be smaller or larger as the user chooses. In one exemplary embodiment, the vibration waveform loop/repeat time duration in Step 760 may be selected to be smaller than that of the toggling time duration in step 624 in order to prevent a possible race condition. In this regard, it is desirable that that step 762 is met (vibration completed) before step 626 takes effect in order to ensure that the vibration and MOSFET selection switch does not turn off prematurely.

Step 762 occurs at a stage where the waveform output of 0.5 second duration has been completed. In step 762, the Haptics Controller 162 enters a low power or sleep mode, and waits for the next trigger from step 622. In parallel, step 626 verifies that step 762 is completed and has the pressure sensing controller deactivate (or reset) the Haptics Trigger output 145, the Key Haptics Enable 462 and the Toggle output 133. Methodology 700 then returns to step 758 where the next falling edge trigger and waveform address pointer is received from pressure-sensing digital output circuitry 190. Thus, in this exemplary embodiment, both the haptics vibration and key toggling occur for a particular finger pressure for a period of 0.5 second before the keys are resampled, evaluated, and the count and pressure level are redetermined before changing to a new vibration and toggling to occur in the next 0.5 seconds. Again, the period may be reduced to something less than 0.5 seconds to be more responsive (less latency) to changes in finger pressure on the analog key 104.

Thus, FIGS. 6A and 6B illustrate how two actions may be performed in parallel once a key pressure level match is made by pressure-sensing digital output circuitry 190. The first action is that the haptics vibration waveform is output from pressure-sensing digital output circuitry 190 to the haptics circuitry 260 (e.g., piezo transducer) coupled to (e.g., mounted under) the pressed key at a vibration intensity that corresponds to the pressure level. This is accomplished by sending a falling edge trigger to the haptics controller 162 to wake it up from sleep, and by writing the waveform address for the given pressure level to the haptics controller 162. Then the applicable output MOSFET 464 is activated so the applicable piezo transducer 260 can receive the waveform in order to vibrate. The haptics controller 162 immediately outputs the waveform to the haptics circuitry 260, e.g., continuously for ½ seconds or any other selected suitable duration. Once the duration of the haptics vibration waveform output is completed, the haptics controller 162 goes back to low power mode, and the pressure-sensing digital output circuitry 190 resets the trigger line, the key haptics enable line and the toggle line so the haptics controller 162 is ready to receive the next falling edge trigger event.

The waveform address write operation may be performed using any suitable methodology, including using I2C bus signals. However, in one exemplary embodiment, the address write may be performed in as few clock cycles as possible to reduce the latency from the applied finger pressure to the resulting key vibration. For example, where a Maxim MAX11835 Rev. 2 chip is employed as haptics controller 162, a feature of this chip called "multi-wave" mode may be utilized to directly write the 4 bit waveform address serially from the pressure-sensing digital output circuitry 190 to the haptics controller chip in a fraction of the time required by I2C bus communications.

The second action performed in parallel is that circuitry associated with the pressed key 104 is electronically toggled at a rate that corresponds to the pressure level applied to the pressed key 104. In one embodiment, once the waveform address has been written to the haptics controller 162, the pressed key's signal line 133 is toggled at a rate corresponding to the particular pressure level. In this way, key toggling action and its respective key vibration action operate in parallel to provide a user the feeling that both are operating in synchronization with each other. At the completion of the key toggling action, the falling edge trigger signal, the output MOSFET enable line 462 and toggle line 133 are set to an inactive state. The latest digital count and key identifier values from the pressure-sensing digital output circuitry 190 are then re-sampled to determine if there have been any changes in key pressure status and if so, to execute vibration and toggling actions based on the updated key pressure status. The resulting effect is that the vibration intensity of a given key 104 and its corresponding key toggling speed will vary according to real-time applied finger pressure to the particular key 104.

It will be understood that methodologies 600 and 700 of FIGS. 6A and 6B are exemplary only, and that methodologies employing additional, fewer, and/or alternative steps may be employed that are suitable for implementing one or more of the features described herein.

EXAMPLE

The following example represent illustrative and exemplary piezo input (haptics vibration waveforms) that may be sent to the piezo transducer(s)to provide a progressive increase in intensity as a user presses harder on a variable pressure sensitive key, it being understood that alternative piezo input waveforms, and/or number of separate waveforms, may be employed.

The waveforms of this example may be used with a variable pressure keyboard supporting four levels of sensitivity. In this example, each key pressure level has a unique toggle output as well as a unique piezo vibration waveform. Four vibration waveforms are provided, one for each pressure level, to vibrate a pressed key progressively from a light vibration to a rough/intense vibration.

FIGS. 7-10 illustrate the four different haptics vibration waveforms of this example. The shape, amplitude, and period of each waveform are stored in RAM memory 430 of a MAX11835 haptics controller chip. Firmware implementing methodologies 600 and 700 described elsewhere herein is used to sense what key pressure level is currently in effect, to select the appropriate vibration waveform for that pressure level, and to start outputting the waveform while in parallel outputting the key toggling signal. The four illustrated vibration waveforms provide a progressive increase in vibration intensity felt starting with FIG. 7 and increasing to FIG. 10.

A commonality may be seen with respect to the four waveforms of this example: their period is always 64 ms, the sawtooth pulse lasts 10 msec, and the amplitude of the sawtooth pulse remains the same regardless of intensity level. What varies is how many sawtooth pulses are outputted within the 64 ms window. As the number of sawtooth pulses outputting in rapid succession is increased, the intensity of the vibration increases.

It will be understood that one or more of the tasks, functions, or methodologies described herein may be implemented, for example, as firmware or other computer program of instructions embodied in a non-transitory tangible computer readable medium that is executed by a CPU, controller, microcontroller, processor, microprocessor, FPGA, ASIC, or other suitable processing device.

Further modifications and alternative embodiments of the techniques described herein will be apparent to those skilled in the art in view of this description. It will be recognized, therefore, that the techniques described herein are not limited by these example arrangements. Accordingly, this description is to be construed as illustrative only and is for the purpose of teaching those skilled in the art the manner of carrying out the techniques described herein. It is to be understood that the forms of the techniques described herein shown and described are to be taken as the presently preferred embodiments. Various changes may be made in the implementations and architectures. For example, equivalent elements may be substituted for those illustrated and described herein and certain features of the techniques described herein may be utilized independently of the use of other features, all as would be apparent to one skilled in the art after having the benefit of this description of the techniques.

The invention claimed is:

1. A keyboard system, comprising:
one or more pressure sensitive keys configured to provide analog output signals corresponding to each given one of the pressure sensitive keys that is representative of the level of pressure applied to the given key during a key pressure application event of a given applied pressure level;
a first controller configured as pressure sensing interface circuitry comprising at least one signal input, at least one first signal output, and at least one second signal output, the signal input being separate and different from the first signal path output and the second signal path output, the first signal path output being different from the signal input and the second signal output, and the second signal path output being different from the signal input and the first signal output;
where the signal input is coupled to receive the analog output signal from each given one of the pressure sensitive keys via at least one dedicated input signal path;
where the pressure-sensing interface circuitry is configured to simultaneously provide both haptics key pressure indication signals at the first signal path output to at least one first separate dedicated output signal path and separate digital key emulation key pressure indication signals at the separate second signal output to at least one second separate dedicated output signal path and responsive to each of the same analog output signals received at the signal input from a given one of the pressure sensitive keys that corresponds to a given key pressure application event applied to the corresponding same given one of the pressure sensitive keys, the haptics key pressure indication signals and separate digital key emulation key pressure indication signals both being representative of at least two respective different levels of pressure applied to the corresponding given one of the pressure sensitive keys, the at least two different levels of pressure comprising at least first and second different levels of pressure; and
a second controller different from the first controller, the second controller being configured as haptics control circuitry coupled and configured to impart a variable haptics motion characteristic independently to each given one of the pressure sensitive keys in response to each given key pressure application event based at least in part on the haptics key pressure indication signals provided by the pressure sensing interface circuitry across the first separate dedicated output signal path and corresponding to the pressure level applied to the corresponding given one of the pressure sensitive keys during each given key pressure application event such that a first haptics motion is imparted to a given one of the pressure sensitive keys at the first pressure level applied during a first key pressure application event to the given one of the pressure sensitive keys that is different than a second haptics motion that is imparted to the given one of the pressure sensitive keys at the second pressure level applied during a second and different key pressure application event to the given one of the pressure sensitive keys; and where the pressure sensing interface circuitry is coupled to provide the haptics key pressure indication signals across the first separate dedicated output signal path and to the haptics control circuitry in response to the given key pressure application events; arid where the second signal output of the pressure sensing interface circuitry is configured for coupling by the second separate dedicated output signal path to provide a digital key emulation key pressure indication signal corresponding to a given key pressure application event to a third controller configured as a keyboard controller coupled to a separate host system device and that is separate and different from the controllers of the haptics control circuitry and the pressure sensing interface circuitry at the same time that the first signal output of the pressure sensing interface circuitry provides a separate haptics key pressure indication signal corresponding to the same given key pressure application event across the first separate dedicated output signal path to the haptics control circuitry;

where each of the respective digital key emulation key pressure indication signals is a separate intermittent alternating open and short (open/short) digital output signal having an alternating toggling frequency that is representative of pressure applied to the corresponding given one of the pressure sensitive keys to emulate toggling of a momentary on/off digital key by a user at the alternating toggling frequency during the duration of a given key pressure application event of a given applied pressure level without requiring a user to toggle the pressure sensitive key; and where the pressure sensing interface circuitry is configured for coupling to provide each digital key emulation key pressure indication signal as a separate alternating open/short digital output signal corresponding to each pressure sensitive key to column/row intersections of a legacy keyboard key matrix when the legacy keyboard matrix is operably coupled to a legacy digital keyboard controller having no analog input circuitry and when the legacy digital keyboard controller is itself coupled between the pressure sensing interface circuitry and a separate host system device to measure keyboard input for the host device based on received momentary-on digital signals and not based on received analog signals.

2. The keyboard system of claim 1, further comprising:

haptics actuation circuitry coupled to the haptics control circuitry;

where the haptics control circuitry is separate from the keyboard controller and the pressure sensing interface circuitry, the haptics control circuitry being coupled to receive from the pressure sensing interface circuitry a respective haptics key pressure indication signal representative of pressure applied to each corresponding given one of the pressure sensitive keys during each key pressure application event, the haptics control circuitry being configured to in turn provide a separate haptics control signal corresponding to each given one of the pressure sensitive keys based upon each respective haptics key pressure indication signal received during each corresponding key pressure application event; and where the haptics actuation circuitry is coupled to receive from the haptics control circuitry the separate haptics control signal corresponding to each given one of the pressure sensitive keys, the haptics actuation circuitry being configured to impart haptics motion independently to each given one of the pressure sensitive keys in response to a received haptics control signal corresponding to the given one of the pressure sensitive keys.

3. The keyboard system of claim 2, and where the pressure sensing interface circuitry is further configured to provide to the haptics control circuitry a haptics key pressure indication signal corresponding to each given one of the pressure sensitive keys as a bit stream that is representative of the pressure being applied to the corresponding given one of the pressure sensitive keys during the duration of a given key pressure application event and at the same time that the pressure sensing interface circuitry provides to a keyboard controller that is separate from the haptics control circuitry a digital key emulation key pressure indication signal during the duration of the same given key pressure application event.

4. The keyboard system of claim 3, further comprising a keyboard device body that includes the pressure sensing interface circuitry, the haptics control circuitry and the haptics actuation circuitry; wherein the keyboard device body is configured to be mechanically coupled as a drop-in keyboard to an information handling system chassis that includes the legacy keyboard controller.

5. The keyboard system of claim 4, wherein the information handling system comprises a notebook computer.

6. The keyboard system of claim 1, further comprising a keyboard device body that includes the one or more pressure sensitive keys and a plurality of digital keys within the keyboard device body, each of the digital keys being coupled to provide a single open/short digital output signal each time the digital key is pressed by a user.

7. The keyboard system of claim 2, wherein the haptics control signal corresponding to each given one of the pressure sensitive keys is a vibration waveform having at least one of a vibration intensity or frequency corresponding to the pressure level being applied in real time to the corresponding given one of the pressure sensitive keys.

8. The keyboard system of claim 7, further comprising memory having multiple vibration waveforms stored therein that are selected to correspond to different pressure force levels applied to the pressure level being applied in real time to the corresponding given one of the pressure sensitive keys; wherein the haptics control circuitry is configured to respond to receipt of a haptics key pressure indication signal provided by the pressure sensing interface circuitry that is representative of the level of pressure being applied to the corresponding given one of the pressure sensitive keys by retrieving from memory the selected vibration waveform corresponding to the pressure level being applied in real time to the corresponding given one of the pressure sensitive keys, and to provide the selected vibration waveform as the separate haptics control signal to the haptics actuation circuitry; and wherein the haptics actuation circuitry is configured to impart haptics motion according to the selected vibration waveform independently to the corresponding given one of the pressure sensitive keys being pressed.

9. The keyboard system of claim 8, wherein the haptics key pressure indication signal provided by the pressure sensing interface circuitry to the haptics control circuitry includes the selected waveform memory address that corresponds to the selected vibration waveform corresponding to the pressure level being applied in real time to the corresponding given one of the pressure sensitive keys.

10. The keyboard system of claim 2, comprising a plurality of pressure sensitive keys that are each configured to provide to the pressure sensing interface circuitry a respective separate analog output signal representative of the level of pressure being applied to the given pressure sensitive key; where the pressure sensing interface circuitry is configured to provide separate respective haptics key pressure indication signals to the haptics control circuitry that are representative of at least two different levels of pressure applied to each individual one of the pressure sensitive keys, the at least two different levels of pressure comprising at least first and second different levels of pressure; where the haptics control circuitry is configured to provide to the haptics actuation circuitry a separate respective haptics control signal corresponding to each given one of the pressure sensitive keys based upon each respective received haptics key pressure indication signal; and where the haptics actuation circuitry is configured to separately and independently impart haptics motion to each of the plurality of pressure sensitive keys with a variable haptics motion characteristic based on the applied key pressure level and based on the identity of the received haptics control signal corresponding to each given one of the pressure sensitive keys such that a first haptics motion is imparted to each given one of the pressure sensitive keys at the first pressure level applied to the given one of the plurality of pressure sensitive keys that is different than a second haptics motion that is imparted to the given one of the plurality of pressure sensitive keys at the second pressure level applied to the given one of the plurality of pressure sensitive keys.

11. The keyboard system of claim 1, wherein the haptics control circuitry is configured to impart a variable haptics motion characteristic independently to each given one of the pressure sensitive keys in response to haptics key pressure indication signals that are representative of the at least first and second different levels of pressure applied in real time to the corresponding given one of the pressure sensitive keys, the haptics motion imparted to each given one of the pressure sensitive keys in response to a haptics key pressure indication signal corresponding to the first level of pressure applied to the corresponding given one of the pressure sensitive keys being different than the haptics motion imparted to each given one of the pressure sensitive keys in response to a haptics key pressure indication signal corresponding to the second level of pressure applied to the corresponding given one of the pressure sensitive keys.

12. The keyboard system of claim 2, wherein the haptics actuation circuitry comprises a piezo transducer.

13. The keyboard system of claim 1, where the analog output signal provided to the signal path input of the pressure sensing interface circuitry comprises an individual discharge of a capacitive plate of each given analog key; where the separate digital key emulation key pressure indication signals provided at the separate second signal output comprise a stream of opens/shorts corresponding to each given analog key; and where the haptics key pressure indication signals provided at the first signal output comprise a falling edge trigger event.

14. The keyboard system of claim 1, where each given one of the pressure sensitive keys comprises a keycap and separate haptics actuation circuitry, the separate haptics actuation circuitry for each given keycap comprising a separate piezo transducer coupled to separately vibrate the given keycap.

15. The keyboard system of claim 1, where the pressure sensing interface circuitry is a pressure sensing and binning controller.

16. A method of imparting haptics motion, comprising:
providing one or more pressure sensitive keys;
producing an analog output signal for each given one of the pressure sensitive keys when depressed during a key pressure application event of a given applied pressure level by a user, the analog output signals being representative of the level of pressure applied to the given pressure sensitive key by the user;
providing each of the analog output signals to at least one signal input of a first controller configured as pressure sensing interface circuitry; and
simultaneously providing both haptics key pressure indication signals from at least one first signal path output of the pressure sensing interface circuitry to at least one first separate dedicated output signal path and separate digital key emulation key pressure indication signals from at least one separate second signal output of the pressure sensing interface circuitry to at least one second dedicated output signal path in response to each of the same analog output signals received at the signal input from a given one of the pressure sensitive keys that corresponds to a given key pressure application event applied to the corresponding same given one of the pressure sensitive keys, each haptics key pressure indication signal and its simultaneous separate digital key emulation key pressure indication signal both being based upon the same analog output signal and both the haptics key pressure indication signals and separate digital key emulation key pressure indication signals being representative of at least two respective different levels of pressure applied to the given pressure sensitive key by the user, the at least two different levels of pressure comprising at least first and second different levels of pressure;
imparting a variable haptics motion characteristic independently to each given one of the pressure sensitive keys in response to each given key pressure application event based at least in part on a haptics key pressure indication signal provided across the first separate dedicated output signal path and that is representative of pressure applied to the given pressure sensitive key by the user during each given key pressure application event such that a first haptics motion is imparted to the given one of the pressure sensitive keys at the first pressure level applied during a first key pressure application event to the given one of the pressure sensitive keys that is different than a second haptics motion that is imparted to the given one of the pressure sensitive keys at the second pressure level applied during a second and different key pressure application event to the given one of the pressure sensitive keys; and
providing a digital key emulation key pressure indication signal corresponding to a given key pressure application event from the second signal output to the second dedicated output signal path at the same time as providing a separate haptics key pressure indication signal corresponding to the same given key pressure application event to a second and different controller configured as haptics control circuitry from the first signal output to the first dedicated output signal path; and
providing each digital key emulation key pressure indication signal as a separate alternating open/short digital output signal corresponding to each pressure sensitive key to column/row intersections of a legacy keyboard key matrix;

where the signal path input is coupled to receive the analog output signal from each given one of the pressure sensitive keys via at least one dedicated input signal path;

where the pressure sensing interface circuitry is coupled to provide the haptics key pressure indication signals across the first separate dedicated output signal path and to the haptics control circuitry in response to the given key pressure application events; and where the second signal output of the pressure sensing interface circuitry is configured for coupling by the second separate dedicated output signal path to provide a digital key emulation key pressure indication signal corresponding to a given key pressure application event to a third controller configured as a keyboard controller that is separate from the controllers of the haptics control circuitry and the pressure sensing interface circuitry at the same time that the first signal output of the pressure sensing interface circuitry provides a separate haptics key pressure indication signal corresponding to the same given key pressure application event across the first separate dedicated output signal path to the haptics control circuitry;

where the signal input is separate and different from the first signal path output and the second signal path output, where the first signal path output is different from the signal input and the second signal output, and where the second signal path output is different from the signal input and the first signal output;

where each of the respective digital key emulation key pressure indication signals is a separate intermittent alternating open and short (open/short) digital output signal having an alternating toggling frequency that is representative of pressure applied to the corresponding given one of the pressure sensitive keys to emulate toggling of a momentary on/off digital key by a user at the alternating toggling frequency during the duration of a given key pressure application event of a given applied pressure level without requiring a user to toggle the pressure sensitive key; and where the pressure sensing interface circuitry is configured for coupling to provide each digital key emulation key pressure indication signal as a separate alternating open/short digital output signal corresponding to each pressure sensitive key to column/row intersections of a legacy keyboard key matrix when the legacy keyboard matrix is operably coupled to a legacy digital keyboard controller having no analog input circuitry; and where the legacy digital keyboard controller is itself coupled between the pressure sensing interface circuitry and a separate host system device to measure keyboard input for the host device based on received momentary-on digital signals and not based on received analog signals.

17. The method of claim 16, further comprising:
providing haptics control circuitry and haptics actuation circuitry;
providing pressure-sensing digital interface circuitry that is separate from the haptics control circuitry and haptics actuation circuitry;
receiving the analog output signal from each given one of the pressure sensitive keys in the pressure-sensing interface circuitry;
simultaneously providing both haptics key pressure indication signals and separate digital key emulation key pressure indication signals from the pressure-sensing interface circuitry, each of the separate haptics key pressure indication signals and digital key emulation key pressure indication signals being based upon the same common received analog output signal and being representative of at least two respective different levels of pressure applied to each given corresponding one of the pressure sensitive keys, the at least two different levels of pressure comprising at least first and second different levels of pressure;
receiving each of the separate haptics key pressure indication signals in the haptics control circuitry and providing a separate haptics control signal corresponding to each given one of the pressure sensitive keys based upon each respective received haptics key pressure indication signal;
receiving each separate haptics control signal in the haptics actuation circuitry, and imparting a variable haptics motion characteristic independently to each given one of the pressure sensitive keys in response to a received haptics control signal corresponding to the given one of the pressure sensitive keys such that a first haptics motion is imparted to the given one of the pressure sensitive keys at the first pressure level applied to the given one of the pressure sensitive keys that is different than a second haptics motion that is imparted to the given one of the pressure sensitive keys at the second pressure level applied to the given one of the pressure sensitive keys.

18. The method of claim 17, method further comprising providing a haptics key pressure indication signal corresponding to each given one of the pressure sensitive keys to the haptics control circuitry from the pressure sensing interface circuitry, the second key pressure indication signal being provided as a digital output bit stream that is representative of the pressure being applied to the corresponding given one of the pressure sensitive keys during the duration of a given key pressure application event and at the same time that the pressure sensing interface circuitry provides to a keyboard controller that is separate from the haptics control circuitry a digital key emulation key pressure indication signal during the duration of the same given key pressure application event.

19. The method of claim 17, further comprising providing a keyboard device body that includes the pressure sensing interface circuitry, haptics control circuitry and haptics actuation circuitry; providing an information handling system chassis that includes a legacy keyboard key matrix having column/row intersections coupled to a legacy keyboard controller having no analog input circuitry and a host system device coupled to the legacy keyboard controller; mechanically coupling the keyboard device body as a drop-in keyboard to the information handling system chassis; and providing each digital key emulation key pressure indication signal as a separate alternating open/short digital output signal corresponding to each pressure sensitive key to column/row intersections of the legacy keyboard key matrix such that the legacy digital keyboard controller is itself coupled between the pressure sensing interface circuitry and the separate host system device to measure keyboard input for the host device based on received momentary-on digital signals and not based on received analog signals.

20. The method of claim 17, further comprising providing the haptics control signal corresponding to each given one of the pressure sensitive keys as a selected vibration waveform having at least one of a vibration intensity or frequency corresponding to the pressure level being applied in real time to the corresponding given one of the pressure sensitive keys; and using the haptics actuation circuitry to impart haptics motion according to the selected vibration waveform independently to the corresponding given one of the pressure sensitive keys being pressed.

21. The method of claim 17, further comprising:
providing a plurality of pressure sensitive keys;
providing from each of the pressure sensitive keys to the pressure sensing interface circuitry a respective separate analog output signal representative of the level of pressure being applied to the given pressure sensitive key;
providing a separate respective haptics key pressure indication signal from the pressuring sensing interface circuitry to the haptics control circuitry that is representative of at least two respective different levels of pressure applied to each individual one of the pressure sensitive keys, the at least two different levels of pressure comprising at least first and second different levels of pressure;
providing from the haptics control circuitry to the haptics actuation circuitry a separate respective haptics control signal corresponding to each given one of the pressure sensitive keys based upon each respective received haptics key pressure indication signal; and
using the haptics actuation circuitry to separately and independently impart haptics motion to each of the plurality of pressure sensitive keys with a variable haptics motion characteristic based on the applied key pressure level and based on the identity of the received haptics control signal corresponding to each given one of the pressure sensitive keys such that a first haptics motion is imparted to the given one of the pressure sensitive keys at the first pressure level applied to the given one of the pressure sensitive keys that is different than a second haptics motion that is imparted to the given one of the pressure sensitive keys at the second pressure level applied to the given one of the pressure sensitive keys.

22. The method of claim 17, further comprising:
providing a plurality of pressure sensitive keys;
providing from each of the pressure sensitive keys to the pressure sensing interface circuitry a respective separate analog output signal representative of the level of pressure being applied to the given pressure sensitive key;
simultaneously providing a single common haptics key pressure indication signal to the haptics control circuitry that is representative of at least first and second different levels of pressure applied to any one of the pressure sensitive keys and simultaneously providing a separate respective haptics enable signal to allow actuation of only the haptics actuation circuitry corresponding to the identity of each given one of the pressure sensitive keys based upon each respective received key pressure indication signal;
providing from the haptics control circuitry to all the haptics actuation circuitry only a single common haptics control signal based upon the received single common key pressure indication signal; and
separately and independently using the single common haptics control signal to impart haptics motion to only those pressure sensitive keys identified by a corresponding haptics enable signal with a variable haptics motion characteristic based on the applied key pressure level represented by the received common haptics control signal such that a first haptics motion is imparted to the given one of the pressure sensitive keys at the first pressure level applied to the given one of the pressure sensitive keys that is different than a second haptics motion that is imparted to the given one of the pressure sensitive keys at the second pressure level applied to the given one of the pressure sensitive keys.

23. The method of claim 16, further comprising imparting a variable haptics motion characteristic independently to each given one of the pressure sensitive keys corresponding to the at least first and second different levels of pressure applied in real time to the corresponding given one of the pressure sensitive keys, the haptics motion imparted to each given one of the pressure sensitive keys in response to a haptics key pressure indication signal corresponding to the first level of pressure applied to the corresponding given one of the pressure sensitive keys being different than the haptics motion imparted to each given one of the pressure sensitive keys in response to a haptics key pressure indication signal corresponding to the second level of pressure applied to the corresponding given one of the pressure sensitive keys.

24. The method of claim 16, where the step of providing one or more pressure sensitive keys further comprises providing one or more pressure sensitive keys that each comprises a keycap and separate haptics actuation circuitry for the keycap, the separate haptics actuation circuitry for each given keycap comprising a separate piezo transducer coupled to separately vibrate the given keycap.

25. The keyboard system of claim 13, where the haptics key pressure indication signals provided at the first signal output comprise a falling edge trigger event and a selected waveform address that corresponds to the desired vibration waveform and current pressure level applied to the given key.

26. A keyboard system, comprising:
a plurality of pressure sensitive keys and pressure-sensing digital output circuitry coupled between the plurality of pressure sensitive keys and haptics control circuitry, the plurality of pressure sensitive keys each being configured to provide to the pressure-sensing digital output circuitry a respective separate analog output signal representative of a level of pressure being applied to a given pressure sensitive key, and the haptics control circuitry being coupled between the plurality of pressure sensitive keys and separate haptics actuation circuitry; and
a separate haptics control switch coupled to control the separate haptics actuation circuitry for each one of the given plurality of pressure sensitive keys, the haptics control switch being different than the given pressure sensitive key and being coupled to receive a separate haptics enable signal from the pressure-sensing digital output circuitry corresponding to the given pressure sensitive key;
where the pressure-sensing digital output circuitry is configured to simultaneously provide a single common haptics key pressure indication signal to the haptics control circuitry that is representative of at least two different levels of pressure applied to any one of the given plurality of pressure sensitive keys and to simultaneously provide a separate respective haptics enable signal to a given one of the separate haptics control switches to allow actuation of only the haptics actuation circuitry corresponding to the identity of the given one of the plurality of pressure sensitive keys based upon each respective received haptics key pressure indication signal, the at least two different levels of pressure comprising at least first and second different levels of pressure;
where the haptics control circuitry is configured to provide to all of the haptics actuation circuitry only a single common haptics control signal based upon the received single common key pressure indication signal; and
where the separate haptics control switch coupled to control the separate haptics actuation circuitry corresponding to each one of the given plurality of pressure sensitive keys is configured to allow and disallow application of the single common haptics control signal to the haptics actuation circuitry such that the haptics actuation circuitry is configured to separately and independently use the single common haptics control signal to impart haptics motion to only a pressure sensitive key identified by a corresponding haptics enable signal with a variable haptics motion characteristic based on the applied key pressure level represented by the received common haptics control signal such that a first haptics motion is imparted to each identified pressure sensitive key at the first pressure level applied to the identified pressure sensitive key that is different than a second haptics motion that is imparted to the identified pressure sensitive key at the second pressure level applied to the identified pressure sensitive keys.

27. A method of imparting haptics motion, comprising:

providing a plurality of pressure sensitive keys;

providing haptics control circuitry and separate haptics actuation circuitry corresponding to each one of the plurality of pressure sensitive keys, the haptics control circuitry being coupled between the plurality of pressure sensitive keys and the haptics actuation circuitry;

providing pressure-sensing digital circuitry coupled between the plurality of pressure sensitive keys and the haptics control circuitry;

providing a separate respective haptics control switch coupled to control the separate haptics actuation circuitry corresponding to for each individual one of the plurality of pressure sensitive keys, the haptics control switch being different for each given pressure sensitive key and being coupled to receive a separate haptics enable signal from the pressure-sensing digital output circuitry corresponding to the individual given pressure sensitive key;

producing an analog output signal for each given one of the plurality of pressure sensitive keys when depressed during a key pressure application event of a given pressure level by a user, the analog output signal being representative of the level of pressure applied to the given pressure sensitive key by the user;

receiving the analog output signal from each given one of the plurality of pressure sensitive keys in the pressure-sensing digital output interface circuitry;

providing a single common key pressure indication signal from the pressure-sensing digital output circuitry, the single common key pressure indication single being based upon a corresponding received analog output signal and being representative of one of at least two respective different levels of pressure applied to any given one of the plurality of pressure sensitive keys that is currently pressed, the at least two different levels of pressure comprising at least first and second different levels of pressure;

simultaneously providing a separate respective haptics enable signal to a given one of the individual haptics control switches to allow actuation of only the separate haptics actuation circuitry corresponding to the identity of the given one of the plurality of pressure sensitive keys currently being pressed based upon the received analog output signal;

receiving the single common key pressure indication signal in the haptics control circuitry and providing from the haptics control circuitry, a single common haptics control signal based upon the received single common key pressure indication signal; and using a the respective haptics control switch coupled to the pressure-sensing digital output circuitry and the separate haptics actuation circuitry corresponding to each individual one of the plurality of pressure sensitive keys to allow and disallow application of the single common haptics control signal to the haptics actuation circuitry of a corresponding one of the plurality of the pressure sensitive keys based on the respective presence and absence of a haptics enable signal selectively applied by the pressure sensing digital output circuitry to the given haptics control switch to allow the single common haptics control signal to be selectively used to impart haptics motions to multiple separate and different haptics actuation circuitries corresponding to multiple plurality of pressure sensitive keys.

* * * * *